(12) United States Patent
Lee

(10) Patent No.: US 12,133,379 B2
(45) Date of Patent: Oct. 29, 2024

(54) SEMICONDUCTOR MEMORY DEVICE AND MANUFACTURING METHOD OF SEMICONDUCTOR MEMORY DEVICE

(71) Applicant: SK hynix Inc., Icheon-si (KR)

(72) Inventor: Nam Jae Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 545 days.

(21) Appl. No.: 17/235,577

(22) Filed: Apr. 20, 2021

(65) Prior Publication Data

US 2022/0123005 A1 Apr. 21, 2022

(30) Foreign Application Priority Data

Oct. 16, 2020 (KR) ........................ 10-2020-0134645

(51) Int. Cl.
*H10B 41/27* (2023.01)
*H10B 41/10* (2023.01)
*H10B 41/40* (2023.01)
*H10B 43/10* (2023.01)
*H10B 43/27* (2023.01)
*H10B 43/40* (2023.01)

(52) U.S. Cl.
CPC ............. *H10B 41/27* (2023.02); *H10B 41/10* (2023.02); *H10B 41/40* (2023.02); *H10B 43/10* (2023.02); *H10B 43/27* (2023.02); *H10B 43/40* (2023.02)

(58) Field of Classification Search
CPC ........ H10B 41/27; H10B 41/10; H10B 41/40; H10B 43/10; H10B 43/27; H10B 43/40; H10B 43/35; H10B 43/30; H10B 43/50; H01L 21/76877; H01L 25/0657; H01L 29/4234; H01L 29/66833; H01L 29/792
See application file for complete search history.

(56) References Cited

U.S. PATENT DOCUMENTS

| 10,553,599 B1 | 2/2020 | Chen et al. |
| 10,629,616 B1 | 4/2020 | Kai et al. |
| 2010/0013049 A1* | 1/2010 | Tanaka .................. H10B 43/20 257/532 |
| 2018/0366488 A1* | 12/2018 | Choi ................. H01L 29/66825 |

FOREIGN PATENT DOCUMENTS

KR 1020160112074 A 9/2016

* cited by examiner

*Primary Examiner* — Ratisha Mehta
(74) *Attorney, Agent, or Firm* — WILLIAM PARK & ASSOCIATES LTD.

(57) ABSTRACT

There are provided a semiconductor memory device and a manufacturing method of the semiconductor memory device. The semiconductor memory device includes: a channel structure including a first pillar part and a second pillar part extending from the first pillar part; a blocking insulating layer surrounding a sidewall of the first pillar part; a data storage layer disposed between the first pillar part and the blocking insulating layer; an upper select line overlapping with an end portion of the blocking insulating layer and an end portion of the data storage layer, which face in an extending direction of the second pillar part, the upper select line surrounding a sidewall of the second pillar part; and a tunnel insulating layer disposed between the first pillar part and the data storage layer, the tunnel insulating layer extending between the second pillar part and the upper select line.

19 Claims, 42 Drawing Sheets

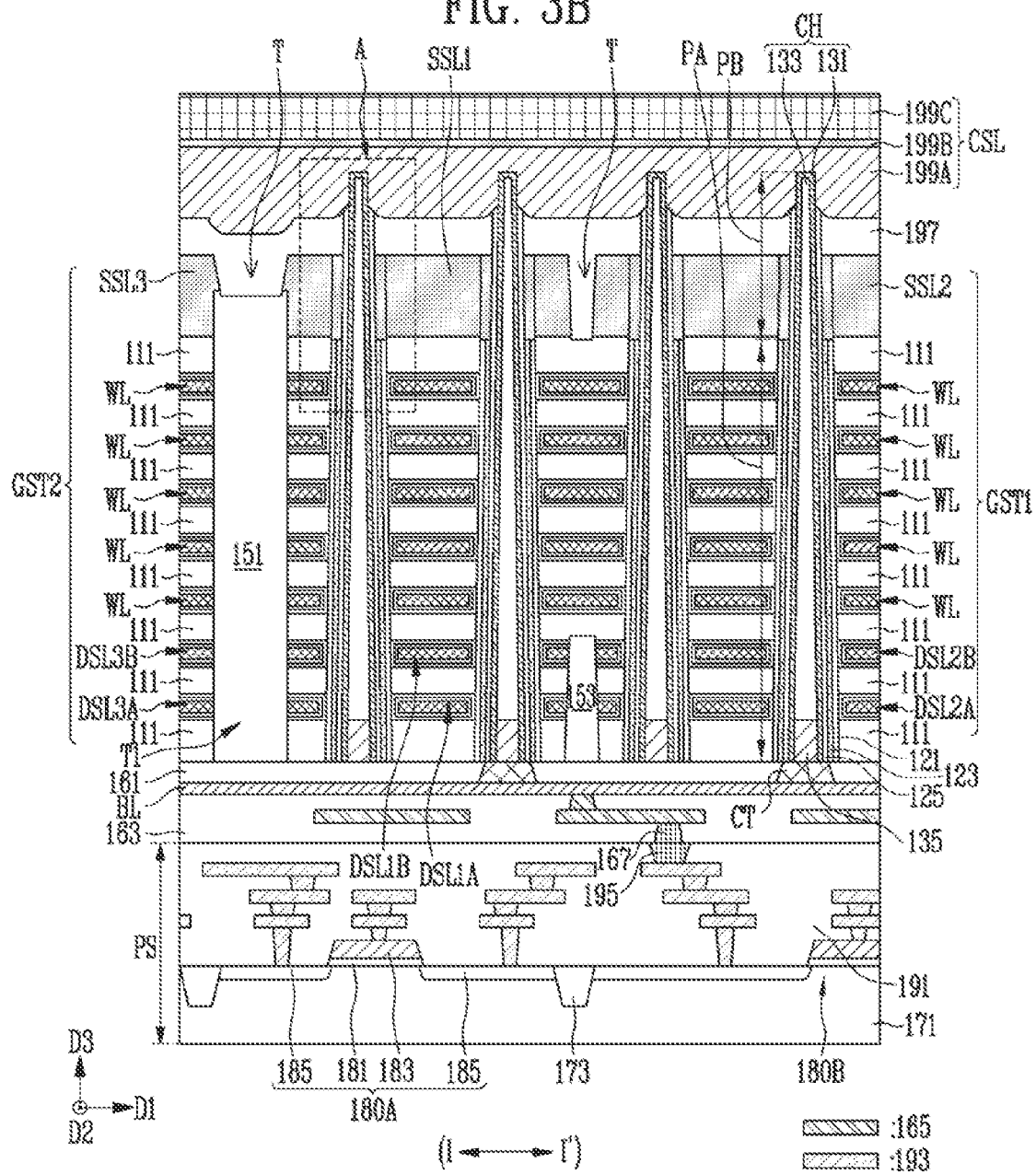

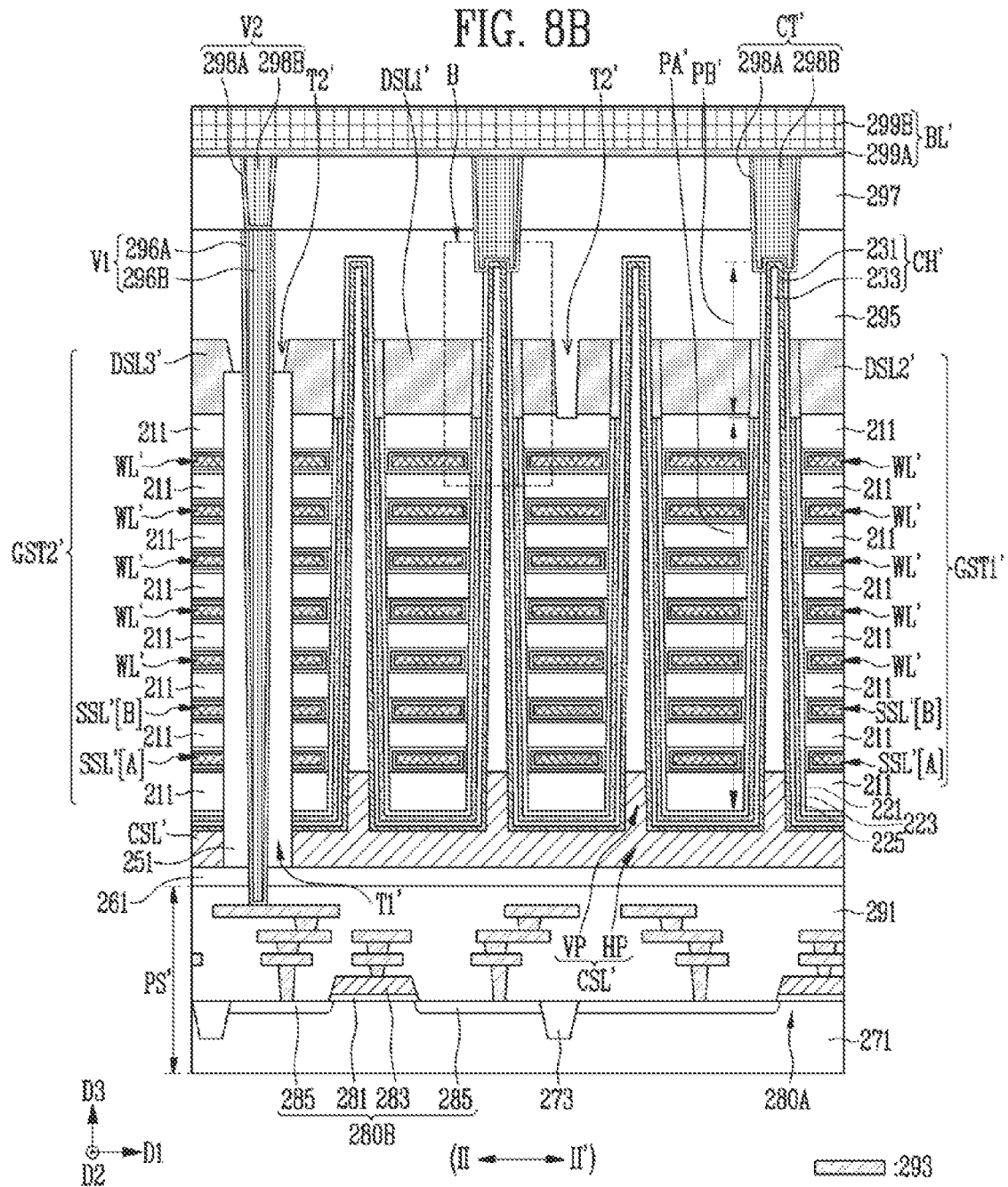

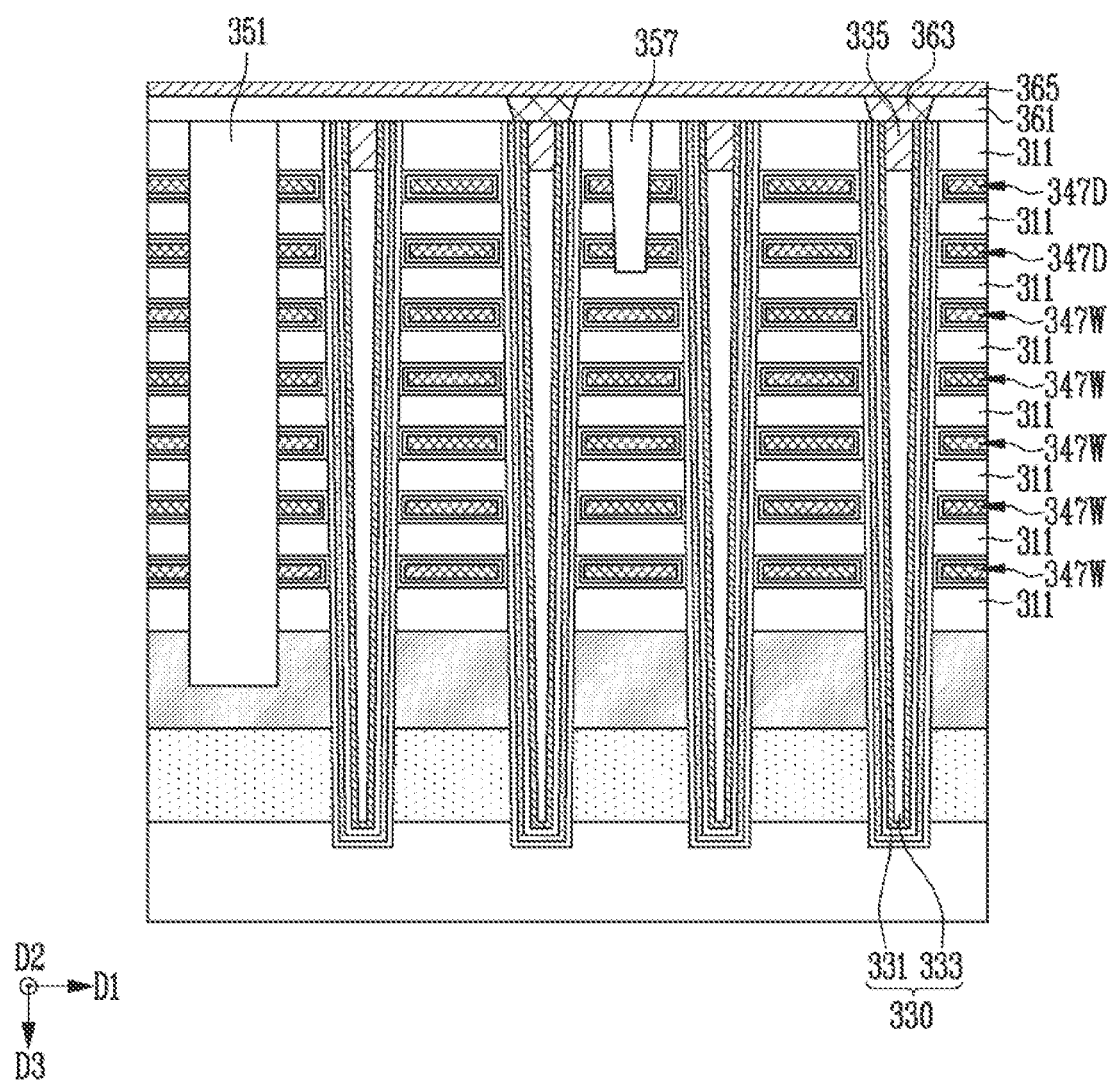

SEMICONDUCTOR MEMORY DEVICE AND MANUFACTURING METHOD OF SEMICONDUCTOR MEMORY DEVICE

CROSS-REFERENCE TO RELATED APPLICATION

The present application claims priority under 35 U.S.C. § 119(a) to Korean patent application number 10-2020-0134645 filed on Oct. 16, 2020, in the Korean Intellectual Property Office, the entire disclosure of which is incorporated by reference herein.

BACKGROUND

1. Technical Field

The present disclosure may generally relate to a semiconductor memory device and a manufacturing method of a semiconductor memory device, and more particularly, to a three-dimensional semiconductor memory device and a manufacturing method of a three-dimensional semiconductor memory device.

2. Related Art

A semiconductor memory device includes a plurality of memory cells capable of storing data. Memory cells of a three-dimensional semiconductor memory device may be three-dimensionally arranged. When the three-dimensional semiconductor memory device is manufactured, a failure may occur due to various causes. Therefore, operation characteristics of the semiconductor memory device may be degraded.

SUMMARY

In accordance with an aspect of the present disclosure, a semiconductor memory device may include a channel structure, a blocking insulating layer, a data storage layer, an upper select line, and a tunnel insulating layer. The channel structure may include a first pillar part and a second pillar part extending from the first pillar part. The blocking insulating layer may surround a sidewall of the first pillar part of the channel structure. The data storage layer may be disposed between the first pillar part of the channel structure and the blocking insulating layer. The upper select line may overlap with an end portion of the blocking insulating layer and an end portion of the data storage layer, the end portion of the blocking insulating layer and the end portion of the data storage layer facing in an extending direction of the second pillar part, the upper select line surrounding a sidewall of the second pillar part of the channel structure. The tunnel insulating layer may be disposed between the first pillar part of the channel structure and the data storage layer, the tunnel insulating layer extending between the second pillar part of the channel structure and the upper select line.

In accordance with another aspect of the present disclosure, a semiconductor memory device may include a first channel structure, a second channel structure, a tunnel insulating layer, a data storage layer, a blocking insulating layer, a first lower select line, a second lower select line, an isolation layer, a first upper select line, a second upper select line, interlayer insulating layers, and word lines. The first channel structure and the second channel structure may extend in parallel to each other. The tunnel insulating layer may surround a sidewall of each of the first channel structure and the second channel structure. The data storage layer may surround the sidewall of each of the first channel structure and the second channel structure with the tunnel insulating layer interposed between the data storage layer and the sidewall of each of the first channel structure and the second channel structure. The blocking insulating layer may surround the sidewall of each of the first channel structure and the second channel structure with the data storage layer and the tunnel insulating layer, which are interposed between the blocking insulating layer and the sidewall of each of the first channel structure and the second channel structure. The first lower select line may surround the first channel structure with the blocking insulating layer, the data storage layer, and the tunnel insulating layer, which are interposed between the first lower select line and the first channel structure. The second lower select line may surround the second channel structure with the blocking insulating layer, the data storage layer, and the tunnel insulating layer, which are interposed between the second lower select line and the second channel structure. The isolation layer may be disposed between the first lower select line and the second lower select line. The first upper select line may surround the first channel structure with the tunnel insulating layer interposed between the first upper select line and the first channel structure, the first upper select line being disposed on the first lower select line. The second upper select line may surround the second channel structure with the tunnel insulating layer interposed between the second upper select line and the second channel structure, the second upper select line being disposed on the second lower select line. The interlayer insulating layers and word lines may be alternately stacked between the first lower select line and the first upper select line, wherein the interlayer insulating layers and the word lines extend between the second lower select line and the second upper select line.

In accordance with another aspect of the present disclosure, a method of manufacturing a semiconductor memory device, may include forming a first conductive layer on a substrate; alternately stacking first material layers and second material layers on the first conductive layer; forming a hole penetrating the first material layers and the second material layers, the hole extending to the inside of the substrate; sequentially stacking a blocking insulating layer, a data storage layer, and a tunnel insulating layer on a surface of the hole; forming a channel structure filling a central region of the hole on the tunnel insulating layer; removing the substrate such that the first conductive layer and the blocking insulating layer are exposed; sequentially removing a portion of the blocking insulating layer and a portion of the data storage layer such that a recess region is defined between the first conductive layer and the tunnel insulating layer; and forming a second conductive layer filling the recess region, the second conductive layer surrounding the tunnel insulating layer.

BRIEF DESCRIPTION OF THE DRAWINGS

Example embodiments will now be described hereinafter with reference to the accompanying drawings; however, they may be embodied in different forms and should not be construed as limited to the embodiments set forth herein.

In the drawing figures, dimensions may be exaggerated for clarity of illustration. It will be understood that when an element is referred to as being "between" two elements, it may be the only element between the two elements, or one or more intervening elements may also be present. Like reference numerals refer to like elements throughout.

FIG. 3B is a sectional view of the semiconductor memory device taken along line I-I' shown in FIG. 3A.

FIG. 8B is a sectional view of the semiconductor memory device taken along line II-II' shown in FIG. 8A.

FIGS. 10A, 10B, 10C, 10D, 10E, 11, 12, 13, 14A, 14B, 15A, 15B, 16A, 16B, 17A, 17B, and 17C are views illustrating a manufacturing method of a semiconductor memory device in accordance with an embodiment of the present disclosure.

DETAILED DESCRIPTION

Specific structural or functional descriptions disclosed herein are merely illustrative for the purpose of describing embodiments according to the concept of the present disclosure. The embodiments according to the concept of the present disclosure may be implemented in various forms, and should not be construed as being limited to the embodiments set forth herein.

Embodiments provide a semiconductor memory device and a manufacturing method of the semiconductor memory device, which may improve operation characteristics of the semiconductor memory device.

Figure 1:
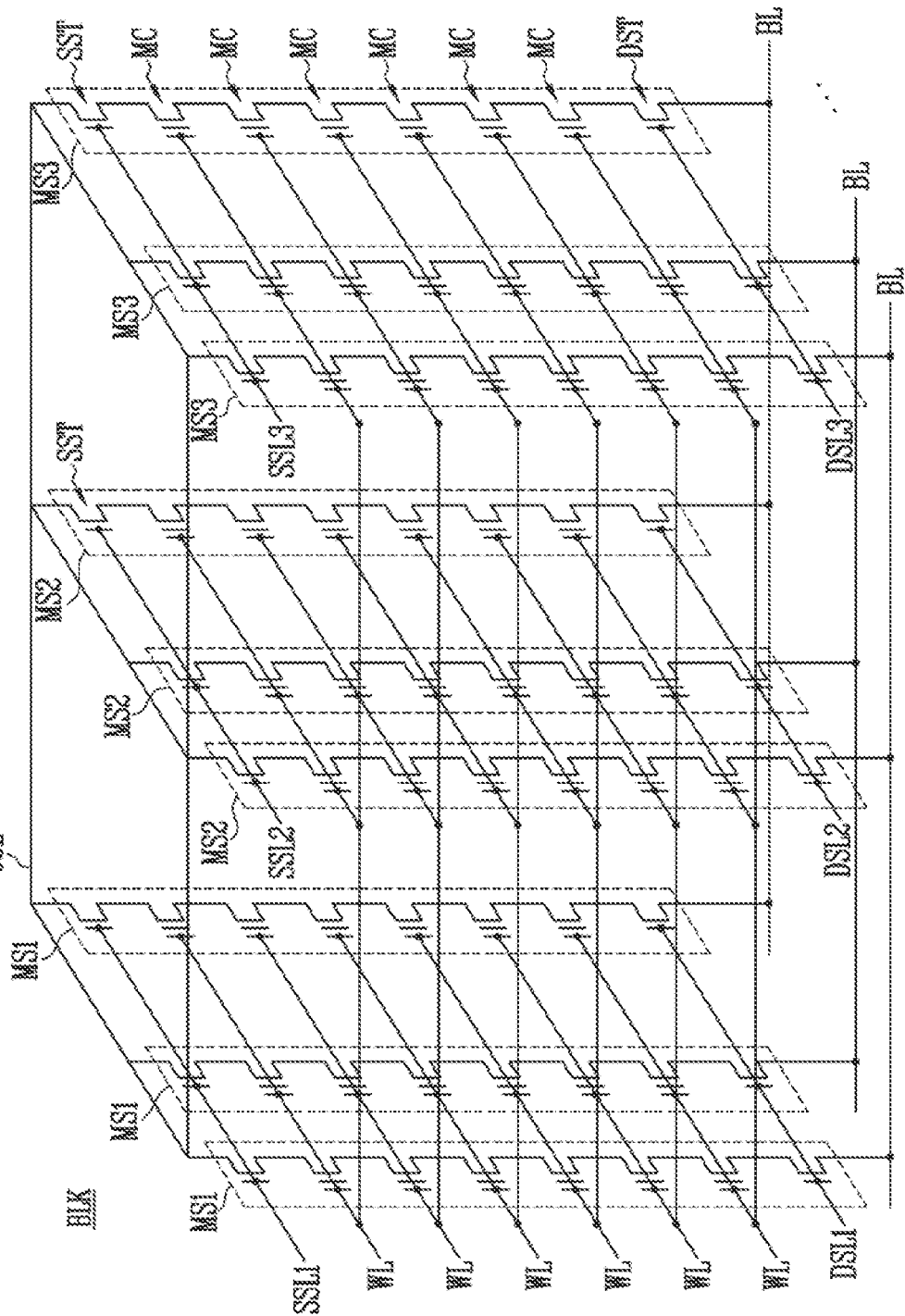
FIG. 1 is a circuit diagram illustrating a memory block of a semiconductor memory device in accordance with an embodiment of the present disclosure.

FIG. 1 is a circuit diagram illustrating a memory block of a semiconductor memory device in accordance with an embodiment of the present disclosure.

Referring to FIG. 1, the semiconductor memory device may include a plurality of memory blocks BLK, wherein each memory block BLK may include a plurality of memory cell strings MS1, MS2, and MS3 connected to a common source layer CSL and bit lines BL.

Each of the memory cell strings MS1, MS2, and MS3 may include a plurality of memory cells MC connected in series, a source select transistor SST, and at least one drain select transistor DST. In an embodiment, each of the memory cell strings MS1, MS2, and MS3 may include one drain select transistor DST connected between the plurality of memory cells MC and a bit line BL. In another embodiment, each of the memory cell strings MS1, MS2, and MS3 may include two or more drain select transistors DST connected between the plurality of memory cells MC and the bit line BL.

The plurality of memory cells MC may be connected to the common source layer CSL via the source select transistor SST, and may be connected to the bit line BL via the drain select transistor DST.

Gates of source select transistors SST disposed at the same level may be connected to source select lines SSL1, SSL2, and SSL3 isolated from each other. Gates of drain select transistors DST disposed at the same level may be connected to drain select lines DSL1, DSL2, and DSL3 isolated from each other.

In an embodiment, the memory block BLK may include a first source select line SSL1, a second source select line SSL2, and a third source select line SSL3, which are isolated from each other at the same level. The memory block may also include a first drain select line DSL1, a second drain select line DSL2, and a third drain select line DSL3, which are isolated from each other at the same level. However, the embodiment of the present disclosure is not limited thereto. In another embodiment, the memory block BLK may include two source select lines isolated from each other at the same level, or may include four or more source select lines isolated from each other at the same level. Also, the memory block BLK may include two drain select lines isolated from each other at the same level, or may include four or more drain select lines isolated from each other at the same level, wherein a number of drain select lines isolated from each other at the same level may be equal to or different from that of source select lines isolated from each other at the same level.

Gates of the plurality of memory cells MC may be connected to a plurality of word lines WL, wherein the word lines WL may be disposed at different levels, and gates of memory cells MC disposed at the same level may be connected to a single word line WL.

The plurality of memory cell strings MS1, MS2, and MS3 may be connected to each of the word lines WL. In an embodiment, the plurality of memory cell strings MS1, MS2, and MS3 may be divided into a first group, a second group, and a third group, which may be individually selected by the first source select line SSL1, the second source select line SSL2, and the third source select line SSL3. The first group may include first memory cell strings MS1. The second group may include second memory cell strings MS2. The third group may include third memory cell strings MS3.

The first memory cell strings MS1 may be respectively connected to the bit lines BL via drain select transistors DST connected to first drain select lines DSL1. The second memory cell strings MS2 may be respectively connected to the bit lines BL via drain select transistors DST connected to second drain select lines DSL2. The third memory cell strings MS3 may be respectively connected to the bit lines BL via drain select transistors DST connected to third drain select lines DSL3. One of the first memory cell strings MS1, one of the second memory cell strings MS2, and one of the third memory cell strings MS3 may be connected to a single bit line BL.

According to a gate signal applied to the first source select line SSL1, the first memory cell strings MS1 may be connected to the common source layer CSL. According to a gate signal applied to the second source select line SSL2, the second memory cell strings MS2 may be connected to the common source layer CSL. The third memory cell strings MS3 may be connected to the common source layer CSL according to a gate signal applied to the third source select line SSL3. Accordingly, the plurality of memory cell strings MS1, MS2, and MS3 may be isolated into groups which may be individually selected simultaneously for each of the source select lines SSL1, SSL2, and SSL3 in a read operation or a verify operation. In an embodiment, in the read operation or the verify operation, one of the first source select line SSL1, the second source select line SSL2, and the third source select line SSL3 may be selected, so that one group among the first group of the first memory cell strings MS1, the second group of the second memory cell strings MS2, and the third group of the third memory cell strings MS3 may be connected to the common source layer CSL. Accordingly, in the embodiment of the present disclosure, as compared with a case where the first memory cell strings MS1, the second memory cell strings MS2, and the third memory cell strings MS3 are simultaneously connected to the common source layer in the read operation or the verify operation, channel resistance may be reduced. Thus, in the embodiment of the present disclosure, read disturb may be reduced.

Figure 2:
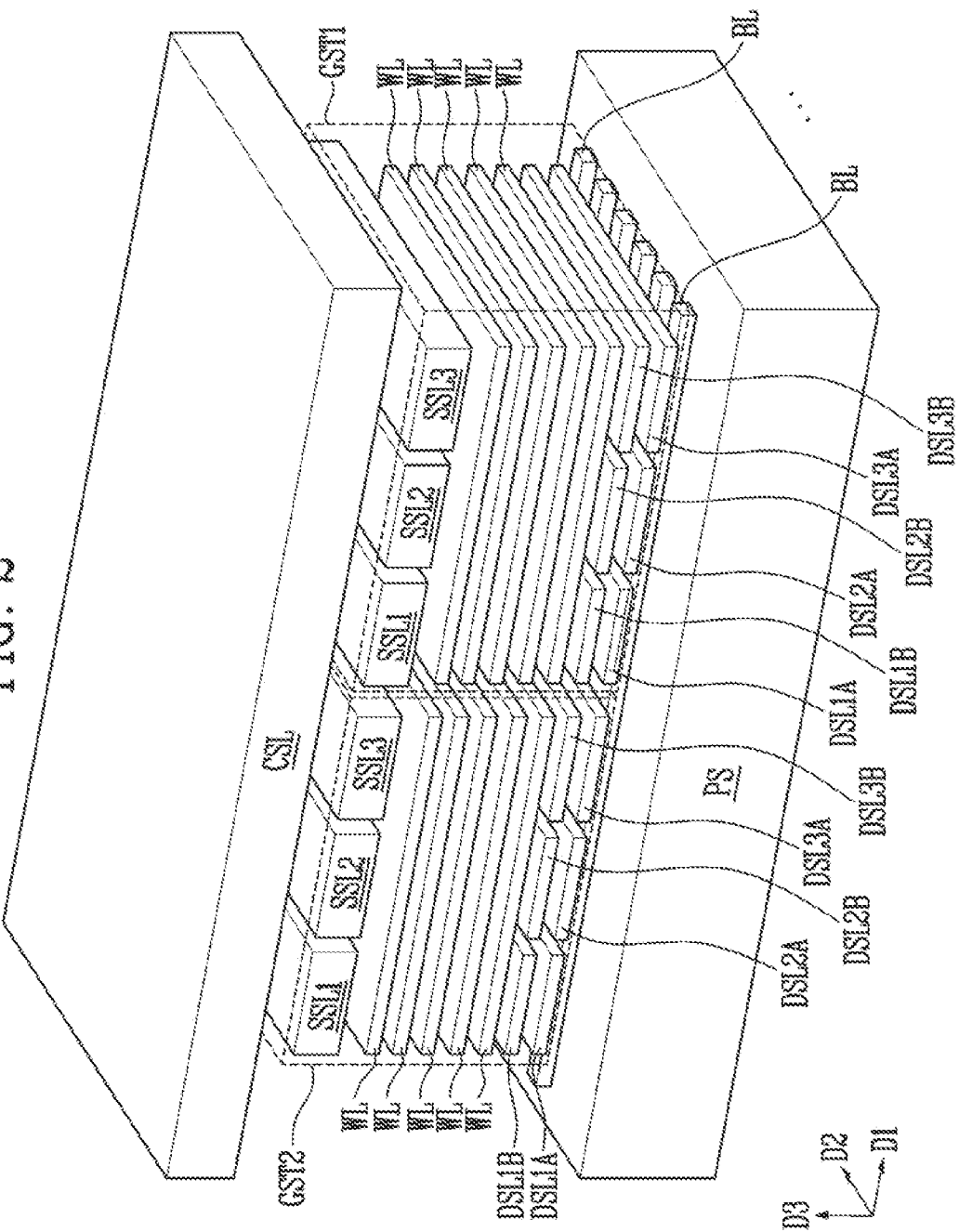
FIG. 2 is a perspective view schematically illustrating a semiconductor memory device in accordance with an embodiment of the present disclosure.

FIG. 2 is a perspective view schematically illustrating a semiconductor memory device in accordance with an embodiment of the present disclosure.

Referring to FIG. 2, the semiconductor memory device may include a peripheral circuit structure PS, bit lines BL, gate stack structures GST1 and GST2, and a common source layer CSL. Each of the gate stack structures GST1 and GST2 may constitute a memory block.

For controlling an operation of memory cells, the peripheral circuit structure PS may include a peripheral circuit.

Each of the gate stack structures GST1 and GST2 may overlap with the peripheral circuit structure PS and may be disposed between the bit line BL and the common source layer CSL. The peripheral circuit structure PS may overlap with the gate stack structures GST1 and GST2 with the bit line BL interposed therebetween. The common source layer CSL may overlap with the bit line BL, and the gate stack structures GST1 and GST2 may be interposed therebetween.

The gate stack structures GST1 and GST2 may include a first gate stack structure GST1 and a second gate stack structure GST2, the first gate stack structure GST1 and the second gate stack structure GST2 facing each other.

Each of the first gate stack structure GST1 and the second gate stack structure GST2 may include an upper select group including upper select lines, a lower select group including lower select lines, and word lines WL disposed between the upper select group and the lower select group. In an embodiment, the upper select lines may be configured as source select lines SSL1, SSL2, and SSL3. The lower select lines may be configured as drain select lines DSL1A, DSL2A, DSL3A, DSL1B, DSL2B, and DSL3B.

Each of the source select lines SSL1, SSL2, and SSL3, the word lines WL, and the drain select lines DSL1A, DSL2A, DSL3A, DSL1B, DSL2B, and DSL3B may extend in a first direction D1 and a second direction D2, wherein the first direction D1 may be defined as a direction of an X-axis in an XYZ coordinate system. The second direction D2 may be defined as a direction of a Y-axis in the XYZ coordinate system.

The source select lines SSL1, SSL2, and SSL3 may be isolated from each other at the same level. In an embodiment, the source select lines SSL1, SSL2, and SSL3 may be spaced apart from each other in the first direction D1. The source select lines SSL1, SSL2, and SSL3 may be disposed between the common source layer CSL and a stack structure including the word lines WL.

The word lines WL may be spaced apart from each other in a third direction D3, which may be defined as a direction of a Z-axis in the XYZ coordinate system.

Each of the word lines WL may extend to overlap with the source select lines SSL1, SSL2, and SSL3 that are isolated from each other.

The drain select lines DSL1A, DSL2A, DSL3A, DSL1B, DSL2B, and DSL3B may be disposed in at least one layer between the bit line BL and the stack structure including the word lines WL. In an embodiment, the drain select lines DSL1A, DSL2A, DSL3A, DSL1B, DSL2B, and DSL3B may 1o include drain select lines DSL1A, DSL2A and DSL3A of a first level and drain select lines DSL1B, DSL2B and DSL3B of a second level. The drain select lines DSL1B, DSL2B and DSL3B of the second level may be spaced apart from the drain select lines DSL1A, DSL2A and DSL3A of the first level in the third direction D3. The drain select lines DSL1A, DSL2A and DSL3A of the first level may be spaced apart from each other in an extending direction of the bit line BL, and the drain select lines DSL1B, DSL2B and DSL3B of the second level may also be spaced apart from each other in the extending direction of the bit line BL. In an embodiment, the drain select lines DSL1A, DSL2A and DSL3A of the first level as well as the drain select lines DSL1B, DSL2B and DSL3B of the second level may be spaced apart from each other in the first direction D1.

The peripheral circuit structure PS may overlap with the upper select group including the source select lines SSL1, SSL2, and SSL3. The bit line BL in addition to the lower select group including the drain select lines DSL1A, DSL2A, DSL3A, DSL1B, DSL2B, and DSL3B may be disposed between the peripheral circuit structure PS and the upper select group including the source select lines SSL1, SSL2, and SSL3.

Each of the bit line BL and the common source line may extend to overlap with the first gate stack structure GST1 and the second gate stack structure GST2.

Figure 3A:
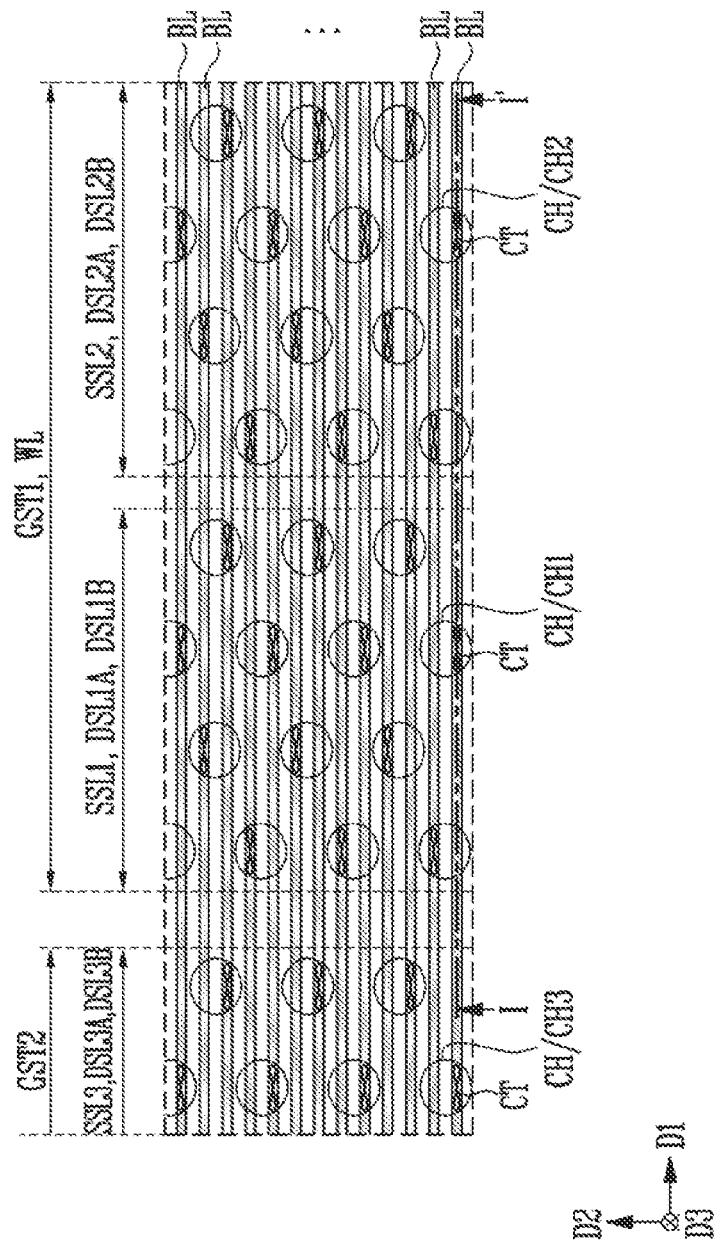
FIG. 3A is a plan view illustrating a layout of bit lines of the semiconductor memory device shown in FIG. 2.

FIG. 3A is a plan view illustrating a layout of the bit lines of the semiconductor memory device shown in FIG. 2.

Referring to FIG. 3A, the bit lines BL may extend in parallel to each other, and may be spaced apart from each other. In an embodiment, the bit lines BL may extend in the first direction D1, and be spaced apart from each other in the second direction D2.

The bit lines BL may be connected to channel structures CH extending in the third direction D3, and may be connected to the channel structures CH via bit line contact structures CT.

The channel structures CH may penetrate the first gate stack structure GST1 and the second gate stack structure GST2, and may be divided into groups controlled by the source select lines SSL1, SSL2, and SSL3 spaced apart from each other. In an embodiment, the channel structures CH may include a first group configured with first channel structures CH1, a second group configured with second channel structures CH2, and a third group configured with third channel structures CH3. Sidewalls of the first channel structures CH1 may be surrounded by a first source select line SSL1 of the first gate stack structure GST1. The first channel structures CH1 may be controlled by the first source select line SSL1. Sidewalls of the second channel structures CH2 may be surrounded by a second source select line SSL2 of the first gate stack structure GST1, and the second channel structures CH2 may be controlled by the second source select line SSL2. Sidewalls of the third channel structures CH3 may be surrounded by a third source select line SSL3 of the second gate stack structure GST2. The third channel structures CH3 may be controlled by the third source select line SSL3.

One of the first channel structures CH1, one of the second channel structures CH2, and one of the third channel structures CH3 may be connected in parallel to a single bit line BL.

The word line WL of the first gate stack structure GST1 may extend to surround the sidewalls of the first channel structures CH1 and the sidewalls of the second channel structures CH2.

The embodiment shown in the drawing illustrates a case where an isolation structure between the drain select lines DSL1A, DSL2A, and DSL3A of the first level and an isolation structure between the drain select lines DSL1B, DSL2B, and DSL3B of the second level are similar to an isolation structure between the second source select line SSL2 and the third source select line SSL3. More specifically, the drain select lines DSL1A, DSL2A, and DSL3A of the first level may include first to third drain select lines of the first level. The drain select lines DSL1B, DSL2B, and DSL3B of the second level may include first to third drain select lines of the second level.

The first channel structures CH1 may penetrate the first drain select line DSL1A of the first level and the first drain select line DSL1B of the second level. The second channel structures CH2 may penetrate the second drain select line DSL2A of the first level and the second drain select line DSL2B of the second level. The third channel structures CH3 may penetrate the third drain select line DSL3A of the first level and the third drain select line DSL3B of the second level.

Referring to FIG. 3A, line I-I' overlaps with a single bit line BL. Channel structures CH overlapping with a single bit line BL may include channel structures connected to the single bit line BL via bit line contact structures CT overlapping with the line I-I' and channel structures connected to another bit line BL via bit line contact structures CT not overlapping with the line I-I'.

FIG. 3B is a sectional view of the semiconductor memory device taken along the line I-I' shown in FIG. 3A.

Referring to FIG. 3B, the source select lines SSL1, SSL2, and SSL3 may be isolated from each other by a trench T, which may be filled with an upper insulating layer 197. The upper insulating layer 197 may extend between the common source layer CSL and the upper select group including the source select lines SSL1, SSL2, and SSL3.

The common source layer CSL may include a doped semiconductor layer 199A, a conductive metal barrier layer 199B, and a metal layer 199C, which are sequentially stacked on the upper insulating layer 197. The doped semiconductor layer 199A may include at least one of an n-type impurity and a p-type impurity.

The word lines WL of the first gate stack structure GST1 may be spaced apart from the word lines WL of the second gate stack structure GST2 by a gate isolation layer 151. The word lines WL of the first gate stack structure GST1 may also be insulated from the word lines WL of the second gate stack structure GST2 by the gate isolation layer 151. The gate isolation layer 151 may extend between a first lower select group including the drain select lines DSL1A, DSL2A, DSL1B, and DSL2B of the first gate stack structure GST1 and a second lower select group including the drain select lines DSL3A and DSL3B.

Each of the first gate stack structure GST1 and the second gate stack structure GST2 may further include interlayer insulating layers 111 stacked to be spaced apart from each other in the third direction D3. Conductive layers provided for the word lines WL and the drain select lines DSL1A, DSL2A, DSL3A, DSL1B, DSL2B, and DSL3B and the interlayer insulating layers 111 may be alternately disposed in the third direction D3.

The first drain select line DSL1A of the first level, which is included in the first gate stack structure GST1, may be spaced apart from the second drain select line DSL2A of the first level, which is included in the first gate stack structure GST1, by a drain isolation layer 153. The first drain select line DSL1A of the first level, which is included in the first gate stack structure GST1, may be insulated from the second drain select line DSL2A of the first level, which is included in the first gate stack structure GST1, by the drain isolation layer 153. The drain isolation layer 153 may extend between the first drain select line DSL1B of the second level and the second drain select line DSL2B of the second level. The first drain select line DSL1B of the second level is included in the first gate stack structure GST1. The second drain select line DSL2B of the second level is included in the first gate stack structure GST1.

Each of the channel structures CH may include a channel layer 131 and a core insulating layer 133, wherein the channel layer 131 may include a semiconductor material. The channel layer 131 may surround a sidewall of the core insulating layer 133, and may extend along a first surface of the core insulating layer 133. The core insulating layer 133 faces the common source layer CSL, and may also overlap with a doped semiconductor pattern 135. The doped semiconductor pattern 135 may be in contact with a second surface of the core insulating layer 133, which faces the bit line BL. The channel layer 131 may extend to surround a sidewall of the doped semiconductor pattern 135.

Each of the channel structures CH may include a first pillar part PA and a second pillar part PB extending in the third direction D3 from the first pillar part PA, wherein a central region of the first pillar part PA may be filled with the core insulating layer 133 and the doped semiconductor pattern 135, and the core insulating layer 133 may extend to a central region of the second pillar part PB. An outer wall of the first pillar part PA and an outer wall of the second pillar part PB may be configured with the channel layer 131.

Referring to the first stack structure GST1, a sidewall of the first pillar part PA may be surrounded by not only the interlayer insulating layers 111 and the word lines WL but also the drain select line DSL1A or DSL2A of the first level, which corresponds to the first pillar part PA, and the drain select line DSL1B or DSL2B of the second level, which corresponds to the first pillar part PA. A sidewall of the second pillar part PB may be surrounded by the source select line SSL1 or SSL2 corresponding to the second pillar part PB, wherein the second pillar part PB of the channel structure CH may extend in the third direction D3 to penetrate the upper insulating layer 197, and may extend to the inside of the common source layer CSL.

The sidewall of the first pillar part PA may be surrounded by a first blocking insulating layer 121, a data storage layer 123, and a tunnel insulating layer 125. The first blocking insulating layer 121, the data storage layer 123, and the tunnel insulating layer 125 may be disposed between the first pillar part PA1 and each of the interlayer insulating layers 111 and the word lines WL. The first blocking insulating layer 121, the data storage layer 123, and the tunnel insulating layer 125 may extend between the first pillar part PA and the drain select line DSL1A or DSL2A of the first level, which corresponds to the first pillar part PA, and may extend between the first pillar part PA and the drain select line DSL1B or DSL2B of the second level, which corresponds to the first pillar part PA.

The data storage layer 123 may be disposed between the first blocking insulating layer 121 and the first pillar part PA. The tunnel insulating layer 125 may be disposed between the data storage layer 123 and the first pillar part PA, and may extend between the second pillar part PB and the source select line SSL1 or SSL2 corresponding to the second pillar part PB.

The second pillar part PB of each of the channel structures CH may further protrude in the third direction D3 than the tunnel insulating layer 125. Each of the channel structures CH may have a tapered shape. The width of the channel structure CH becomes wider as the channel 1o structure CH becomes closer to the bit line BL and the peripheral circuit structure PS.

The bit line BL may be spaced apart from the channel structures CH by an insulating layer 161, which may extend between the bit line BL and each of the first gate stack structure GST1 and the second gate stack structure GST2. The bit line contact structures CT may electrically connect some of the channel structures CH to the bit line BL while penetrating the insulating layer 161.

The bit line BL may be spaced apart from the peripheral circuit structure PS by a first insulating structure 163, which may include two or more insulating layers stacked between the bit line BL and the peripheral circuit structure PS.

A first interconnection structure 165 and a first conductive bonding pad 167 may be buried in the first insulating structure 163, wherein the first interconnection structure 165 may include a plurality of conductive patterns. The first conductive bonding pad 167 may be connected to the first interconnection structure 165 and may face the peripheral circuit structure PS. In an embodiment, the first conductive bonding pad 167 may be electrically connected to the bit line BL via the first interconnection structure 165.

The peripheral circuit structure PS may include a substrate 171 including transistors 180A and 180B, a second insulating structure 191, a second interconnection structure 193, and a second conductive bonding pad 195.

The transistors 180A and 180B may be disposed in active regions of the substrate 171, which are partitioned by isolation layers 173. Each of the transistors 180A and 180B may include a gate insulating layer 181 disposed on the active region, a gate electrode 183 disposed on the gate insulating layer 181, and junctions 185 formed in the active regions at both sides of the gate electrode 183. Some (e.g., 180B) of the transistors 180A and 180B may constitute a page buffer circuit for controlling a precharge operation and a discharge operation of the bit line BL.

The second insulating structure 191 may be disposed between the first insulating structure 163 and the substrate 171, may include two or more insulating layers and may be bonded to the first insulating structure 163.

The second interconnection structure 193 and the second conductive bonding pad 195 may be buried in the second insulating structure 191, wherein the second interconnection structure 193 may include a plurality of conductive patterns.

The second conductive bonding pad 195 may be connected to the second interconnection structure 193, and may face the first conductive bonding pad 167. The second conductive bonding pad 195 may be bonded to the first conductive bonding pad 167, and may be electrically connected to the transistor 180B of the page buffer circuit via the second interconnection structure 193.

In accordance with the above-described embodiment, the bit line BL may be connected to the transistor 180B of the page buffer circuit via the first interconnection structure 165, the first conductive bonding pad 167, the second conductive bonding pad 195, and the second interconnection structure 193.

Figure 4:
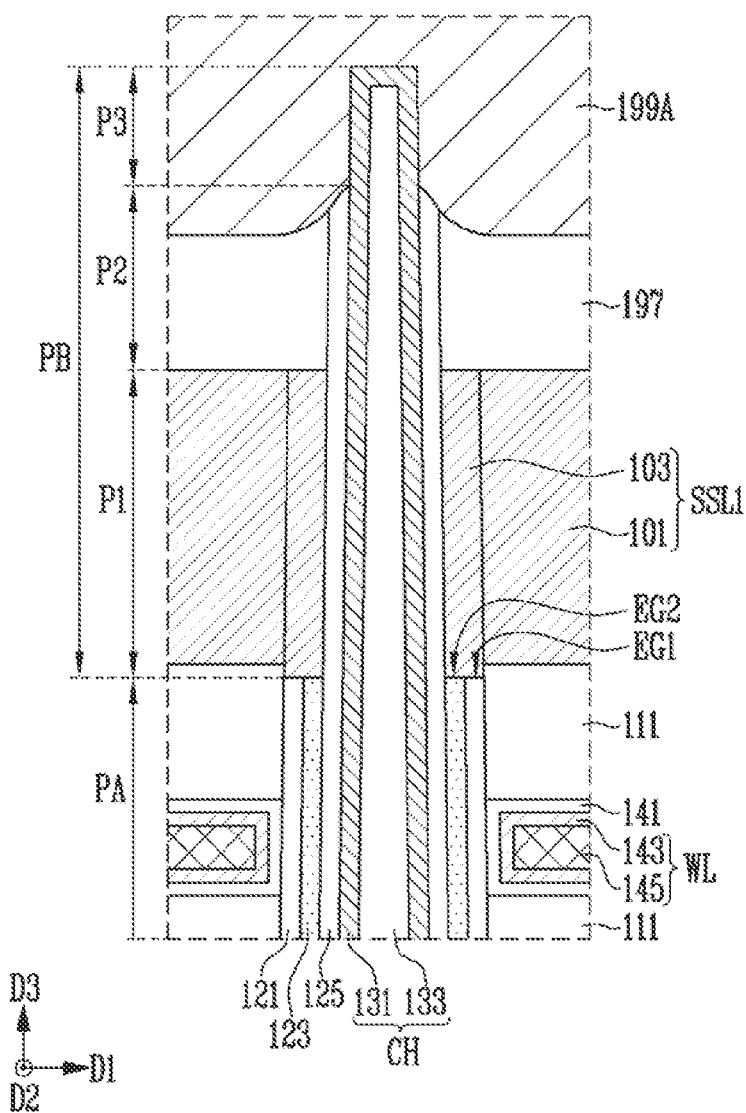
FIG. 4 is an enlarged sectional view of region A shown in FIG. 3B.

FIG. 4 is an enlarged sectional view of region A shown in FIG. 3B.

Referring to FIG. 4, the first blocking insulating layer 121 may include an end portion EG1 facing in the third direction D3, and the data storage layer 123 may also include an end portion EG2 facing in the third direction D3. According to an etching amount of the first blocking insulating layer 121 and an etching amount of the data storage layer 123, positions of the end portion EG1 of the first blocking insulating layer 121 and the end portion EG2 of the data storage layer 123 may vary. The end portion EG1 of the first blocking insulating layer 121 may be disposed at the same level as the end portion EG2 of the data storage layer 123 or may be disposed at a different level than the end portion EG2 of the data storage layer 123.

A source select line (e.g., SSL1) may overlap with the end portion EG1 of the first blocking insulating layer 121 and the end portion EG2 of the data storage layer 123. According to the etching amount of the first blocking insulating layer 121 and the etching amount of the data storage layer 123, an interface between the source select line SSL1 and the end portion EG1 of the first blocking insulating layer 121 and an interface between the source select line SSL1 and the end portion EG2 of the data storage layer 123 may be disposed at a level substantially equal to or different from that of an interface between the source select line SSL1 and the interlayer insulating layer 111.

The source select line SSL1 may include a first conductive pattern 101 and the second conductive pattern 103, wherein the first conductive pattern 101 may extend in a planar direction to intersect the second pillar part PB. In an embodiment, the first conductive pattern 101 may extend in the first direction D1 and the second direction D2 to be parallel to the word line WL. The second conductive pattern 103 may be disposed between the first conductive pattern 101 and the tunnel insulating layer 125.

The second conductive pattern 103 may include at least one of silicon, metal silicide, and conductive metal barrier, wherein the metal silicide may include tungsten silicide or nickel silicide and the conductive metal barrier may include titanium and titanium nitride.

The second pillar part PB of the channel structure CH may include a first part P1 surrounded by the source select line SSL1, a second part P2 extending in the third direction D3 from the first part P1, and a third part P3 extending in the third direction D3 from the second part P2. The second part P2 and the third part P3 may protrude farther in the third direction D3 than the source select line SSL1. A sidewall of the second part P2 may be surrounded by the upper insulating layer 197. The third part P3 may be in contact with the doped semiconductor layer 199A of the common source layer.

The core insulating layer 133 of the channel structure CH may extend to a central region of each of the first part P1, the second part P2, and the third part P3 from the central region of the first pillar part PA. The channel layer 131 of the channel structure CH may extend to constitute an outer wall of each of the first part P1, the second part P2, and the third part P3. The doped semiconductor layer 199A of the common source layer may be in contact with the channel layer 131 of the third part P3.

The word line WL may include a conductive metal barrier layer 143 and a metal layer 145. A second blocking insulating layer 141 may be disposed between the word line WL and the first blocking insulating layer 121, and may extend between the interlayer insulating layer 111 and the word line WL. Like the word line WL, each of the drain select lines DSL1A, DSL2A, DSL3A, DSL1B, DSL2B, and DSL3B shown in FIG. 3B may include a conductive metal barrier layer 143 and a metal layer 145. The second blocking insulating layer 141 may be disposed between the first blocking insulating layer 121 and each of the drain select lines DSL1A, DSL2A, DSL3A, DSL1B, DSL2B, and DSL3B shown in FIG. 3B, and extend between the interlayer insulating layers 111 and the drain select lines DSL1A, DSL2A, DSL3A, DSL1B, DSL2B, and DSL3B shown in FIG. 3B.

The second blocking insulating layer 141 may include an insulating material having a dielectric constant higher than that of the first blocking insulating layer 121, and although not shown in the drawing, the second blocking insulating layer 141 may be omitted.

Figure 5A:
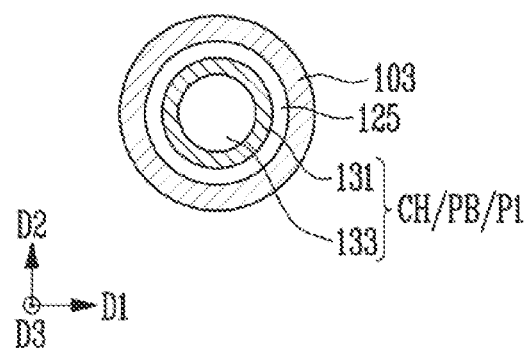
FIG. 5A is a cross-sectional view of a first part of a channel structure, a tunnel insulating layer, and a second conductive pattern, which are shown in FIG. 4.
Figure 5B:
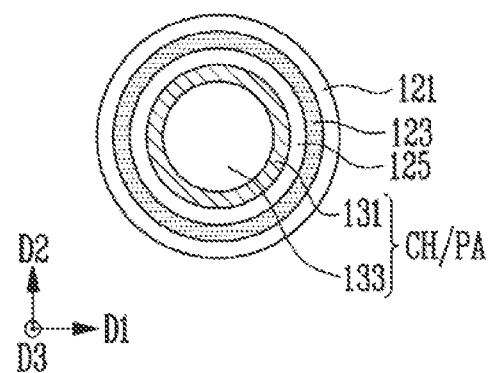
FIG. 5B is a cross-sectional view of a first pillar part of the channel structure, the tunnel insulating layer, a data storage layer, and a first blocking insulating layer, which are shown in FIG. 4.

FIG. 5A is a cross-sectional view of the first part of the channel structure, the tunnel insulating layer, and the second conductive pattern, which are shown in FIG. 4. FIG. 5B is a cross-sectional view of the first pillar part of the channel structure, the tunnel insulating layer, the data storage layer, and the first blocking insulating layer, which are shown in FIG. 4.

Referring to FIGS. 5A and 5B, the sidewall of the core insulating layer 133 of the channel structure CH may be surrounded by the channel layer 131 of the channel structure CH, wherein a sidewall of the channel layer 131 may be surrounded by the tunnel insulating layer 125.

Referring to FIG. 5A, the tunnel insulating layer 125 may extend to surround a portion of the sidewall of the second pillar part PB. A sidewall of the first part P1 of the second pillar part PB may be surrounded by the tunnel insulating layer 125, wherein the tunnel insulating layer 125 may be in contact with the first part P1 of the second pillar part PB. The first part P1 of the second pillar part PB may be surrounded by the second conductive pattern 103 of the source select line (e.g., SSL1 shown in FIG. 4) with the tunnel insulating layer 125 interposed therebetween, so that a source select transistor having a gate all around (GAA) may be defined at an intersection portion of the first part P1 and the source select line.

Referring to FIG. 5B, the tunnel insulating layer 125 may extend to surround the sidewall of the first pillar part PA. The sidewall of the first pillar part PA may be surrounded by not only the tunnel insulating layer 125 but also the data storage layer 123 surrounding a sidewall of the tunnel insulating layer 125 and the first blocking insulating layer 121 surrounding a sidewall of the data storage layer 123.

In an embodiment, the data storage layer 123 may be formed as a material layer capable of storing data changed using Fowler-Nordheim tunneling. The first blocking insulating layer 121 may include an oxide layer capable of blocking charges. The tunnel insulating layer 125 may be formed as a silicon oxide layer through which charges may tunnel.

Figure 6:
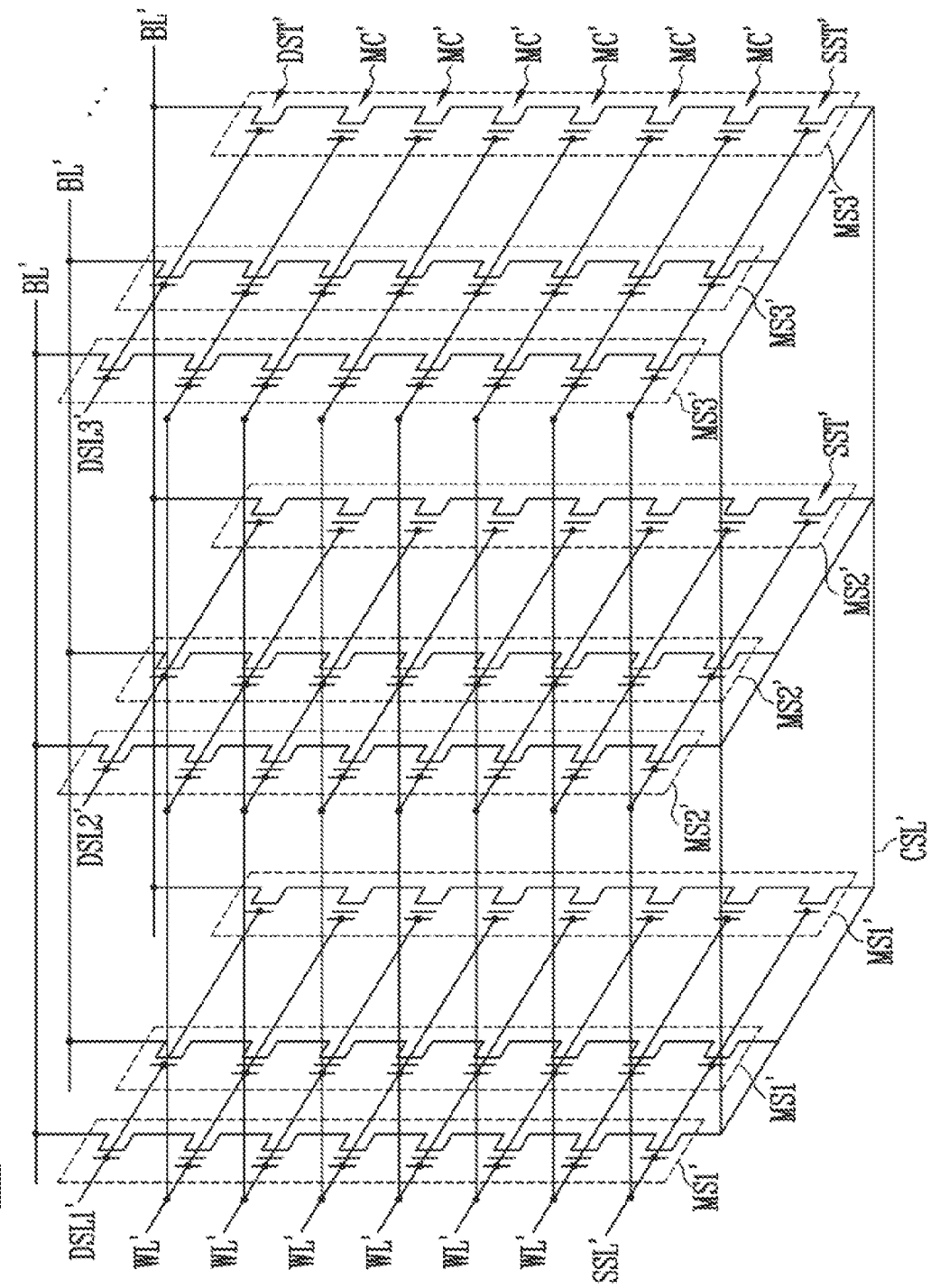
FIG. 6 is a circuit diagram illustrating a memory block of a semiconductor memory device in accordance with an embodiment of the present disclosure.

FIG. 6 is a circuit diagram illustrating a memory block of a semiconductor memory device in accordance with an embodiment of the present disclosure.

Referring to FIG. 6, the semiconductor memory device may include a plurality of memory blocks BLK', wherein each memory block BLK' may include a plurality of memory cell strings MS1', MS2', and MS3' connected to a common source layer CSL' and bit lines BL'.

Each of the memory cell strings MS1', MS2', and MS3' may include a plurality of memory cells MC' connected in series, a drain select transistor DST, and at least one source select transistor SST'. In an embodiment, each of the memory cell strings MS1', MS2', and MS3' may include one source select transistor SST' connected between the plurality of memory cells MC' and the common source layer CSL'. In another embodiment, each of the memory cell strings MS1', MS2', and MS3' may include two or more source select transistors SST' connected in series between the plurality of memory cells MC' and the common source layer CSL'.

The plurality of memory cells MC' may be connected to the common source layer CSL' via the source select transistor SST'. The plurality of memory cells MC' may be connected to the bit line BL' via the drain select transistor DST'.

Gates of drain select transistors DST' disposed at the same level may be connected to drain select lines DSL1', DSL2', and DSL3' isolated from each other.

In an embodiment, the memory block BLK' may include a first drain select line DSL1', a second drain select line DSL2', and a third drain select line DSL3, which are isolated from each other at the same level. However, the embodiment of the present disclosure is not limited thereto. In another embodiment, the memory block BLK' may include two drain select lines isolated from each other at the same level, or include four or more drain select lines isolated from each other at the same level.

Gates of source select transistors SST' disposed at the same level may be connected to a single source select line SSL'.

Gates of the plurality of memory cells MC' may be connected to a plurality of word lines WL', wherein the word lines WL' may be disposed at different levels, and gates of memory cells MC' disposed at the same level may be connected to a single word line WL'.

The plurality of memory cell strings MS1', MS2', and MS3' may be connected to each of the word lines WL'. In an embodiment, the plurality of memory cell strings MS1', MS2', and MS3' may be divided into a first group, a second group, and a third group, which may be individually selected by the first drain select line DSL1', the second drain select line DSL2', and the third drain select line DSL3'. The first group may include first memory cell strings MS1, the second group may include second memory cell strings MS2', and the third group may include third memory cell strings MS3'.

The first memory cell strings MS1' may be respectively connected to the bit lines BL' via drain select transistors DST' connected to first drain select lines DSL1'. The second memory cell strings MS2' may be respectively connected to the bit lines BL' via drain select transistors DST' connected to second drain select lines DSL2'. The third memory cell strings MS3' may be respectively connected to the bit lines BL' via drain select transistors DST' connected to third drain select lines DSL3'. One of the first memory cell strings MS1', one of the second memory cell strings MS2', and one of the third memory cell strings MS3' may be connected to a single bit line BL'.

The first memory cell strings MS1', the second memory cell strings MS2', and the third memory cell strings MS3' may be connected to the common source layer CSL' according to a gate signal applied to the source select line SSL'.

Figure 7:
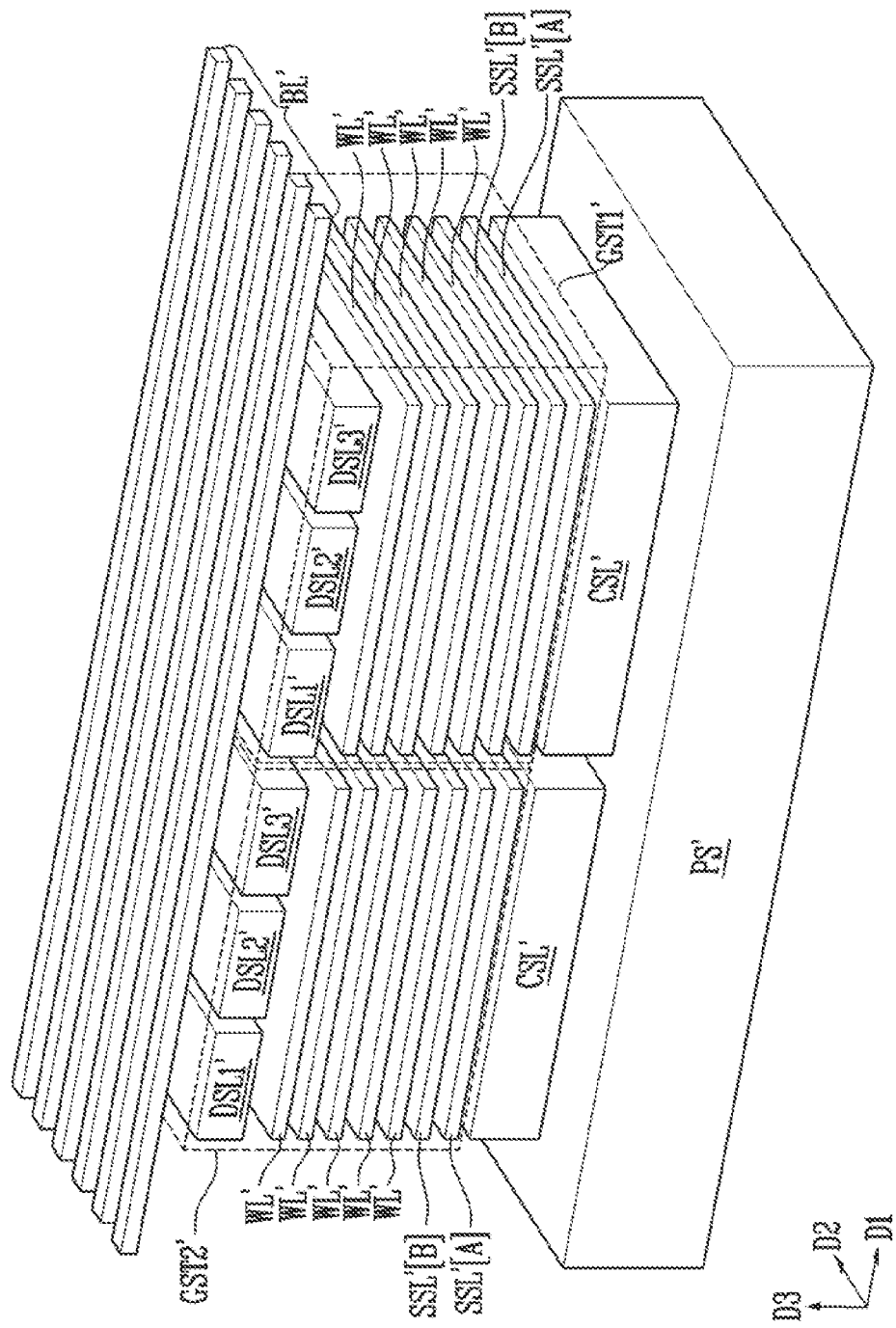
FIG. 7 is a perspective view schematically illustrating a semiconductor memory device in accordance with an embodiment of the present disclosure.

FIG. 7 is a perspective view schematically illustrating a semiconductor memory device in accordance with an embodiment of the present disclosure.

Referring to FIG. 7, the semiconductor memory device may include a peripheral circuit structure PS, common source layers CSL, gate stack structures GST1' and GST2', and bit line BL', wherein each of the gate stack structures GST1' and GST2' may constitute a memory block.

The peripheral circuit structure PS' may include a peripheral circuit for controlling an operation of memory cells, and may overlap with the gate stack structures GST1' and GST2' with the common source layers CSL' interposed therebetween.

The common source layers CSL' may be spaced apart from each other at the same level, and may overlap with the bit lines BL' with the gate stack structures GST1' and GST2' interposed therebetween.

The gate stack structures GST1' and GST2' may include a first gate stack structure GST1' and a second gate stack structure GST2, which face each other.

Each of the first gate stack structure GST1' and the second gate stack structure GST2' may include an upper select group including upper select lines, a lower select group including lower select lines, and word lines WL' disposed between the upper select group and the lower select group. In an embodiment, the upper select lines may be configured with drain select lines DSL1', DSL2', and DSL3', and the lower select lines may be configured with source select lines SSL'[A] and SSL'[B].

Each of the drain select lines DSL1', DSL2', and DSL3', the word lines WL', and the source select lines SSL'[A] and SSL'[B] may extend in a first direction D1 and a second direction D2, wherein the first direction D1 may be defined as a direction of an X-axis in an XYZ coordinate system, and the second direction D2 may be defined as a direction of a Y-axis in the XYZ coordinate system.

The drain select lines DSL1', DSL2', and DSL3' may be isolated from each other at the same level, and may be spaced apart from each other in an extending direction of the bit line BL'. In an embodiment, the drain select lines DSL1', DSL2', and DSL3' may be spaced apart from each other in the first direction D1. The drain select lines DSL1', DSL2', and DSL3' may be disposed between the bit line BL' and a stack structure including the word lines WL'.

The word lines WL' may be spaced apart from each other in a third direction D3, wherein the third direction D3 may be defined as a direction of a Z-axis in the XYZ coordinate system. Each of the word lines WL' may extend to overlap with the drain select lines DSL1', DSL2', and DSL3' isolated from each other.

The source select lines SSL'[A] and SSL'[B] may be disposed in at least one layer between the common source layer CSL' and the stack structure including the word lines WL'. In an embodiment, the source select lines SSL'[A] and SSL'[B] may include source select lines SSL'[A] of a first level and a source select line SSL'[B] of a second level. The source select line SSL'[B] of the second level may be spaced apart from the source select line SSL'[A] of the first level.

The peripheral circuit structure PS' may overlap with the upper select group including the drain select lines DSL1', DSL2', and DSL3'. The common source layer CSL' in addition to the lower select group including the source select lines SSL'[A] and SSL'[B] may be disposed between the peripheral circuit structure PS' and the upper select group including the drain select lines DSL1', DSL2', and DSL3'.

The bit line BL' may extend to overlap with the first gate stack structure GST1' and the second gate stack structure GST2'. The common source layers CSL' may respectively overlap with the first gate stack structure GST1' and the second gate stack structure GST2'.

Figure 8A:
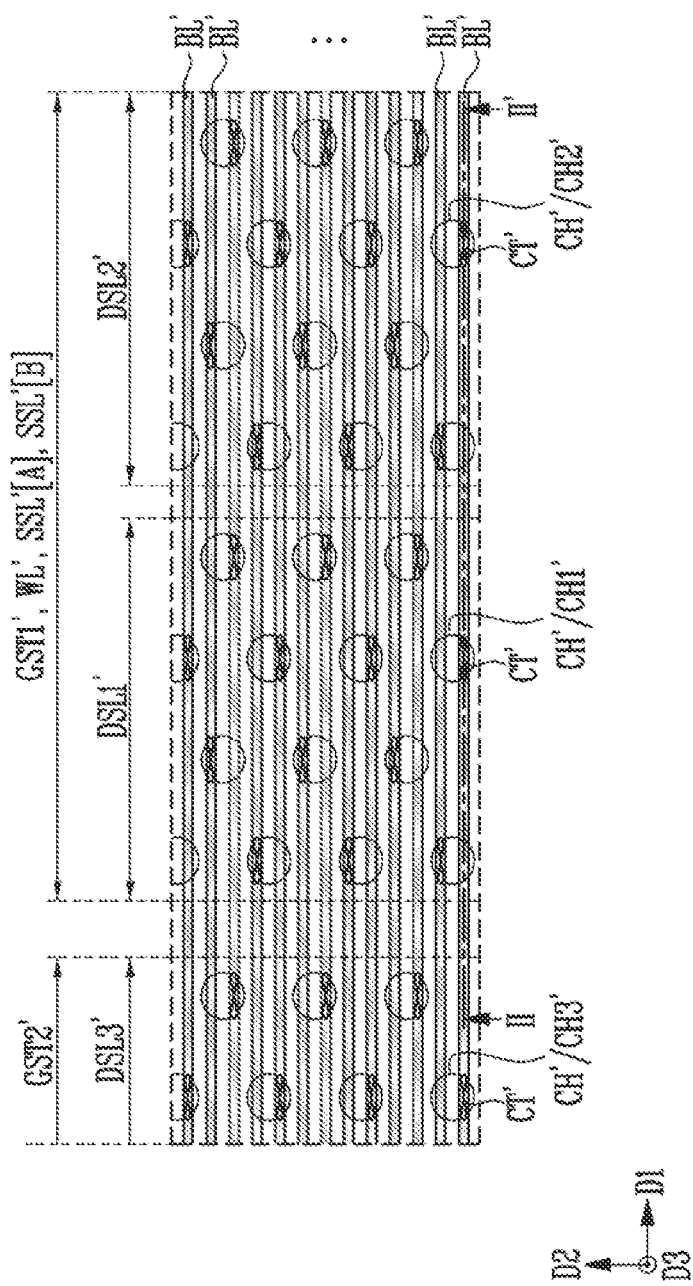
FIG. 8A is a plan view illustrating a layout of bit lines of the semiconductor memory device shown in FIG. 7.

FIG. 8A is a plan view illustrating a layout of the bit lines of the semiconductor memory device shown in FIG. 7.

Referring to FIG. 8A, the bit lines BL' may extend in parallel to each other, and be spaced apart from each other. In an embodiment, the bit lines BL' may extend in the first direction D1, and be spaced apart from each other in the second direction D2.

The bit lines BL' may be connected to channel structures CH' extending in the third direction D3, and may be connected to the channel structures CH' via bit line contact structures CT'.

The channel structures CH' may penetrate the first gate stack structure GST1' and the second gate stack structure GST2', and the channel structures CH' may be divided into groups controlled by the drain select lines DSL1', DSL2', and DSL3' spaced apart from each other. In an embodiment, the channel structures CH' may include a first group configured with first channel structures CH1', a second group configured with second channel structures CH2', and a third group configured with third channel structures CH3'. Sidewalls of the first channel structures CH1' may be surrounded by a first drain select line DSL1' of the first gate stack structure GST1', and be controlled by the first drain select line DSL1'. Sidewalls of the second channel structures CH2' may be surrounded by a second drain select line DSL2' of the first gate stack structure GST1', and may be controlled by the second drain select line DSL2'. Sidewalls of the third channel structures CH3' may be surrounded by a third drain select line DSL3' of the second gate stack structure GST2', and may be controlled by the third drain select line DSL3'.

One of the first channel structures CH1', one of the second channel structures CH2, and one of the third channel structures CH3' may be connected in parallel to a single bit line BL'.

The word line WL' of the first gate stack structure GST1' and each of the source select lines SSL'[A] and SSL'[B] of the first gate stack structure GST1' may extend to surround the sidewalls of the first channel structures CH1' and the sidewalls of the second channel structures CH2'.

Referring to FIG. 8A, line II-II' overlaps with a single bit line BL'. Channel structures CH overlapping with a single bit line BL' may include channel structures connected to the single bit line BL' via bit line contact structures CT' overlapping with the line II-II' and channel structures connected to another bit line BL' via bit line contact structures CT not overlapping with the line II-II'.

FIG. 8B is a sectional view of the semiconductor memory device taken along the line II-II' shown in FIG. 8A.

Referring to FIG. 8B, the word lines WL' of the first gate stack structure GST1' may be spaced apart from the word lines WL' of the second gate stack structure GST2' by a first trench T1, wherein the first trench T1' may extend between a first lower select group including the source select lines SSL'[A] and SSL'[B] of the first gate stack structure GST1' and a second lower select group including the source select lines SSL'[A] and SSL'[B] of the second gate stack structure GST2'.

Each of the first gate stack structure GST1' and the second gate stack structure GST2' may further include interlayer insulating layers 211 stacked to be spaced apart from each other in the third direction D3. Conductive layers provided for the word lines WL' and the source select lines SSL'[A] and SSL'[B] and the interlayer insulating layers 211 may be alternately disposed in the third direction D3.

The common source layers CSL' may be disposed between the first and second gate stack structures GST1' and GST2' and the peripheral circuit structure PS'. The first trench T1' may extend between the common source layers CSL' and may be filled with a gate isolation layer 251. The gate isolation layer 251 and the common source layers CSL' may face the peripheral circuit structure PS' with a first insulating structure 261 interposed therebetween.

The upper select group including the drain select lines DSL1', DSL2', and DSL3' may overlap with the common source layers CSL' with the lower select group including the source select lines SSL'[A] and SSL'[B] in addition to the word lines WL', which are interposed therebetween. The drain select lines DSL1', DSL2', and DSL3' may be isolated from each other by second trenches T2', wherein the second trenches T2' may be filled with a first upper insulating layer 295. The first upper insulating layer 295 may extend between the bit line BL' and the upper select group including the drain select lines DSL1', DSL2', and DSL3'. The bit line BL' may be spaced apart from the drain select lines DSL1', DSL2', and DSL3' with a second upper insulating layer 297 in addition to the first upper insulating layer 295, which are interposed therebetween.

The bit line BL' may include a metal layer 299B and a conductive metal barrier layer 299A disposed between the metal layer 299B and the second upper insulating layer 297, and may be connected to channel structures CH' via bit line contact structures CT'.

The bit line contact structures CT' may penetrate the first upper insulating layer 295 and the second upper insulating layer 297, to electrically connect some of the channel structures CH' to the bit line BL'.

Referring to the first gate stack structure GST1', each of the channel structures CH' may include a channel layer 231 and a core insulating layer 233, wherein a sidewall of the core insulating layer 233 may be surrounded by the first gate stack structure GST1' and the first upper insulating layer 295. The channel layer 231 may include a semiconductor material, may be disposed between the core insulating layer 233 and the first gate stack structure GST1', may extend between the core insulating layer 233 and the first upper insulating layer 295, and may extend between the common source layer CSL' and the first gate stack structure GST1'.

Referring to a common source layer CSL' corresponding to the first gate stack structure GST1', the common source layer CSL' may include a horizontal pattern HP extending in parallel to the word line WL' and a vertical pattern VP extending in the third direction D3 toward the core insulating layer 233 from the horizontal pattern HP. The channel layer 231 may extend to surround a sidewall of the vertical pattern VP, and extend between the horizontal pattern HP and the first gate stack structure GST1'. The common source layer CSL' may be formed as a doped semiconductor layer including at least one of an n-type impurity and a p-type impurity.

Each of the channel structures CH' may include a first pillar part PA' and a second pillar part PB' extending in the third direction D3 from the first pillar part PA'. A central region of the first pillar part PA' may be filled with the core insulating layer 233 and the vertical pattern VP of the common source layer CSL, and the core insulating layer 233 may extend to a central region of the second pillar part PB'.

An outer wall of the first pillar part PA' and an outer wall of the second pillar part PB' may be configured with the channel layer 231.

Referring to the first gate stack structure GST1', a sidewall of the first pillar part PA' may be surrounded by not only the interlayer insulating layers 211 and the word lines WL' but also the source select line SSL'[A] of the first level, which corresponds to the first pillar part PA', and the source select line SSL'[B] of the second level, which corresponds to the first pillar part PA'. A sidewall of the second pillar part PB' may be surrounded by the drain select line DSL1' or DSL2' corresponding to the second pillar part PB', and the second pillar part PB' of the channel structure CH' may extend to the inside of the first upper insulating layer 295.

The sidewall of the first pillar part PA' may be surrounded by a first blocking insulating layer 221, a data storage layer 223, and a tunnel insulating layer 225, wherein the first blocking insulating layer 221, the data storage layer 223, and the tunnel insulating layer 225 may be disposed between the first pillar part PB' and each of the interlayer insulating layers 221 and the word lines WL'. The first blocking insulating layer 221, the data storage layer 223, and the tunnel insulating layer 225 may extend between the source select line SSL'[A] of the first level and the first pillar part PA', may extend between the source select line SSL'[B] of the second level and the first pillar part PA', and may extend between the first gate stack structure GST1' and the channel layer 231.

The data storage layer 223 may be disposed between the first blocking insulating layer 221 and the first pillar part PA'. The tunnel insulating layer 225 may be disposed between the data storage layer 223 and the first pillar part PA', and may extend between the second pillar part PB' and the drain select line DSL1' or DSL2' corresponding to the second pillar part PB'.

Each of the channel structure CH' may have a tapered shape. The width of the channel structure CH' becomes wider as the channel structure CH' becomes closer to the common source layer CSL' and the peripheral circuit structure PS'. Some of the channel structures CH' may be connected to the bit line BL' via the bit line contact structures CT'. The bit line contact structure CT' may penetrate the first upper insulating layer 295 and the second upper insulating layer 297, and may extend to be in contact with the channel layer 231 of the channel structure CH'.

The common source layer CSL' may be spaced apart from the peripheral circuit structure PS' by the first insulating structure 261, wherein the first insulating structure 261 may be bonded to the peripheral circuit structure PS'.

The peripheral circuit structure PS' may include a substrate 271 including transistors 280A and 280B, a second insulating structure 291, and an interconnection structure 293.

The transistors 280A and 280B may be disposed in active regions of the substrate 271, which are partitioned by isolation layers 273, and each of the transistors 280A and 280B may include a gate insulating layer 281, a gate electrode 283, and junctions 285 as described with reference to FIG. 3B. Some (e.g., 280B) of the transistors 280A and 280B may constitute a page buffer circuit for controlling a precharge operation and a discharge operation of the bit line BL'.

The second insulating structure 291 may be disposed between the first insulating structure 261 and the substrate 271, may include two or more insulating layers, and may be bonded to the first insulating structure 261.

The interconnection structure 293 may be buried in the second insulating structure 291, may include a plurality of conductive patterns, may be electrically connected to the transistor 280B of the page buffer circuit, and may be connected to the bit line BL' via a first via contact structure V1 and a second via contact structure V2.

The first via contact structure V1 may penetrate the gate isolation layer 251, may penetrate the first insulating structure 261 and the second insulating structure 291 to be in contact with the interconnection structure 293, and may extend in the third direction D3 to penetrate the first upper insulating layer 295. The second via contact structure V2 may be in contact with the first via contact structure V1, and may extend to penetrate the second upper insulating layer 297. The first via contact structure V1 may include a conductive metal barrier layer 296A and a metal layer 296B, and the second via contact structure V2 may also include a conductive metal barrier layer 298A and a metal layer 298B.

In accordance with the above-described embodiment, the bit line BL' may be connected to the transistor 280B of the page buffer circuit via the first via contact structure V1, the second via contact structure V2, and the interconnection structure 293.

Figure 9:
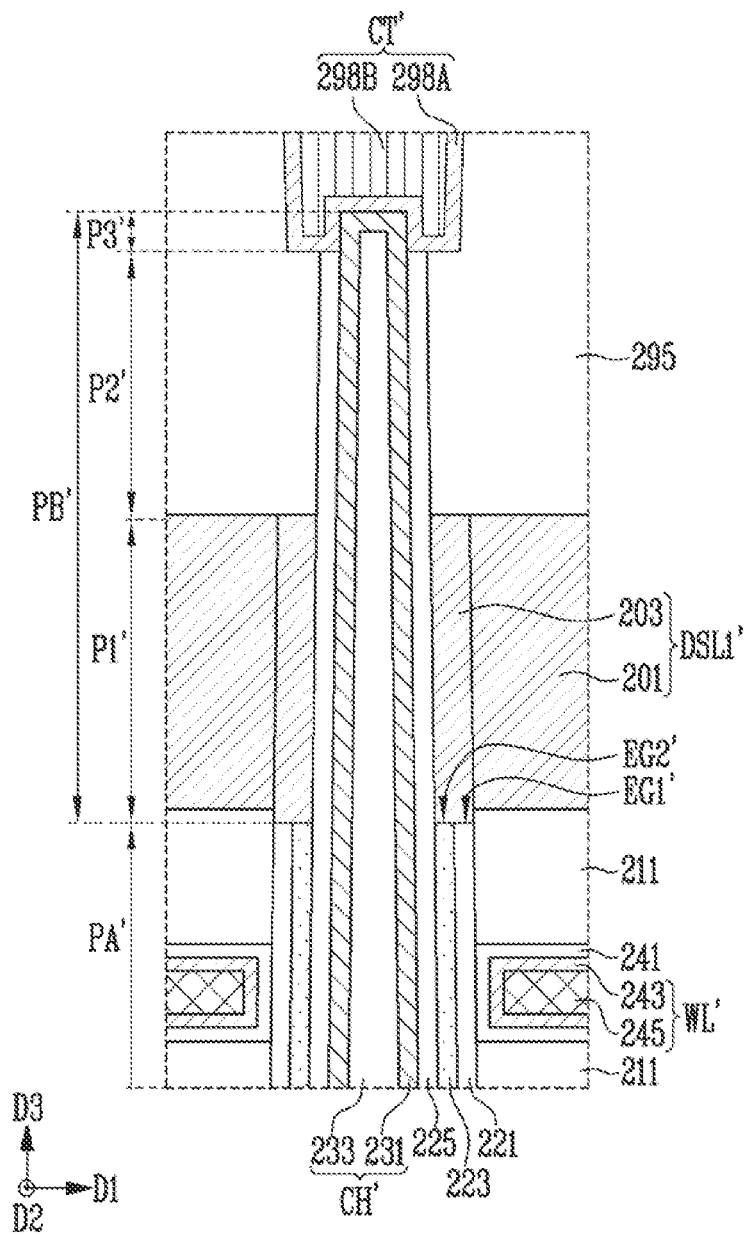
FIG. 9 is an enlarged sectional view of region B shown in FIG. 8B.

FIG. 9 is an enlarged sectional view of region B shown in FIG. 8B.

Referring to FIG. 9, the first blocking insulating layer 221 may include an end portion EG1' facing in the third direction D3, and the data storage layer 223 may also include an end portion EG2' facing in the third direction D3.

A drain select line (e.g., DSL1') may overlap with the end portion EG1' of the first blocking insulating layer 221 and the end portion EG2' of the data storage layer 223.

The drain select line DSL1' may include a first conductive pattern 201 and a second conductive pattern 203. The first conductive pattern 201 may extend in a planar direction to intersect the second pillar part PB'. Specifically, the first conductive pattern 201 may extend in the first direction D1 and the second direction D2 to be parallel to the word line WL'. The second conductive pattern 203 may be disposed between the first conductive pattern 201 and the tunnel insulating layer 225, and may provide a drain select transistor having a gate all around (GAA) structure at an intersection portion between the drain select line DSL1' and the second pillar part PB'.

The second conductive pattern 203 may include at least one of silicon, metal silicide, and conductive metal barrier, wherein the metal silicide may include tungsten silicide or nickel silicide and the conductive metal barrier may include titanium and titanium nitride.

The second pillar part PB' of the channel structure CH' may include a first part P1' surrounded by the drain select line DSL1', a second part P2' extending in the third direction D3 from the first part P1', and a third part P3' extending in the third direction D3 from the second part P2'. The second part P2' and the third part P3' may protrude farther in the third direction D3 than the drain select line DSL1' and may be covered by the upper insulating layer 295.

The bit line contact structure CT' may penetrate the first insulating layer 295, and may extend to be in contact with the channel layer 231 of the third part P3'. The conductive metal barrier layer 298A of the bit line contact structure CT' may be disposed between the metal layer 298B of the bit line contact structure CT' and the channel layer 231, and may extend between the metal layer 298B of the bit line contact structure CT' and the first upper insulating layer 295.

The core insulating layer 233 of the channel structure CH' may extend to a central region of the first part P1', the second part P2', and the third part P3' from the central region of the first pillar part PA'.

The word line WL' may include a conductive metal barrier layer 243 and a metal layer 245 as described with reference to FIG. 4. A second blocking insulating layer 241 may be disposed between the word line WL' and the first blocking insulating layer 221 as described with reference to FIG. 4. Like the word line WL', each of the source select lines SSL'[A] and SSL'[B] shown in FIG. 8B may include a conductive metal barrier layer 243 and a metal layer 245. The second blocking insulating layer 241 may be disposed between the first blocking insulating layer 221 and each of the source select lines SSL'[A] and SSL'[B] shown in FIG. 8B, and may extend between the interlayer insulating layers 211 and each of the source select lines SSL'[A] and SSL'[B] shown in FIG. 8B.

The tunnel insulating layer 225, the data storage layer 223, and the first blocking insulating layer 221 may be made of the materials described with reference to FIG. 5B. The second blocking insulating layer 241 may include an insulating material having a dielectric constant higher than that of the first blocking insulating layer 221.

FIGS. 10A, 10B, 10C, 10D, 10E, 11, 12, 13, 14A, 14B, 15A, 15B, 16A, 16B, 17A, 17B, and 17C are views illustrating a manufacturing method of a semiconductor memory device in accordance with an embodiment of the present disclosure.

FIGS. 10A to 10E are sectional views illustrating processes performed before a bonding process.

Figure 10A:
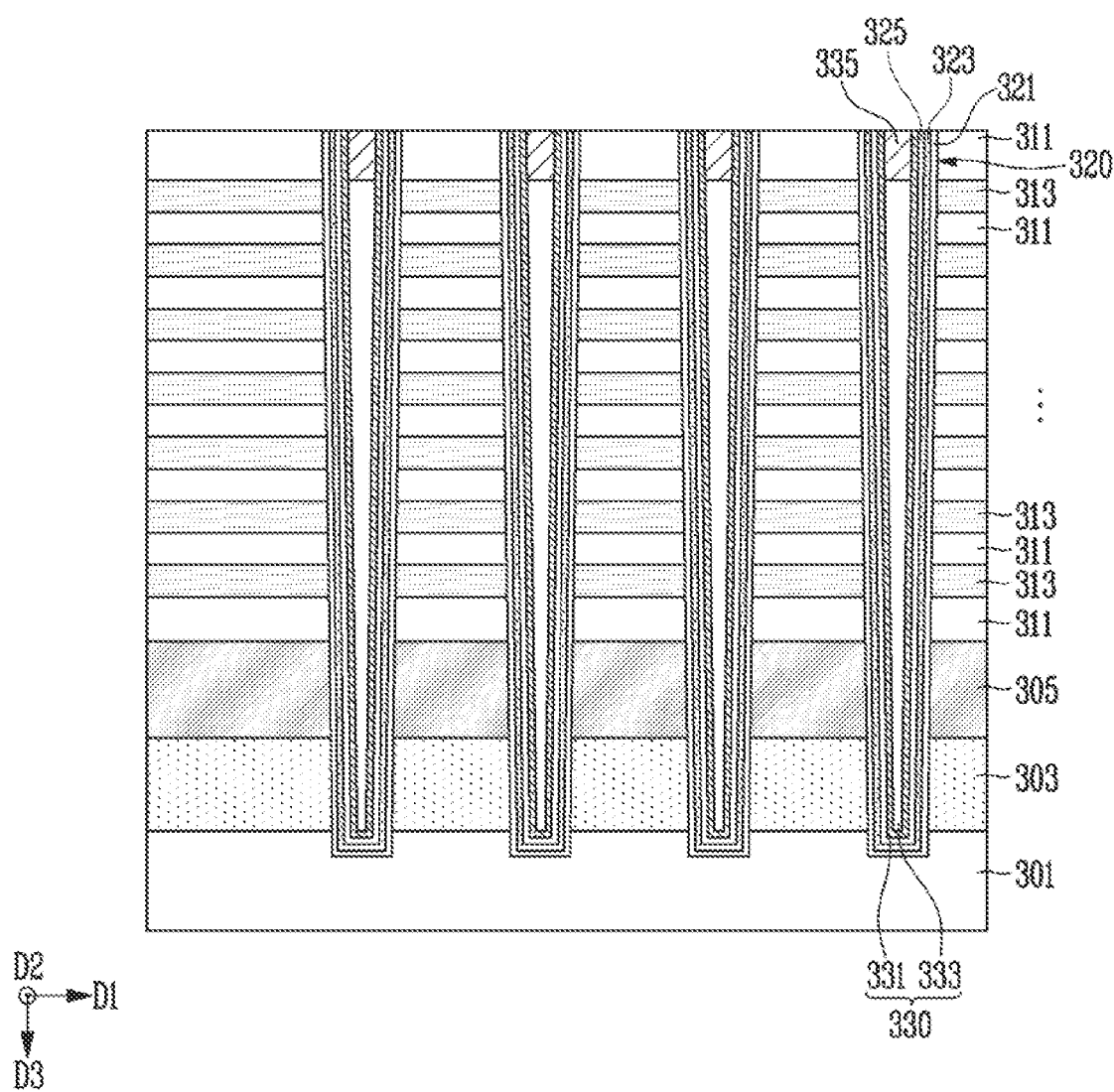

Referring to FIG. 10A, a first conductive layer 305 may be formed on a first substrate 301. Before the first conductive layer 305 is formed, a first protective layer 303 having an etch selectivity with respect to the first substrate 301 may be formed on the first substrate 301. In an embodiment, the first substrate 301 may include silicon, and the first protective layer 303 may include nitride.

The first conductive layer 305 may include a conductive material having etch resistance with respect to an etching material when a subsequent etching process of removing the first protective layer 303 is performed. In an embodiment, the first conductive layer 305 may include silicon.

Subsequently, first material layers 311 and second material layers 313 may be alternately stacked on the first conductive layer 303. In an embodiment, the first material layers 311 may be an insulating material for interlayer insulating layers such as silicon oxide, and the second material layers 313 may be a sacrificial material having an etch selectivity with respect to the first materials 311 such as silicon nitride. In another embodiment, the first material layers 311 may be an insulating material for interlayer insulating layers, and the second material layers 313 may be a conductive material for word lines and lower select lines. Hereinafter, for convenience of description, a manufacturing process will be mainly described based on an embodiment in which the first material layers 311 are made of an insulating material for interlayer insulating layers and the second material layers 313 are made of a sacrificial material. However, the embodiment of the present disclosure is not limited thereto.

Subsequently, a hole 320 may be formed to penetrate the first material layers 311 and the second material layers 313. The hole 320 may penetrate the first conductive layer 305 and the first protective layer 303, and extend to the inside of the first substrate 301. The hole 320 may be formed by performing an etching process toward the first substrate 301 from a first material layer 311 most distant from the first substrate 301 among the first material layers 311 and the second material layers 313. Accordingly, the hole 320 may have a tapered shape. The width of the hole 320 becomes wider as the hole 320 becomes more distant from the first substrate 301.

Subsequently, a first blocking insulating layer 321, a data storage layer 323, and a tunnel insulating layer 325 may be sequentially stacked on a surface of the hole 320. The data storage layer 323 may be made of a material which enables storage of data and has an etch selectivity with respect to the first blocking insulating layer 321 and the tunnel insulating layer 325. In an embodiment, the first blocking insulating layer 321 may include an oxide, the data storage layer 323 may include silicon nitride, and the tunnel insulating layer 325 may include silicon oxide.

Subsequently, a central region of the hole 320 may be filled with a channel structure 330 and a doped semiconductor pattern 335, wherein the channel structure 330 may include a channel layer 331 and a core insulating layer 333. The channel layer 331 may extend along a surface of the tunnel insulating layer 325, and may include a semiconductor material. In an embodiment, the channel layer may include silicon. The core insulating layer 333 and the doped semiconductor pattern 335 may fill the central region of the hole 320, which is opened by the channel layer 331. After a portion of the hole 320 is filled with the core insulating layer 333, the doped semiconductor pattern 335 may be disposed on the core insulating layer 333. The channel structure 330 filling the central region of the hole 320 may have a tapered shape. The width of the channel structure 330 becomes wider as the hole 320 becomes more distant from the first substrate 301.

Figure 10B:
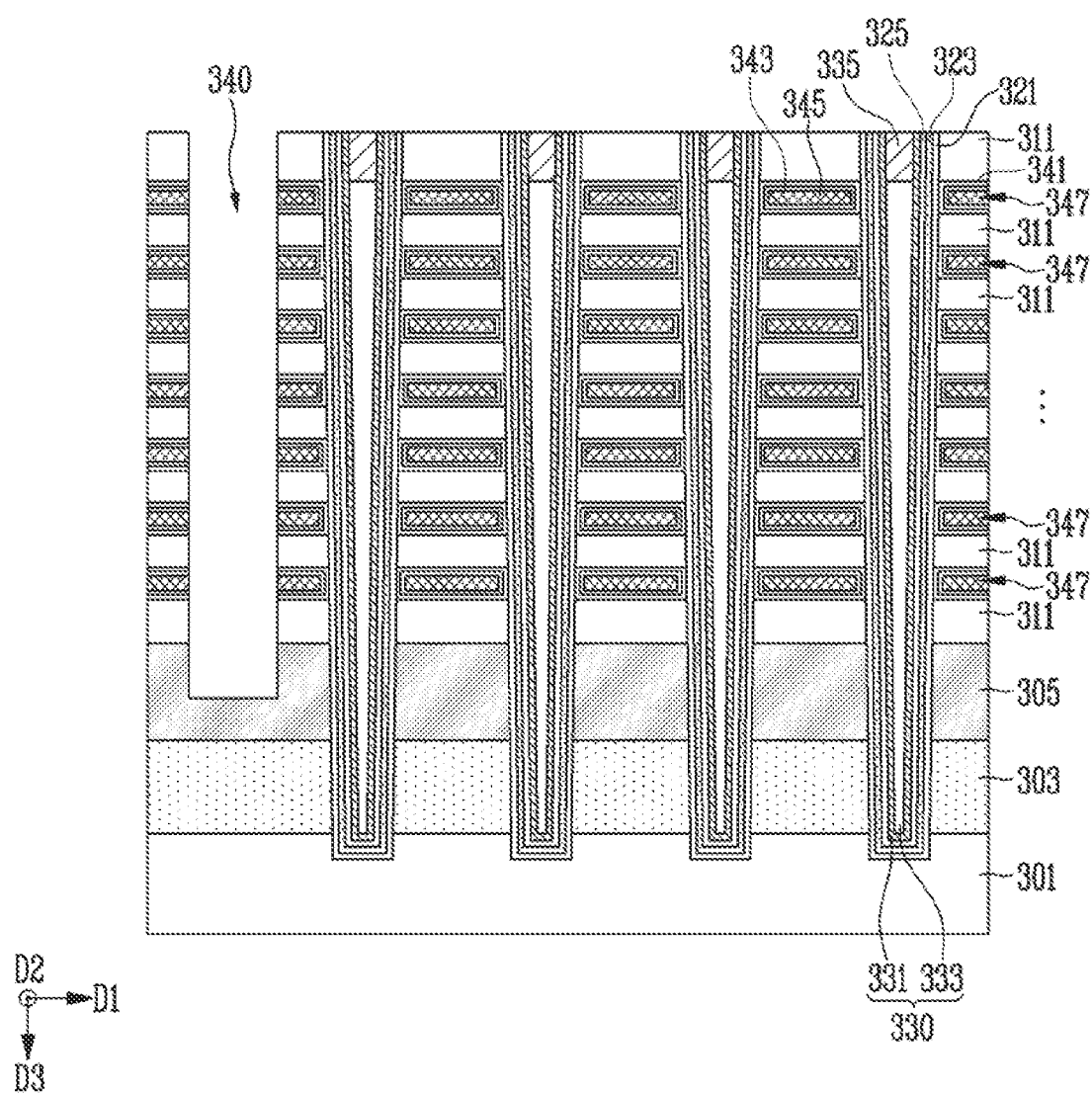

Referring to FIG. 10B, a first trench 340 may be formed to penetrate the first material layers 311 and the second material layers 313, which are shown in FIG. 3A, wherein the first trench 340 may be defined by etching the first material layers 311 and the second material layers 313. While the first material layers 311 and the second material layers 313 are being etched, the first conductive layer 305 may serve as an etch stop layer.

When the second material layers 313 shown in FIG. 10A are a sacrificial material, the second material layers 313 shown in FIG. 10A may be replaced with conductive patterns 347 through the first trench 340. The process of replacing the second material layers 313 shown in FIG. 10A with the conductive patterns 347 may include a process of opening gate regions between the first material layers 311 by removing the second material layers 313 shown in FIG. 10A through the first trench 340 and a process of filling the gate regions with the conductive pattern 347.

Before the gate regions are filled with the conductive patterns 347, a second blocking insulating layer 341 may be formed along a surface of each of the gate regions, wherein each of the conductive patterns 347 may fill a portion of the gate region opened by the second blocking insulating layer 341.

The conductive patterns 347 may be formed of various conductive materials. In an embodiment, each of the conductive patterns 347 may include a conductive metal barrier layer 343 and a metal layer 345. Each of the conductive patterns 347 may surround a sidewall of the channel structure 330 between the first material layers 311.

Figure 10C:
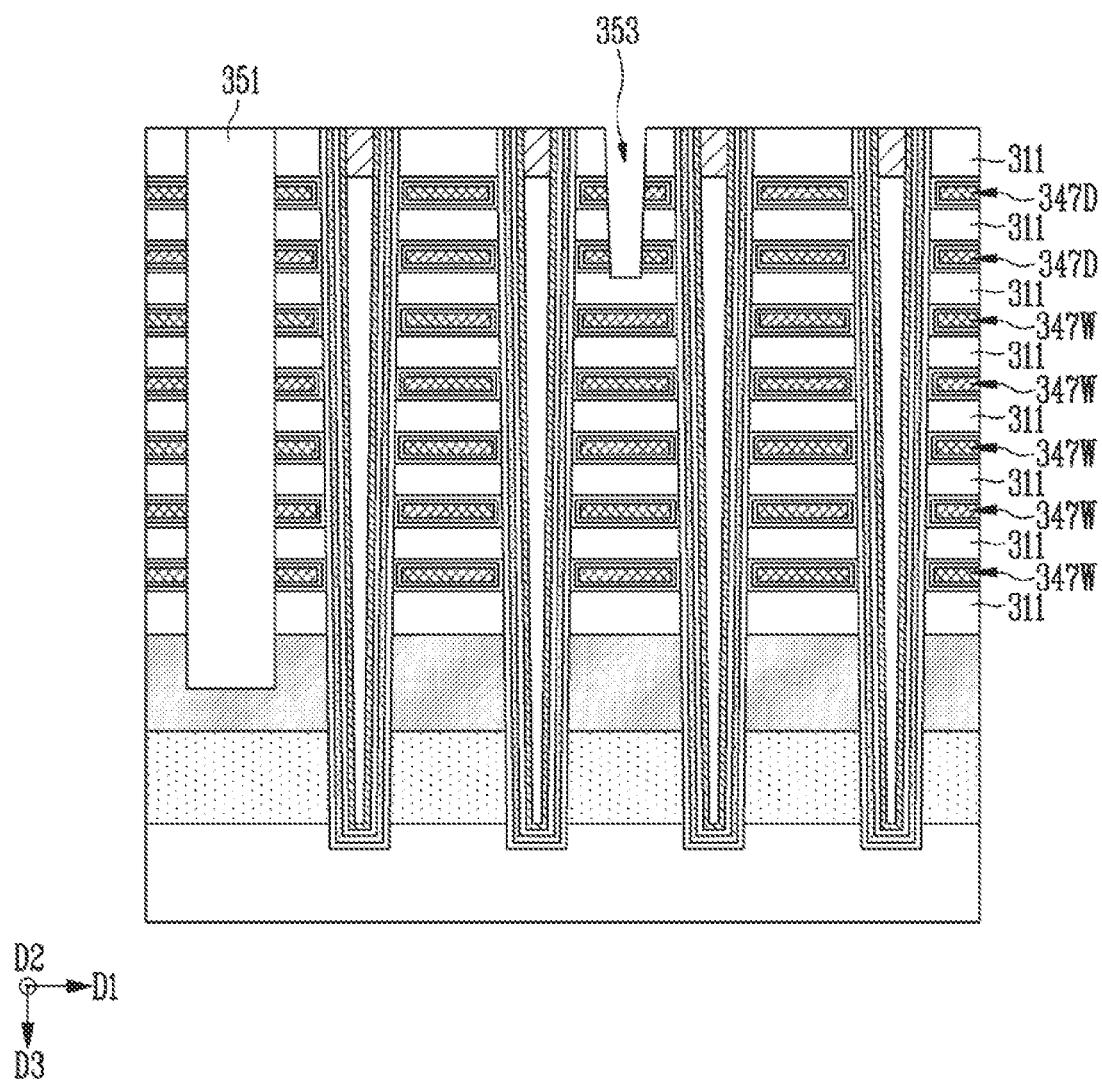

Referring to FIG. 10C, the first trench 340 shown in FIG. 10B may be filled with a gate isolation layer 351 which may be an insulating material.

Subsequently, a second trench 353 may be formed to penetrate at least one of the conductive patterns 347 shown in FIG. 10B. In an embodiment, second trench 353 may penetrate two conductive patterns. Some of the conductive patterns 347 shown in FIG. 10B may be isolated into drain select lines 347D by the second trench 353. The other conductive patterns which are not penetrated by the second trench 353 may be defined as word lines 347W.

Referring to FIG. 10D, the second trench 353 shown in FIG. 10C may be filled with a drain isolation layer 357, which may be formed of an insulating material.

Subsequently, a first insulating layer 361 may be formed to extend to overlap with the channel structure 330, the gate isolation layer 351, the drain isolation layer 357, and the interlayer insulating layers 311. Continuously, a bit line contact structure 363 may be formed to penetrate the first insulating layer 361. The bit line contact structure 363 may be electrically connected to the channel structure 330 and the doped semiconductor pattern 335.

Subsequently, a bit line 365 may be formed to be in contact with the bit line contact structure 363. The bit line 365 may extend onto the first insulating layer 361. In an embodiment, the bit line 365 may extend in the first direction D1.

Figure 10E:
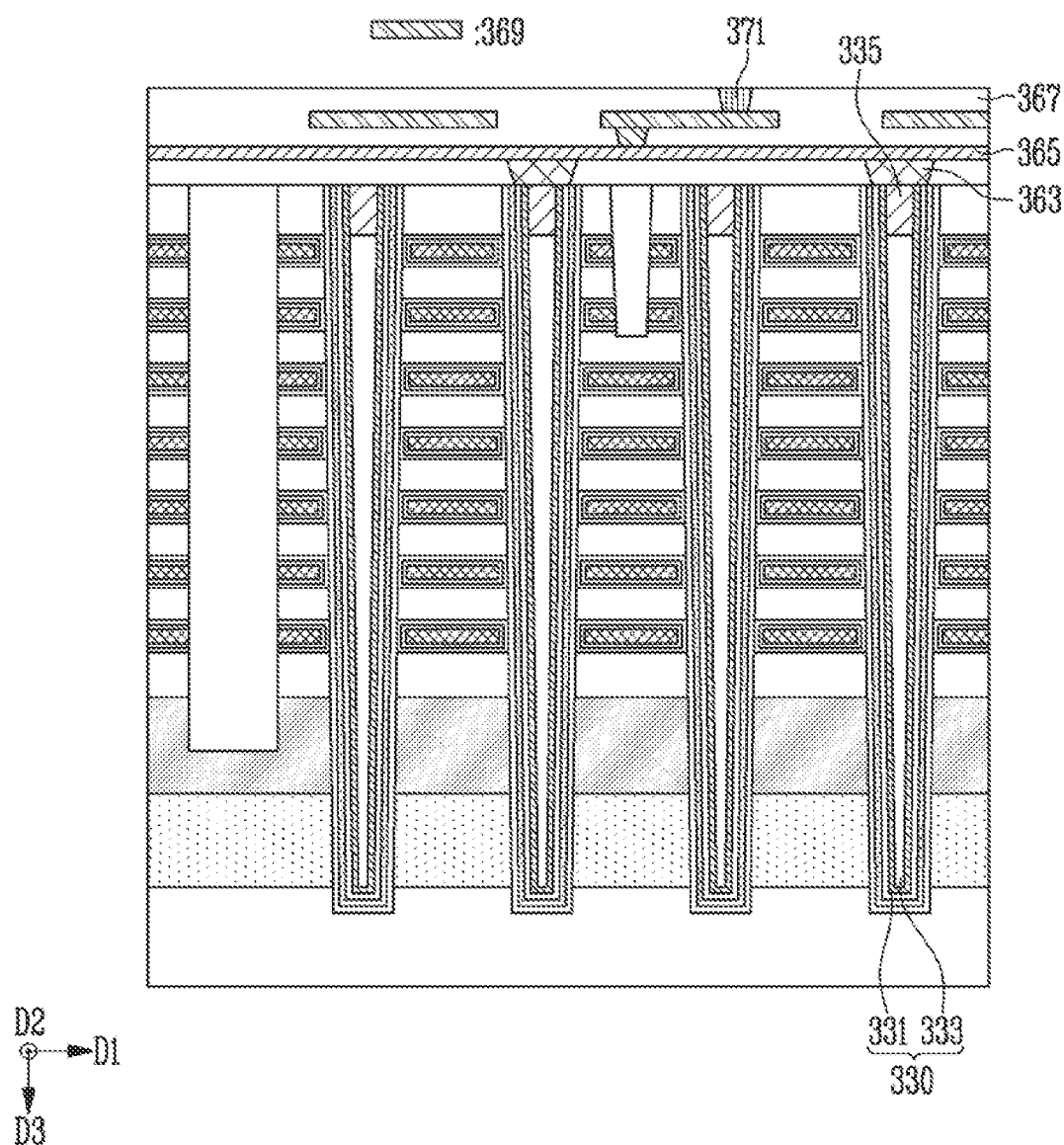

Referring to FIG. 10E, a bonding structure may be formed on the bit line 365 and may include a first insulating structure 367 and a first conductive bonding pad 371 buried in the first insulating structure 367.

Before the first conductive bonding pad 371 is formed, a first interconnection structure 369 may be formed to include a plurality of conductive patterns buried in the first insulating structure 367. Some of the conductive patterns of the first interconnection structure 369 may be electrically connected to the bit line 365. The first conductive bonding pad 371 may be in contact with the first interconnection structure 369 and may be electrically connected to the bit line 365 via the first interconnection structure 369.

Figure 11:
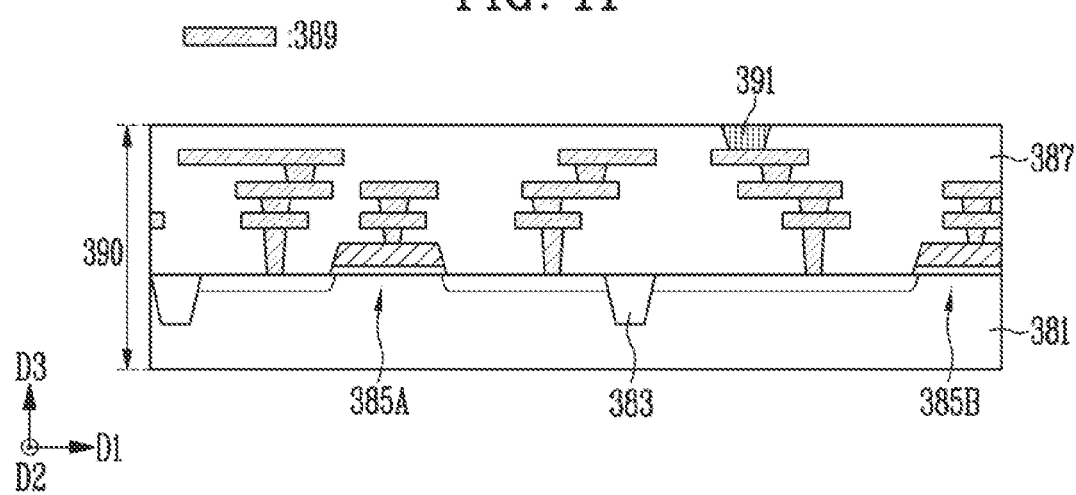

FIG. 11 is a sectional view illustrating a process of forming a peripheral circuit structure.

Referring to FIG. 11, the process of forming the peripheral circuit structure 390 may include a process of forming, in a second substrate 381, an isolation layer 383 partitioning active regions of the second substrate 381, a process of forming transistors 385A and 385B in the active regions partitioned by the source isolation layer 383, a process of forming a second interconnection structure 389 connected to the transistors 385A and 385B, and a process of forming a second conductive bonding pad 391 connected to the second interconnection structure 389.

The transistors 385A and 385B may include components identical to the transistors described with reference to FIG. 3A. Some (e.g., 385B) among the transistors 385A and 385B may constitute a page buffer circuit.

The second substrate 381 including the transistors 385A and 385B may be covered by a second insulating structure 387. The second interconnection structure 389 and the second conductive bonding pad 391 may be buried in the second insulating structure 387.

The second interconnection structure 389 may include a plurality of conductive patterns, some of which may be connected to the transistor 385B of the page buffer circuit. The second conductive bonding pad 391 may be connected to the transistor 385B of the page buffer circuit via the second interconnection structure 389.

Figure 12:
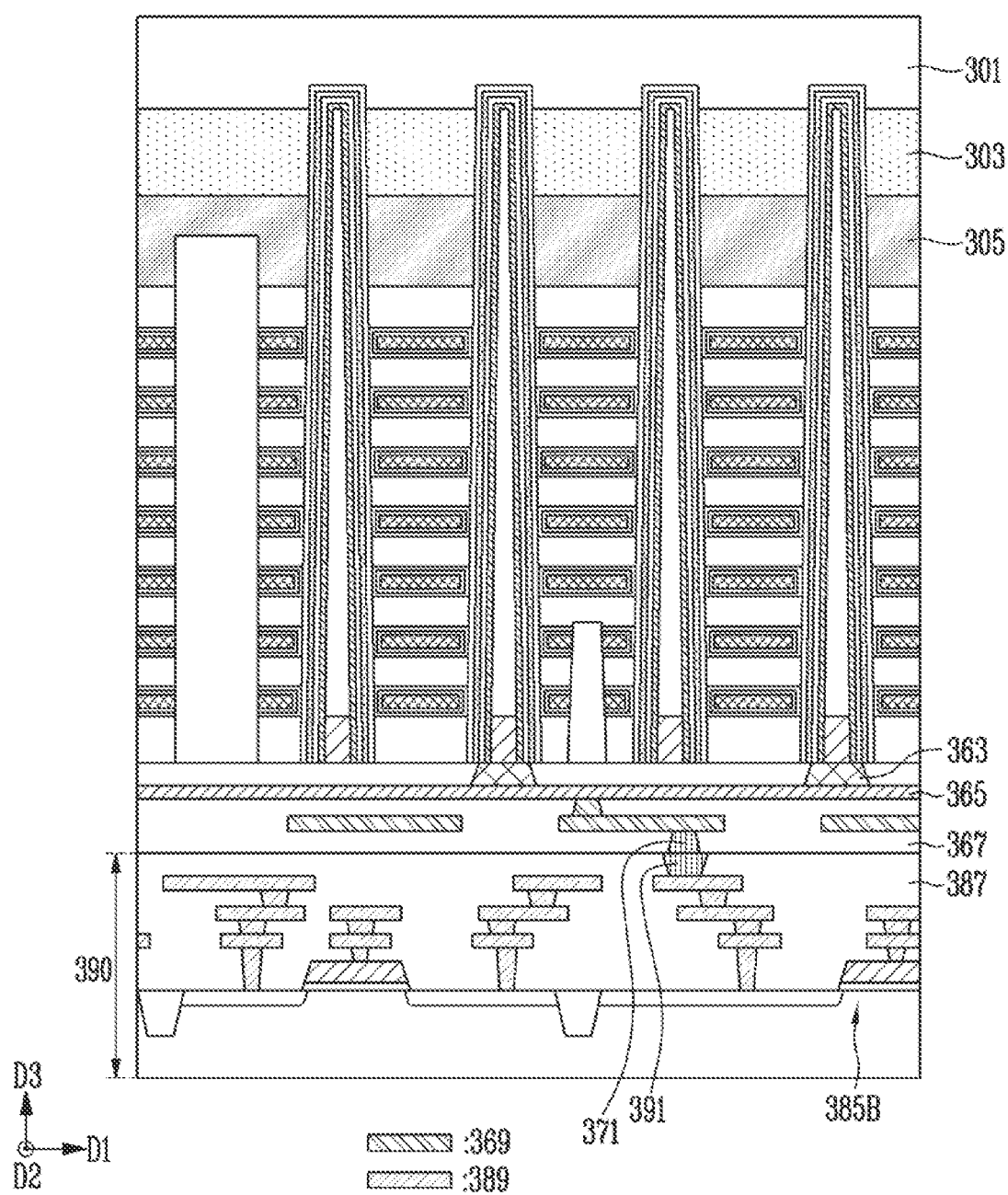

FIG. 12 is a sectional view illustrating a bonding process.

Referring to FIG. 12, the peripheral circuit structure 390 may be aligned to face the first insulating structure 367 and the first conductive bonding pad 371 of the bonding structure.

Subsequently, the second insulating structure 387 and the second conductive bonding pad 391 of the peripheral circuit structure 390 may be bonded to the first insulating structure 367 and the first conductive bonding pad 371 of the bonding structure.

After the process of performing the bonding process, a process temperature may be limited to 450° C. or lower so that occurrence of a defect in the first conductive bonding pad 371 and the second conductive bonding pad 391 due to high temperature may be reduced.

Figure 13:
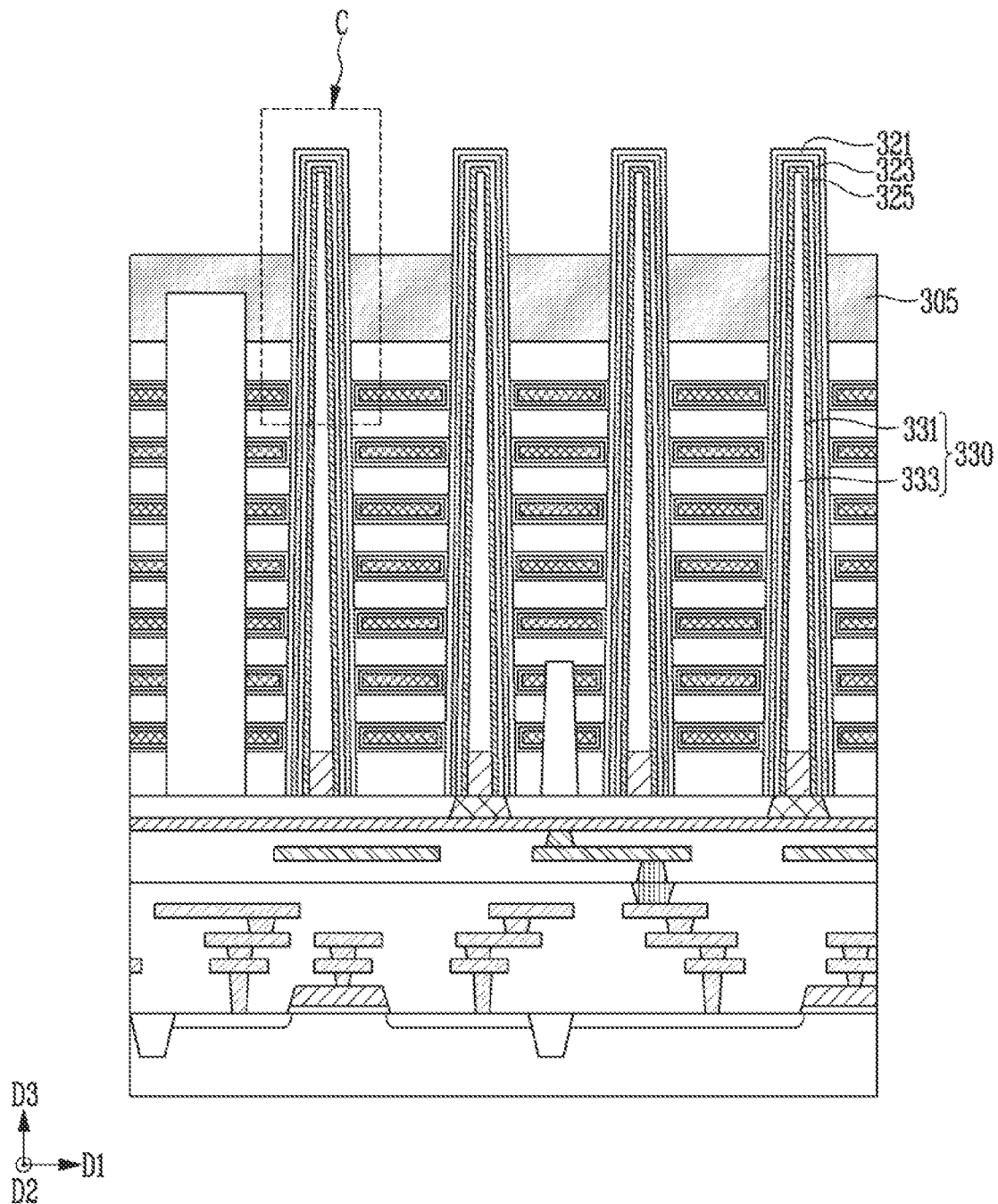

FIG. 13 is a sectional view illustrating some of processes performed after the bonding process.

Referring to FIG. 13, the first substrate 301 shown in FIG. 12 may be removed, and the first conductive layer 305 may be protected by the first protective layer 303 shown in FIG. 12. Subsequently, the first protective layer 303 shown in FIG. 12 may be selectively removed so that the first conductive layer 305 and the first blocking insulating layer 321 may be exposed.

Figure 14A:
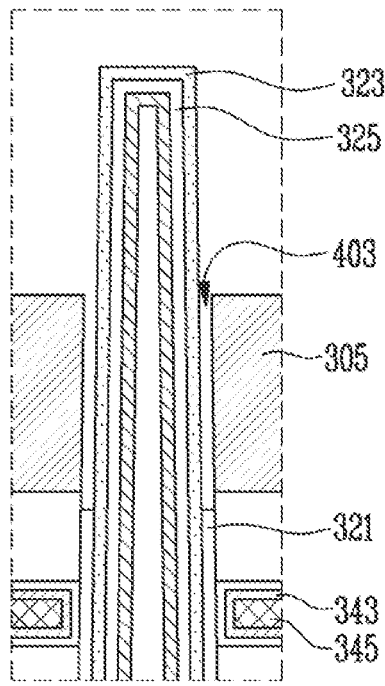
Figure 14B:
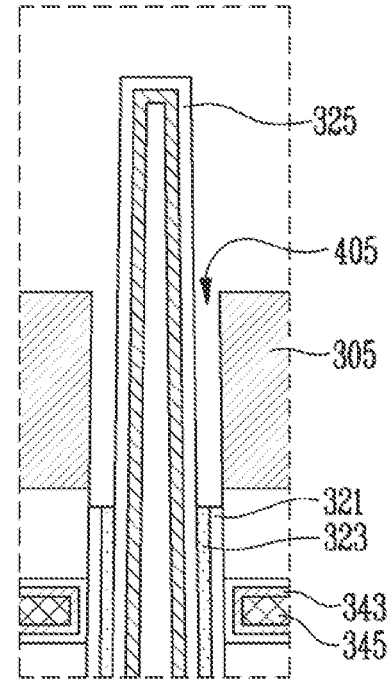

FIGS. 14A and 14B are enlarged process sectional views of region C shown in FIG. 13.

Referring to FIG. 14A, a preliminary recess region 403 may be formed between the first conductive layer 305 and the data storage layer 323 by selectively removing a portion of the first blocking insulating layer 321. The first blocking insulating layer 321 remaining may be disposed closer to the first conductive layer 305 than the conductive metal barrier layer 343 and the metal layer 345.

Referring to FIG. 14B, by selectively removing the data storage layer 323, a recess region 405 may be defined between the first conductive layer 305 and the tunnel insulating layer 325. The first blocking insulating layer 321 remaining and the data storage layer 323 remaining may be disposed closer to the first conductive layer 305 than the conductive metal barrier layer 343 and the metal layer 345.

Figure 15A:
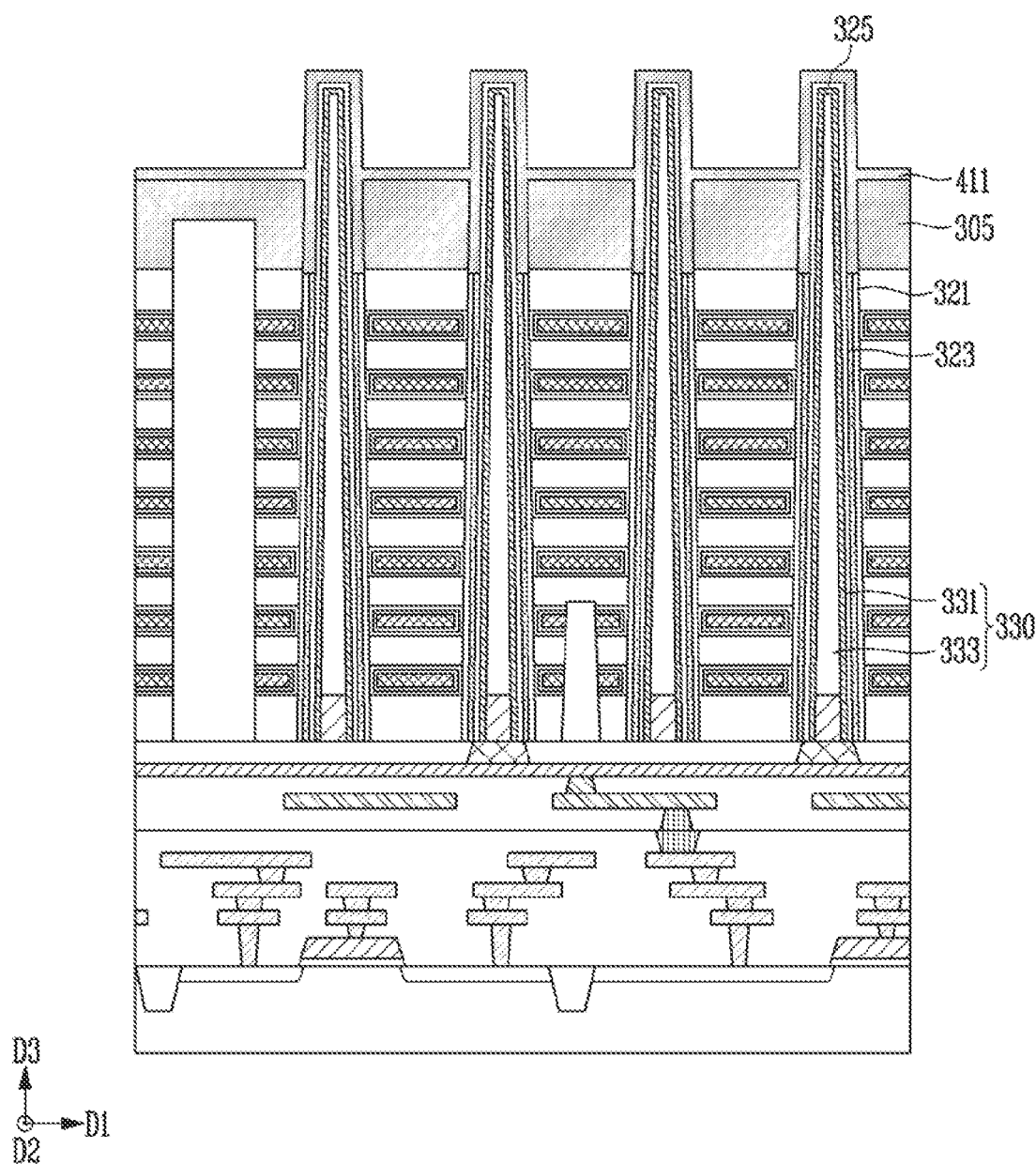
Figure 15B:
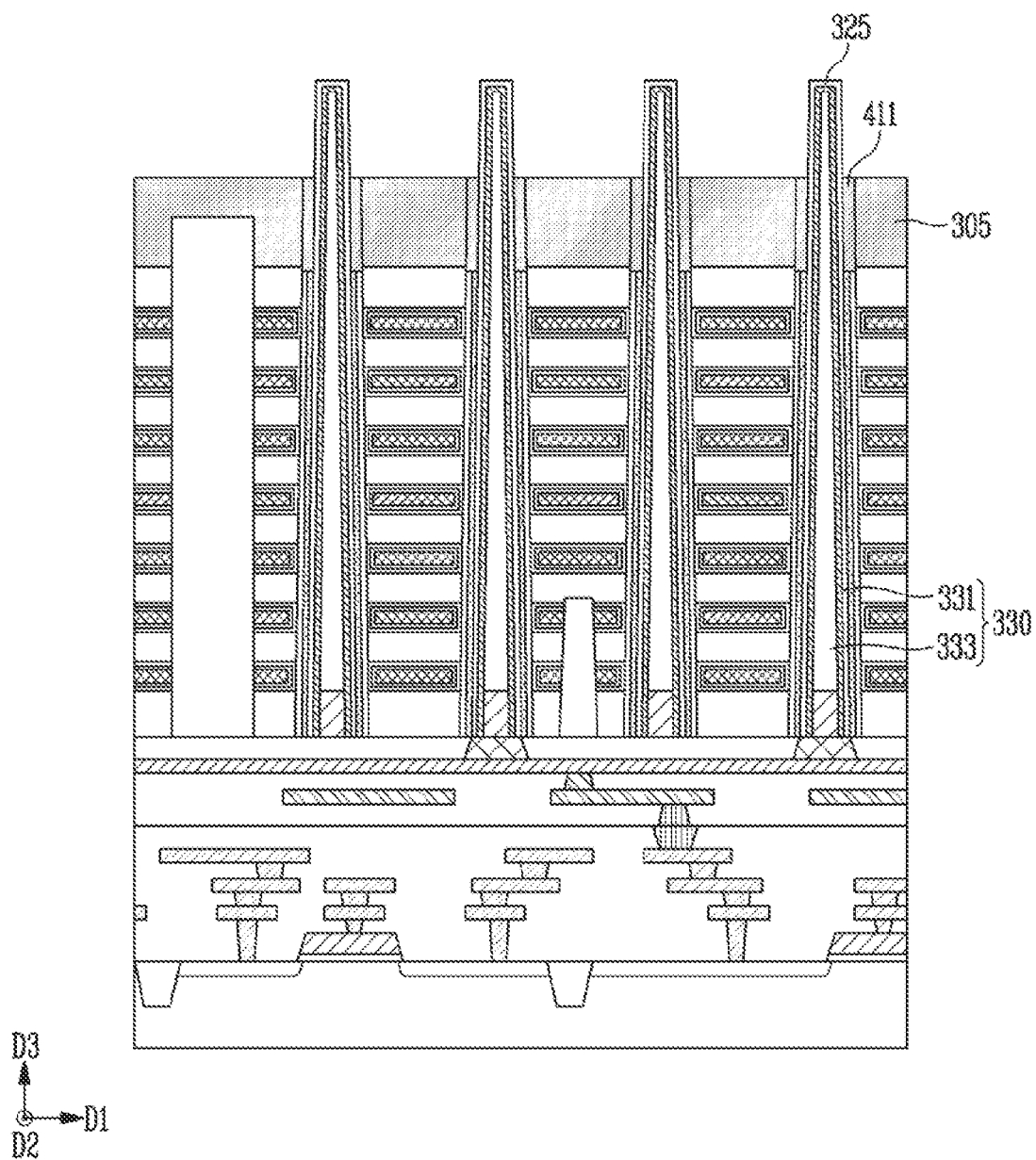

FIGS. 15A and 15B are sectional views illustrating a subsequent process continued after the recess region is formed.

Referring to FIG. 15A, a second conductive layer 411 may be formed along surfaces of the first conductive layer 305 and the tunnel insulating layer 325, and may fill the recess region 405 shown in FIG. 14B.

The second conductive layer 411 may include at least one of silicon, metal silicide, and conductive metal barrier, wherein the metal silicide may include tungsten silicide or nickel silicide and the conductive metal barrier may include titanium and titanium nitride.

Referring to FIG. 15B, a portion of the second conductive layer 411 may be removed such that the tunnel insulating layer 325 and the first conductive layer 305 are exposed. The second conductive layer 411 may remain to surround a sidewall of the tunnel insulating layer 325 in the recess region 405 shown in FIG. 14B.

Figure 16A:
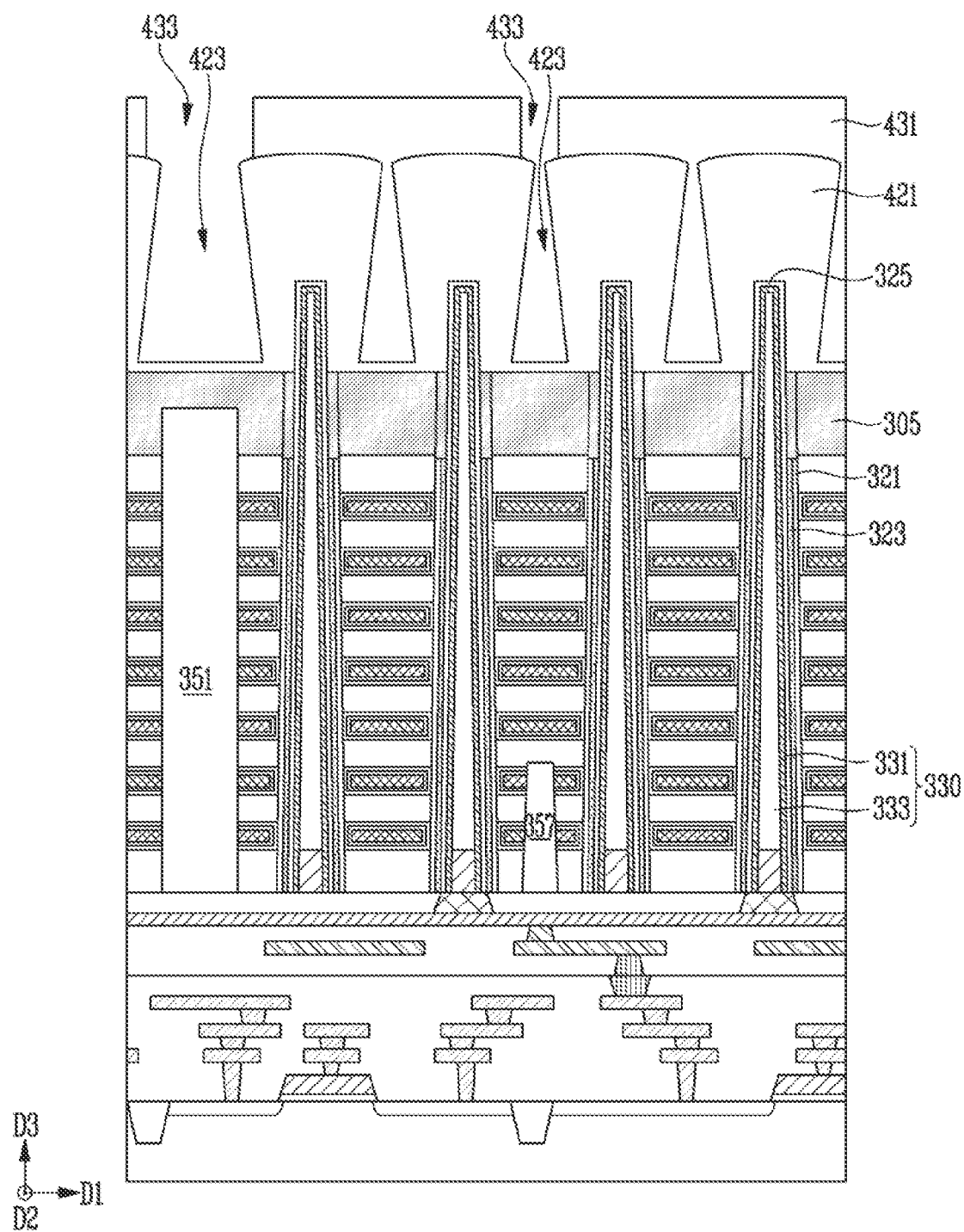
Figure 16B:
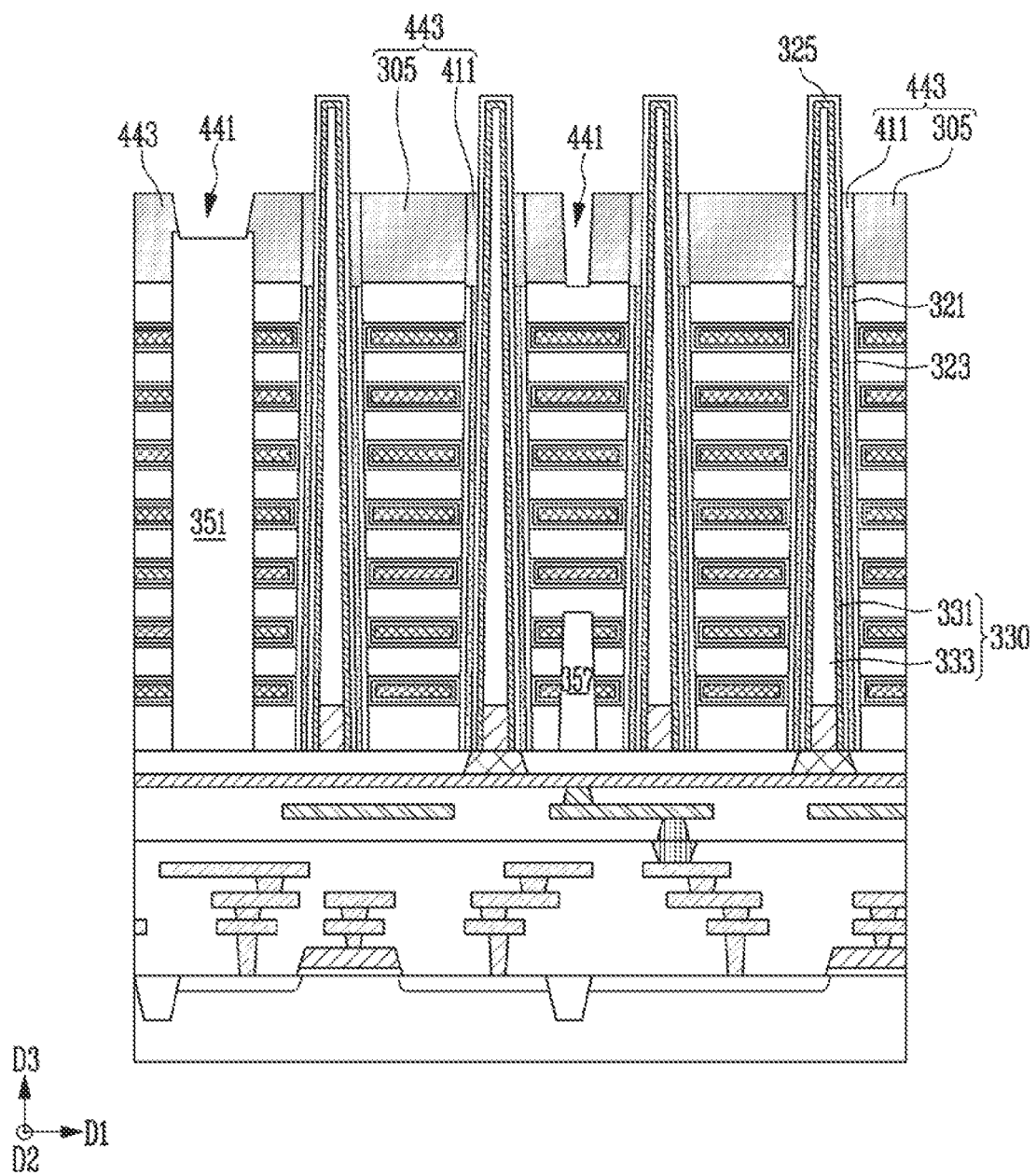

FIGS. 16A and 16B are process sectional views illustrating a process of isolating upper select lines.

Referring to FIG. 16A, an uneven structure may be defined by the channel structure 330 protruding farther in the third direction D3 than the first conductive layer 305. A second protective layer 421 may be formed along a surface of the uneven structure, and may be deposited under a condition in which step coverage is reduced. In an embodiment, the second protective layer 421 may be deposited through Physical Vapor Deposition (PVD) or Chemical Vapor Deposition (CVD), which has step coverage more reduced than that of Atomic Layer Deposition (ALD). The second protective layer 421 may include a material having an etch selectivity with respect to the first conductive layer 305. In an embodiment, the second protective layer 421 may include an amorphous carbon layer (ACL), which may be deposited through Plasma Enhanced-Chemical Vapor Deposition (PE-CVD).

The second protective layer 421 deposited under the condition in which the step coverage is reduced may be formed relatively thick on a convex part of the uneven structure as compared with a concave part of the uneven structure, may have an overhang structure, and may have sidewalls facing each other with each of first openings 423, which is interposed therebetween. A width of each of the first openings 423 may be narrowed by the second protective layer 421 as the overhang structure becomes more distant from the first conductive layer 305.

Subsequently, by using a photolithography process, a mask pattern 431 may be formed on the second protective layer 421. The mask pattern 431 may be a photoresist pattern that may include second openings 433.

The second openings 433 may respectively overlap with the gate isolation layer 351 and the drain isolation layer 357. The first openings 423 overlapping with the gate isolation layer 351 and the drain isolation layer 357 may be exposed by the second openings 433.

The first conductive layer 305 at the periphery of the channel structure 330 may be blocked by the second protective layer 421 having the overhang structure.

Referring to FIG. 16B, third trenches 441 penetrating the first conductive layer 305 may be formed by etching the first conductive layer 305 through the first openings 423 exposed by the second openings 433 shown in FIG. 16A. Upper select lines may be defined by the third trenches 441. In an embodiment, the upper select lines may be source select lines 443. Each of the source select lines 443 may include the first conductive layer 305 partitioned by the third trenches 441 and a second conductive layer 411 between the first conductive layer 305 and the tunnel insulating layer 325.

In accordance with the embodiment of the present disclosure, the second conductive layer 411 remains to surround the channel structure 330 between the tunnel insulating layer 325 and the first conductive layer 305, so that the remaining width of the source select line 443 between the tunnel insulating layer 325 and the third trench 441 may be widened. Accordingly, in the embodiment of the present disclosure, a select transistor having a gate all around (GAA) may be stably formed.

Figure 17A:
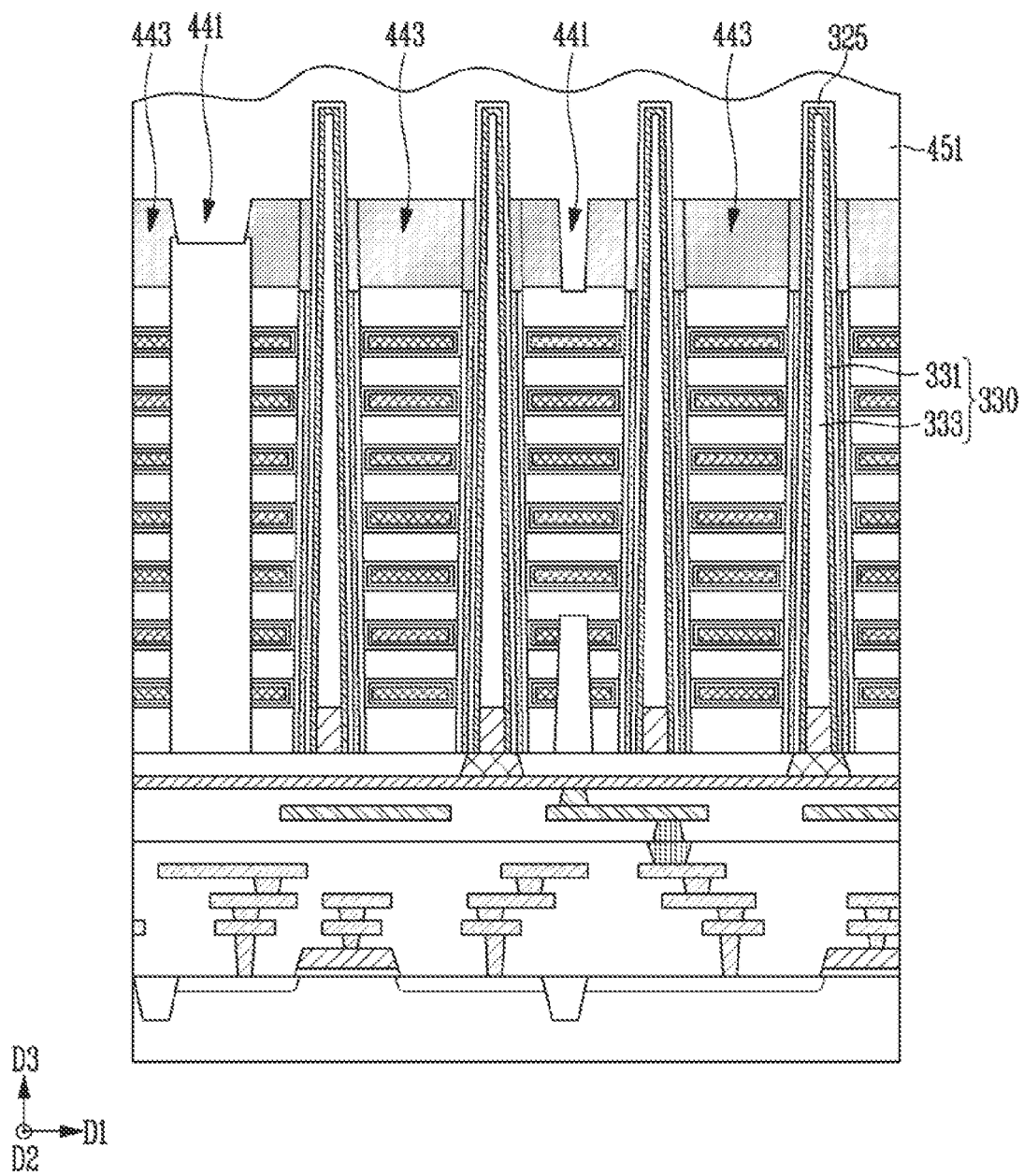
Figure 17B:
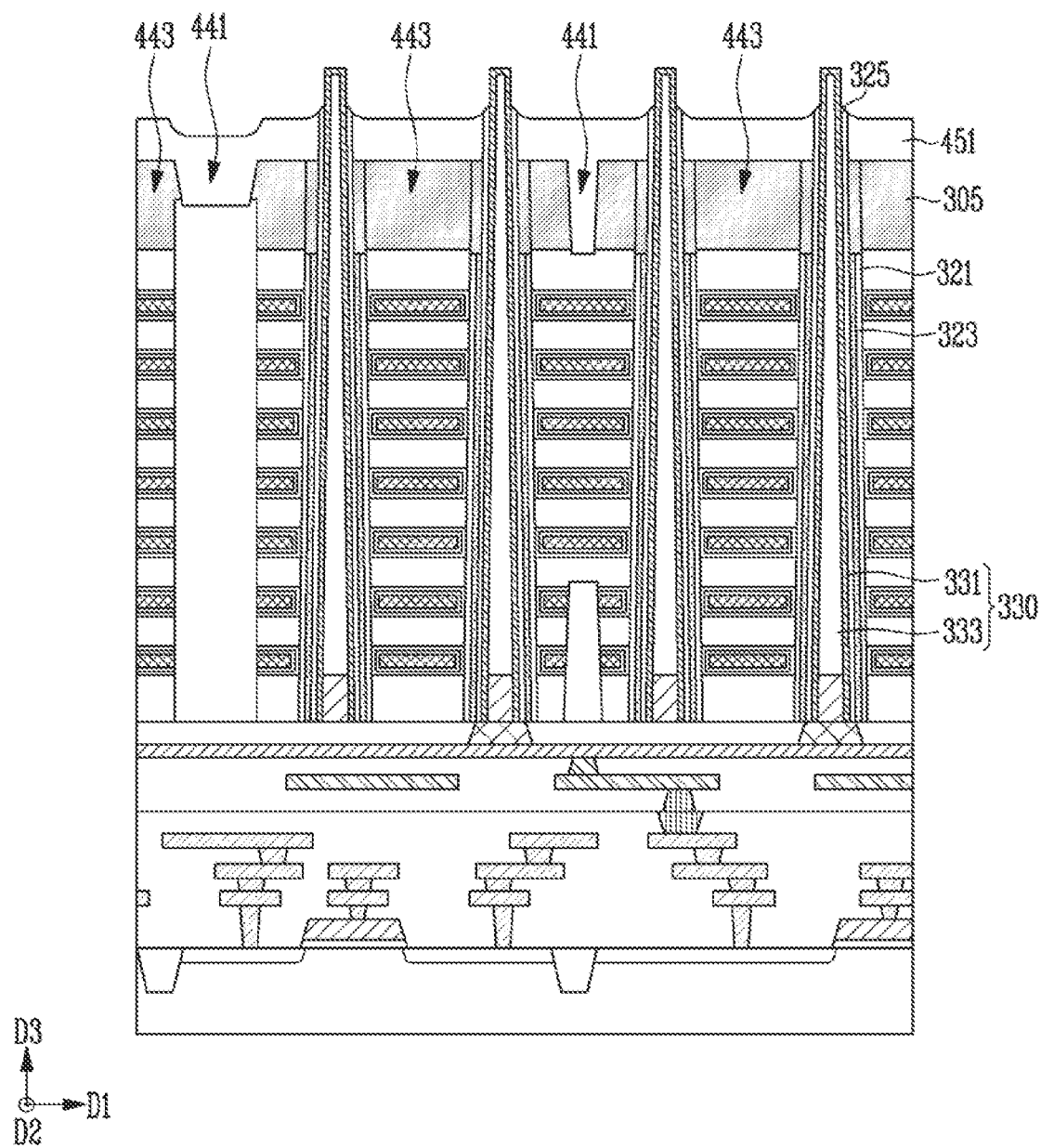
Figure 17C:
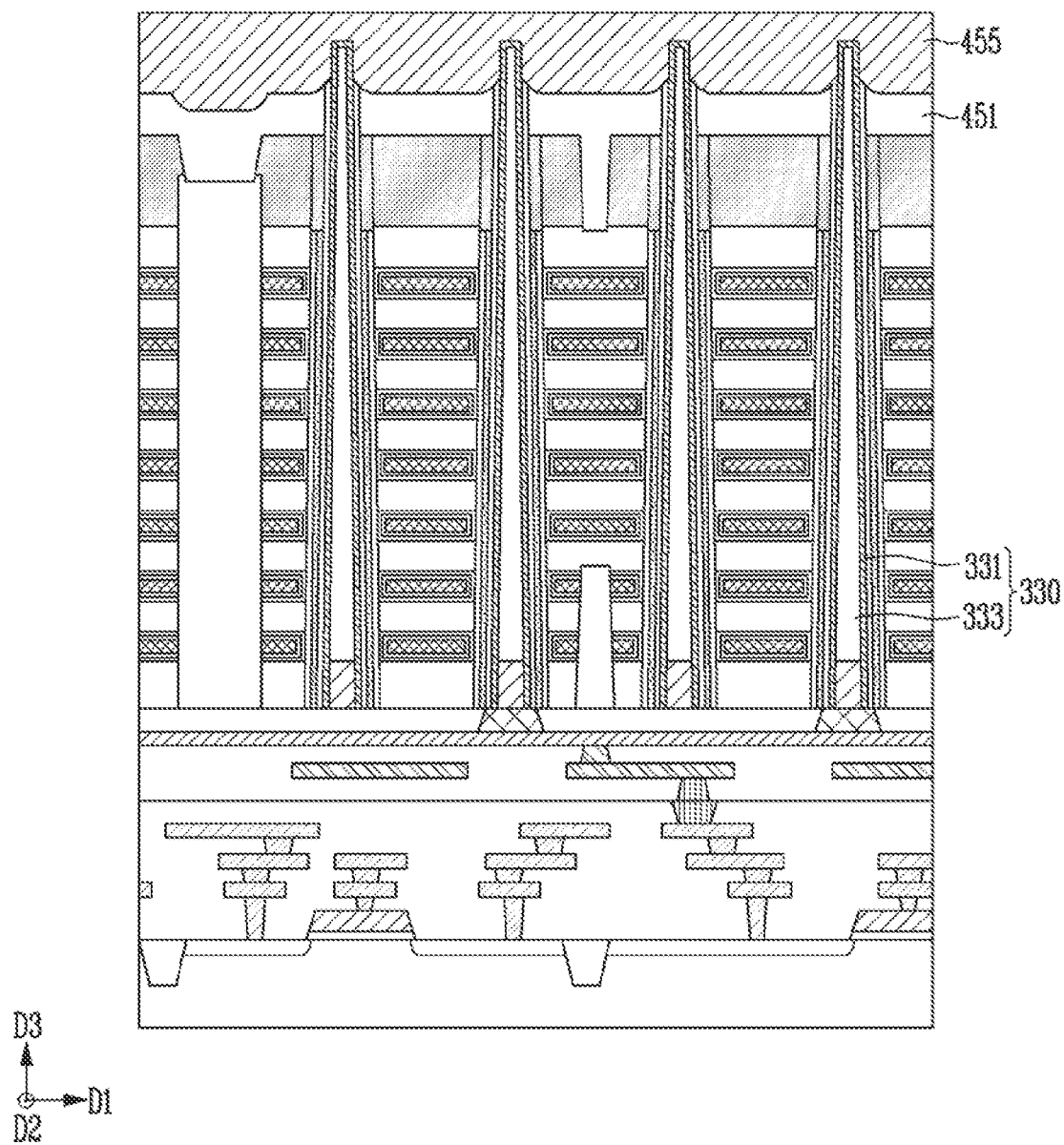

FIGS. 17A to 17C illustrate an embodiment of subsequent processes continued after the source select lines 443 are formed.

Referring to FIG. 17A, an upper insulating layer 451 may be formed to fill the third trenches 441, and to cover the source select lines 443, the channel structure 330, and the tunnel insulating layer 325, wherein the upper insulating layer 451 may include oxide.

Referring to FIG. 17B, a portion of the upper insulating layer 451 and a portion of the tunnel insulating layer 325 may be etched through an etch process such as an etch-back process so that the channel layer 331 of the channel structure 330 may be exposed.

The upper insulating layer 451 may remain in the third trenches 441, and may remain to cover the source select lines 433.

Referring to FIG. 17C, a doped semiconductor layer 455 of the common source layer may be formed on the exposed region of the channel layer 331.

FIGS. 18A, 18B, 18C, 18D, 18E, 18F, 18G, 18H, 18I, 18J, 18K, 18L, 18M, and 18N are views illustrating a manufacturing method of a semiconductor memory device in accordance with an embodiment of the present disclosure.

Figure 18A:
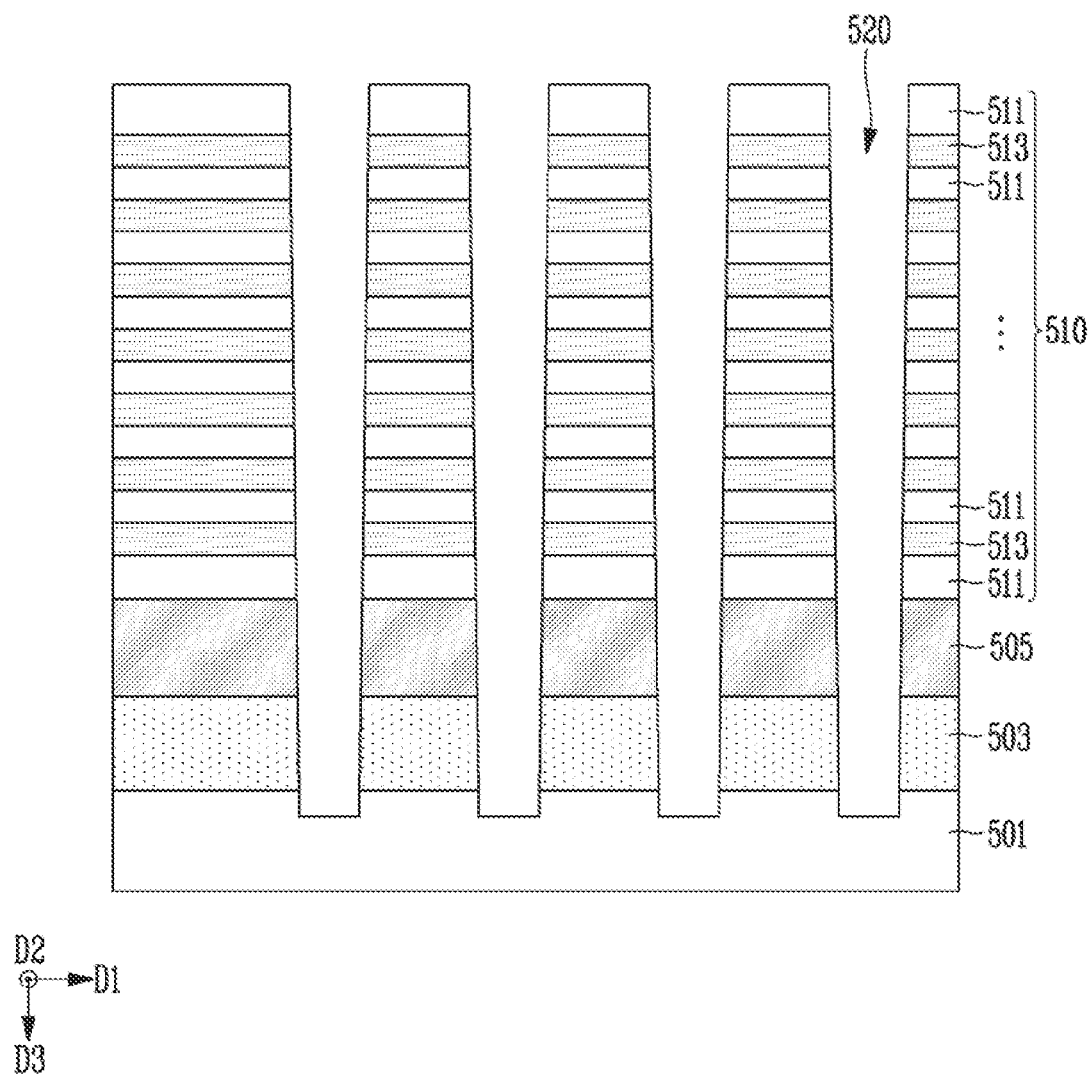
FIGS. 18A, 18B, 18C, 18D, 18E, 18F, 18G, 18H, 18I, 18J, 18K, 18L, 18M, and 18N are views illustrating a manufacturing method of a semiconductor memory device in accordance with an embodiment of the present disclosure.

Referring to FIG. 18A, as described with reference to FIG. 10A, a first protective layer 503 and a first conductive layer 505 may be formed on a substrate 501. Subsequently, as described with reference to FIG. 10A, first material layers 511 and second material layers 513 may be alternately stacked on the first conductive layer 505, to form a stack structure 510.

Subsequently, a hole 520 may be formed, which penetrates the first material layers 511, the second material layers 513, the first conductive layer 505, and the first protective layer 503, and extends to the inside of the first substrate 501.

Figure 18B:
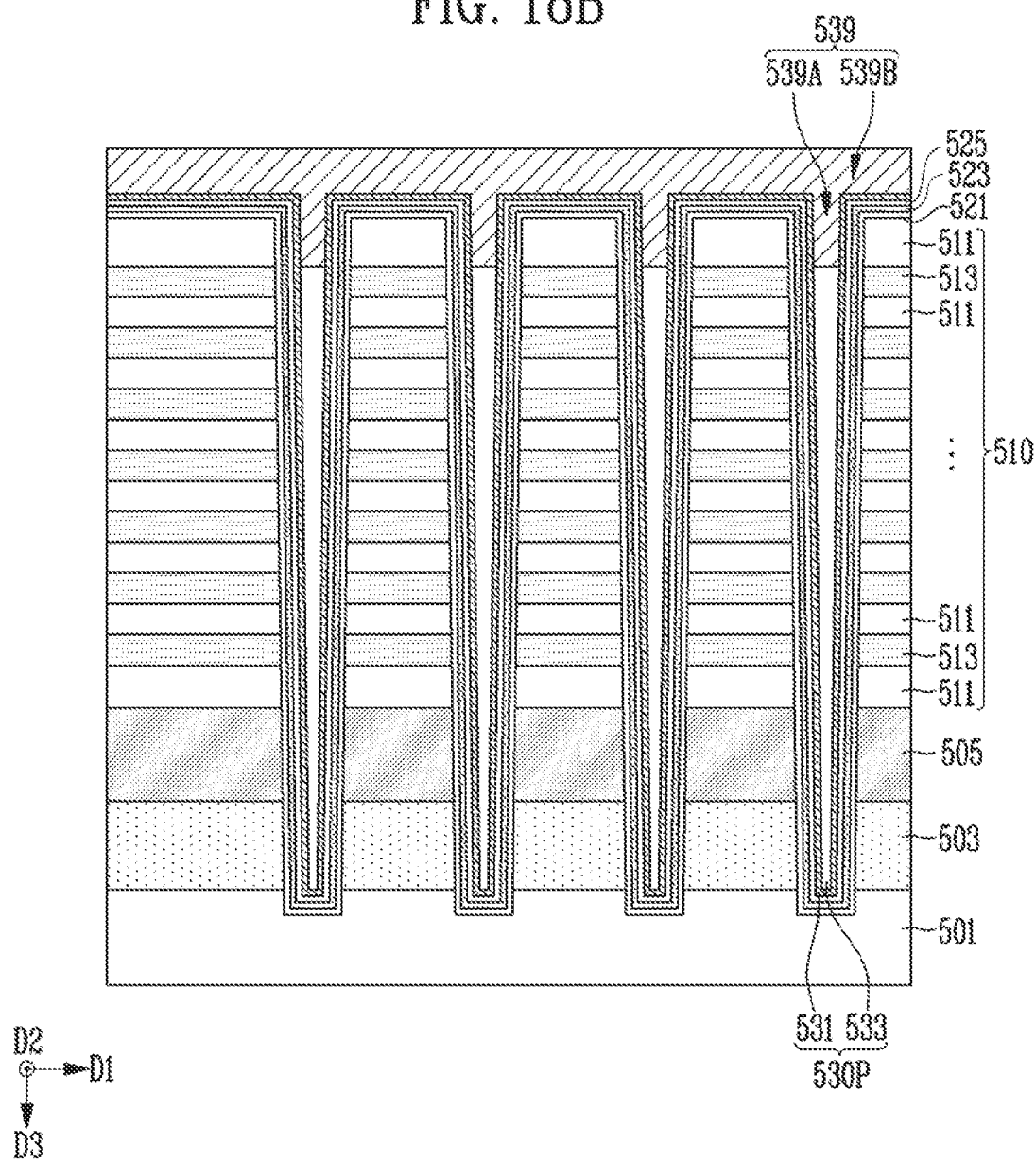

Referring to FIG. 18B, a first blocking insulating layer 521, a data storage layer 523, and a tunnel insulating layer 525 may be sequentially stacked on a surface of the hole 520 shown in FIG. 18A, wherein each of the first blocking insulating layer 521, the data storage layer 523, and the tunnel insulating layer 525 may not only extend along a sidewall and a bottom surface of the hole 520 but also may extend along a top surface of the stack structure 510.

The data storage layer 523 may be made of a material which enables storage of data and has an etch selectivity with respect to the first blocking insulating layer 521 and the tunnel insulating layer 525, which may be made of materials described with reference to FIG. 10A.

Subsequently, a central region of the hole 520 shown in FIG. 18A may be filled with a preliminary channel structure 530P, which may include a channel layer 531 and a core insulating layer 533. The channel layer 531 may be formed as a semiconductor layer, and may extend along a surface of the tunnel insulating layer 525. In an embodiment, the channel layer 531 may include silicon. The core insulating layer 533 may be disposed on the channel layer 531, and may fill the central region of the hole 520 as shown in FIG. 18A. The core insulating layer 533 may be formed to a height with which an upper end of the hole 520 shown in FIG. 18A is opened.

After the core insulating layer 533 is formed, the upper end of the hole, which is opened by the core insulating layer 533, may be filled with a doped semiconductor layer 539. The doped semiconductor layer 539 may include a vertical part 539A filling the upper end of the hole and a horizontal part 539B extending in parallel to the top surface of the stack structure 510 from the vertical part 539A.

Figure 18C:
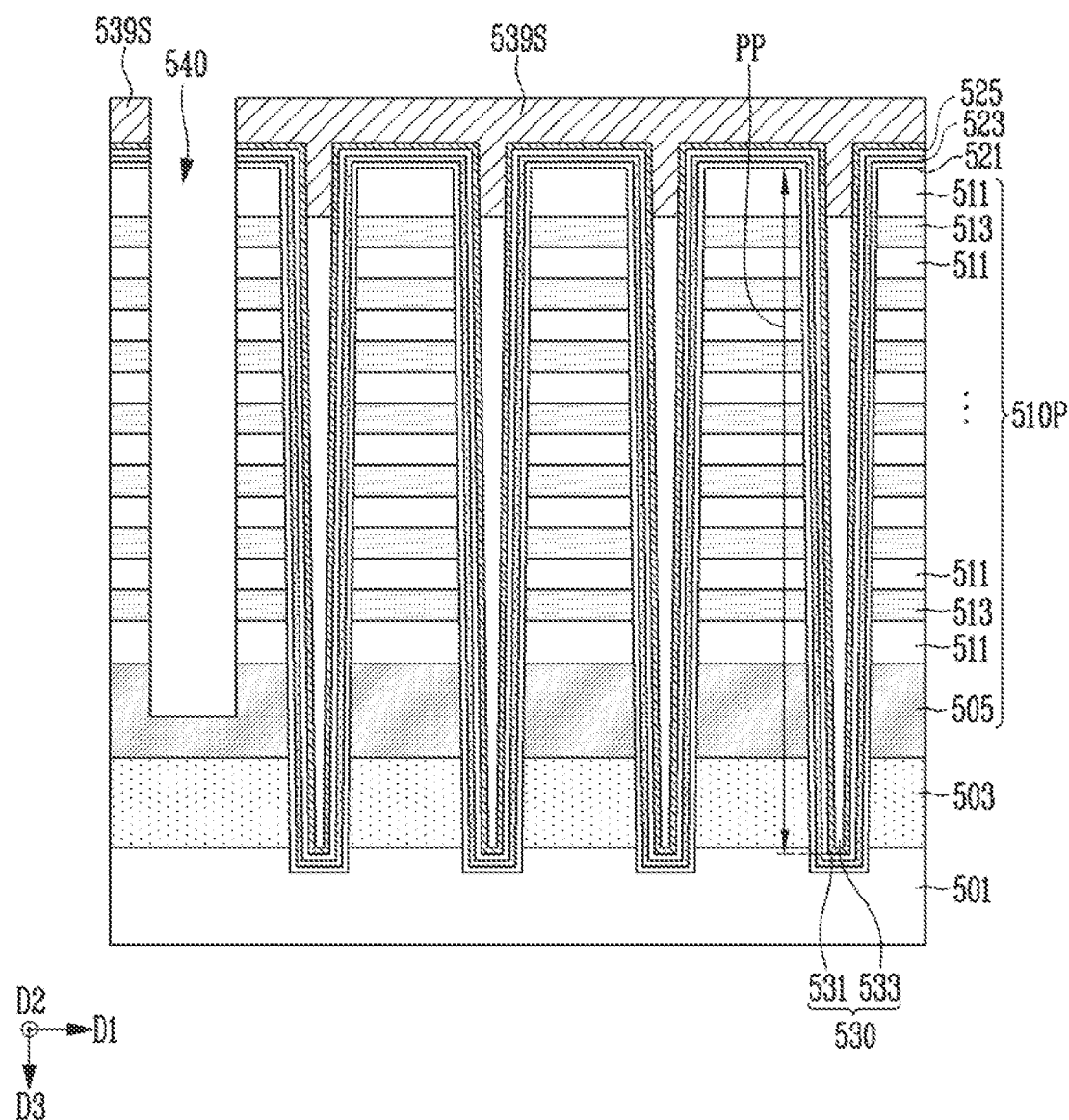

Referring to FIG. 18C, a first trench 540 may be formed, wherein the first trench 540 may penetrate the doped semiconductor layer 539, the channel layer 531, the tunnel insulating layer 525, the data storage layer 523, the first blocking insulating layer 521, the first material layers 511, and the second material layers 513, which are shown in FIG. 18B. Accordingly, a preliminary gate stack structure 510P and a channel structure 530 may be defined.

The channel structure 530 may include a pillar part PP penetrating the preliminary gate stack structure 510P, wherein the pillar part PP of the channel structure 530 may include a core insulating layer 533 and a channel layer 531, which penetrate the preliminary gate stack structure 510P.

The doped semiconductor layer 539 shown in FIG. 18B may be isolated into common source layers 539S by the first trench 540.

Figure 18D:
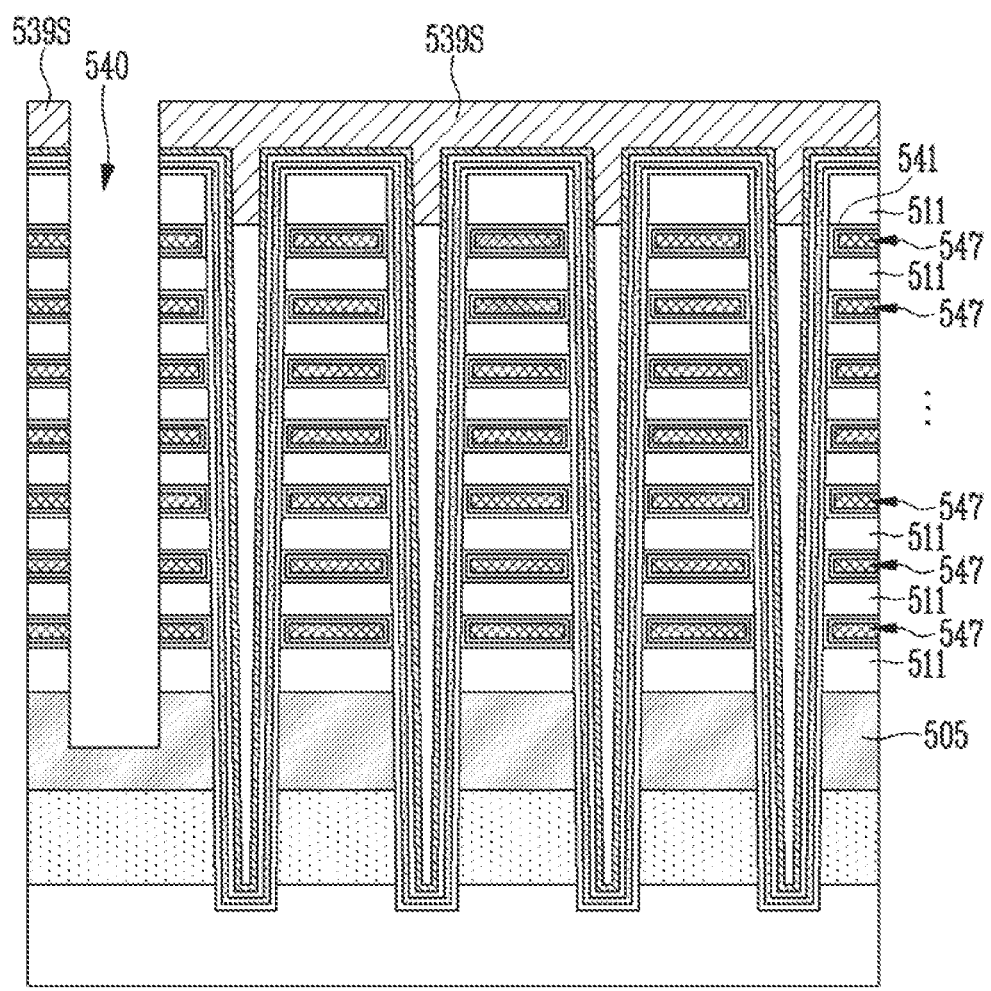
Figure 18D:
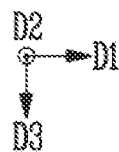

Referring to FIG. 18D, as described with reference to FIG. 10B, the second material layers 513 may be replaced with conductive patterns 547, wherein at least one of the conductive patterns 547, which is adjacent to the common source layers 539S, may be used as a source select line, and the others may be used as word lines. As described with reference to FIG. 10B, before the conductive patterns 547 are formed, a second blocking insulating layer 541 may be formed.

Figure 18E:
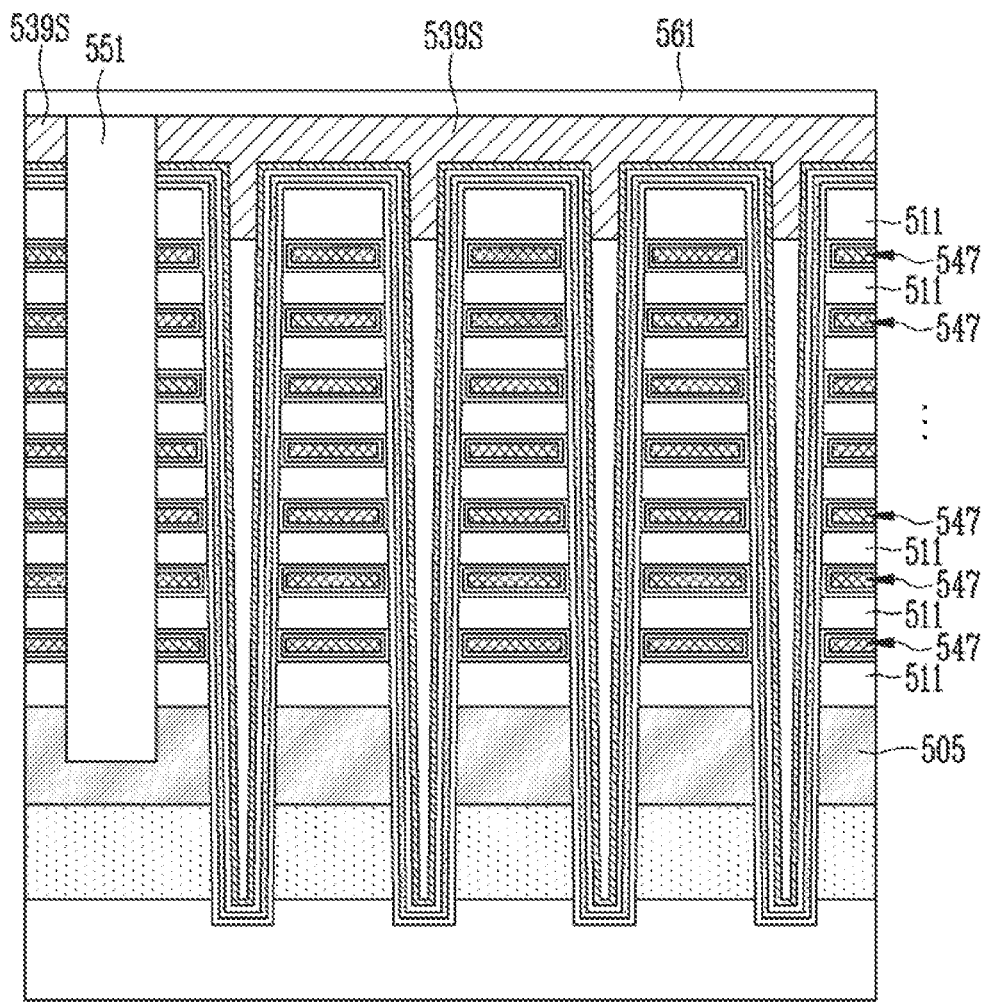
Figure 18E:
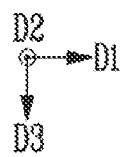

Referring to FIG. 18E, the first trench 540 shown in FIG. 18D may be filled with a gate isolation layer 551. The gate isolation layer 551 may be formed of an insulating material.

Subsequently, a bonding structure may be formed which may cover the gate isolation layer 551 and the common source layers 539S. The bonding structure may be configured with the first insulating structure 561.

Figure 18F:
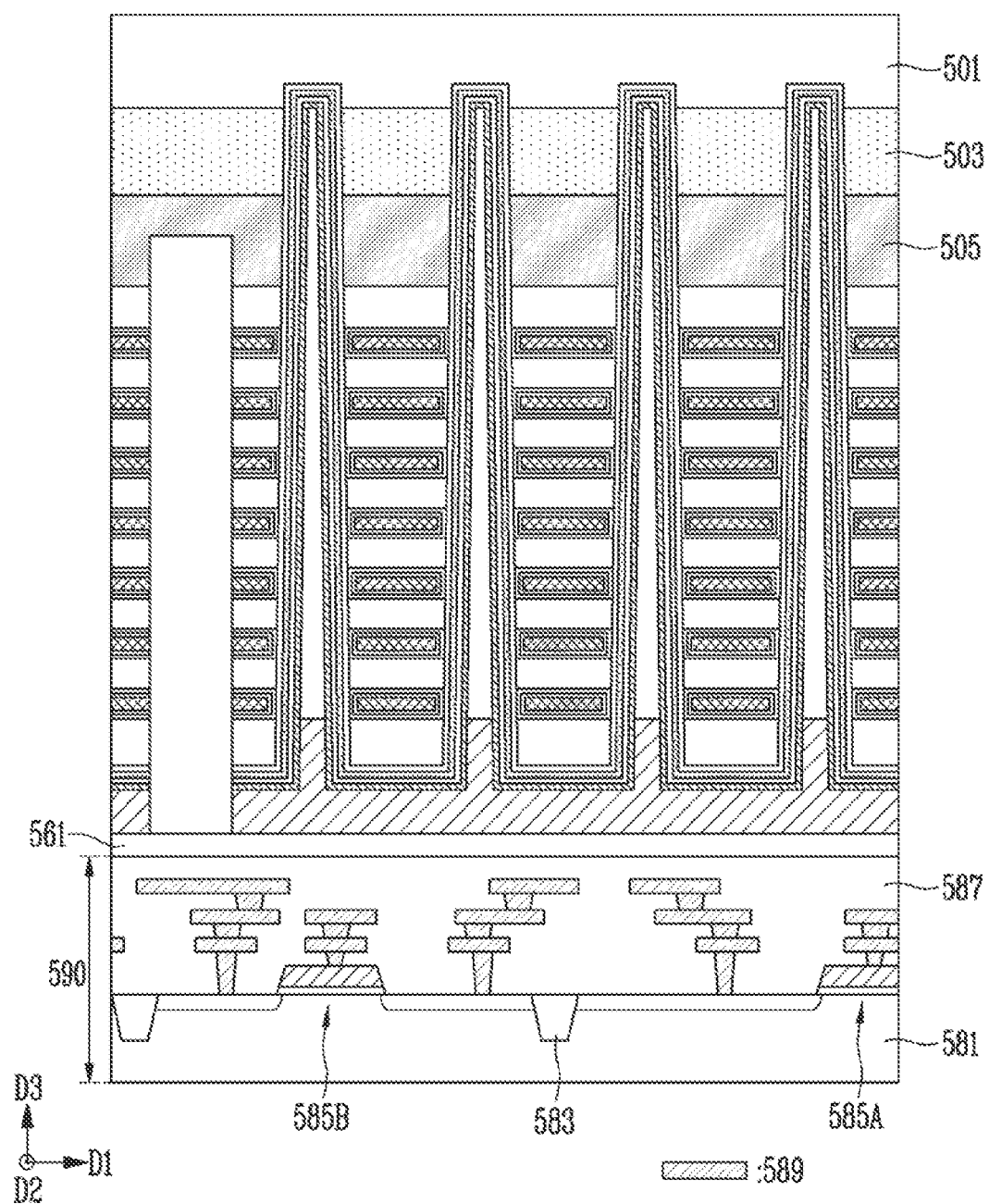

Referring to FIG. 18F, a peripheral circuit structure 590 may be provided which may include transistors 585A and 585B, an interconnection structure 589 connected to the transistors 585A and 585B, and a second insulating structure 587. The transistors 585A and 585B may be formed in active regions of a second substrate 581, which are partitioned by isolation layers 583. The transistors 585A and 585B and the interconnection structure 589 may be buried in the second insulating structure 587, which may include two or more insulating layers.

Subsequently, the peripheral circuit structure 590 may be aligned such that the peripheral circuit structure 590 faces the first insulating structure 561. Subsequently, the second insulating structure 587 of the peripheral circuit structure 590 may be bonded to the first insulating structure 561.

Figure 18G:
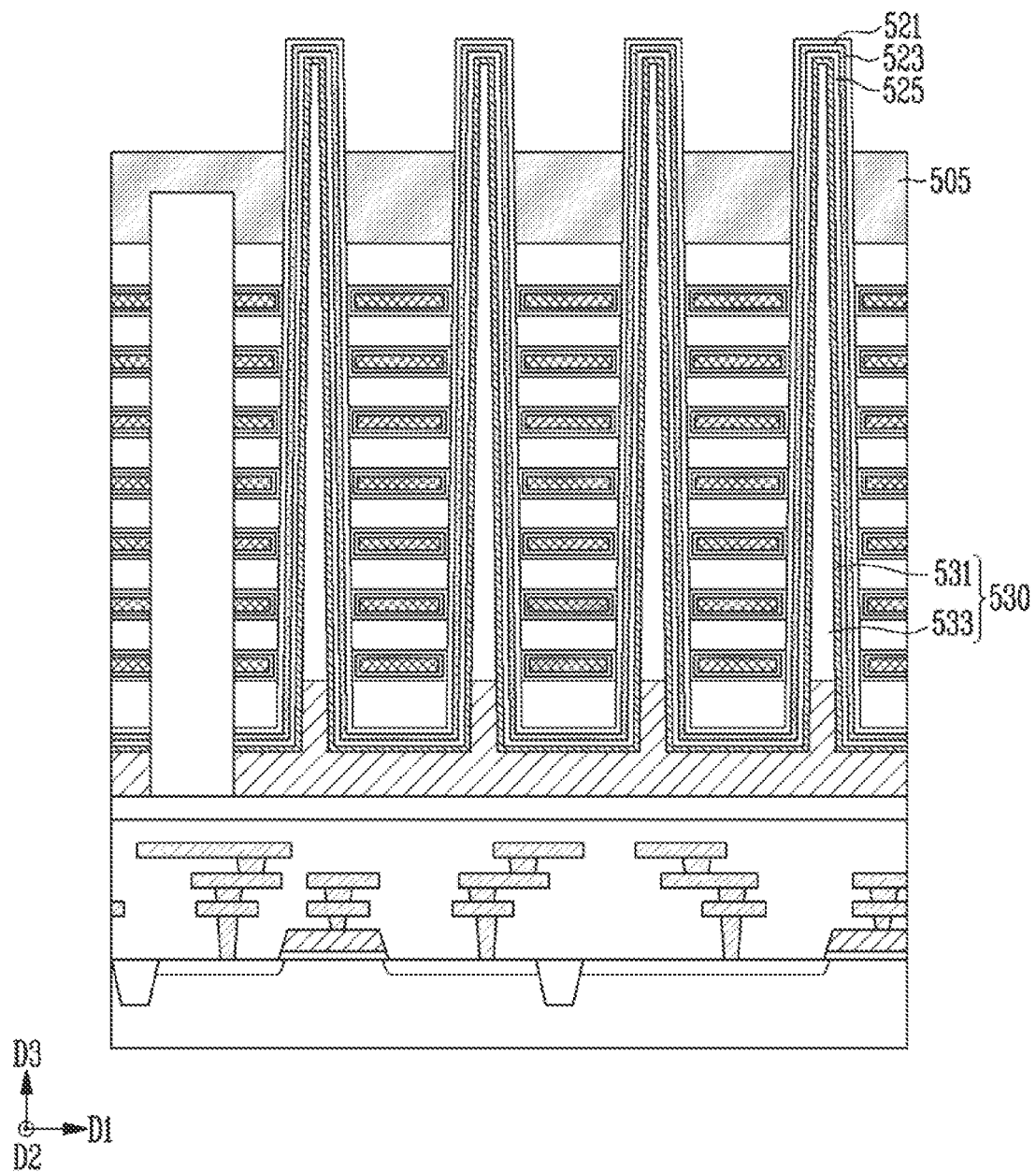

Referring to FIG. 18G, the first substrate 501 and the first protective layer 503, which are shown in FIG. 18F, may be sequentially removed so that the first conductive layer 505 and the first blocking insulating layer 521 may be exposed.

Figure 18H:
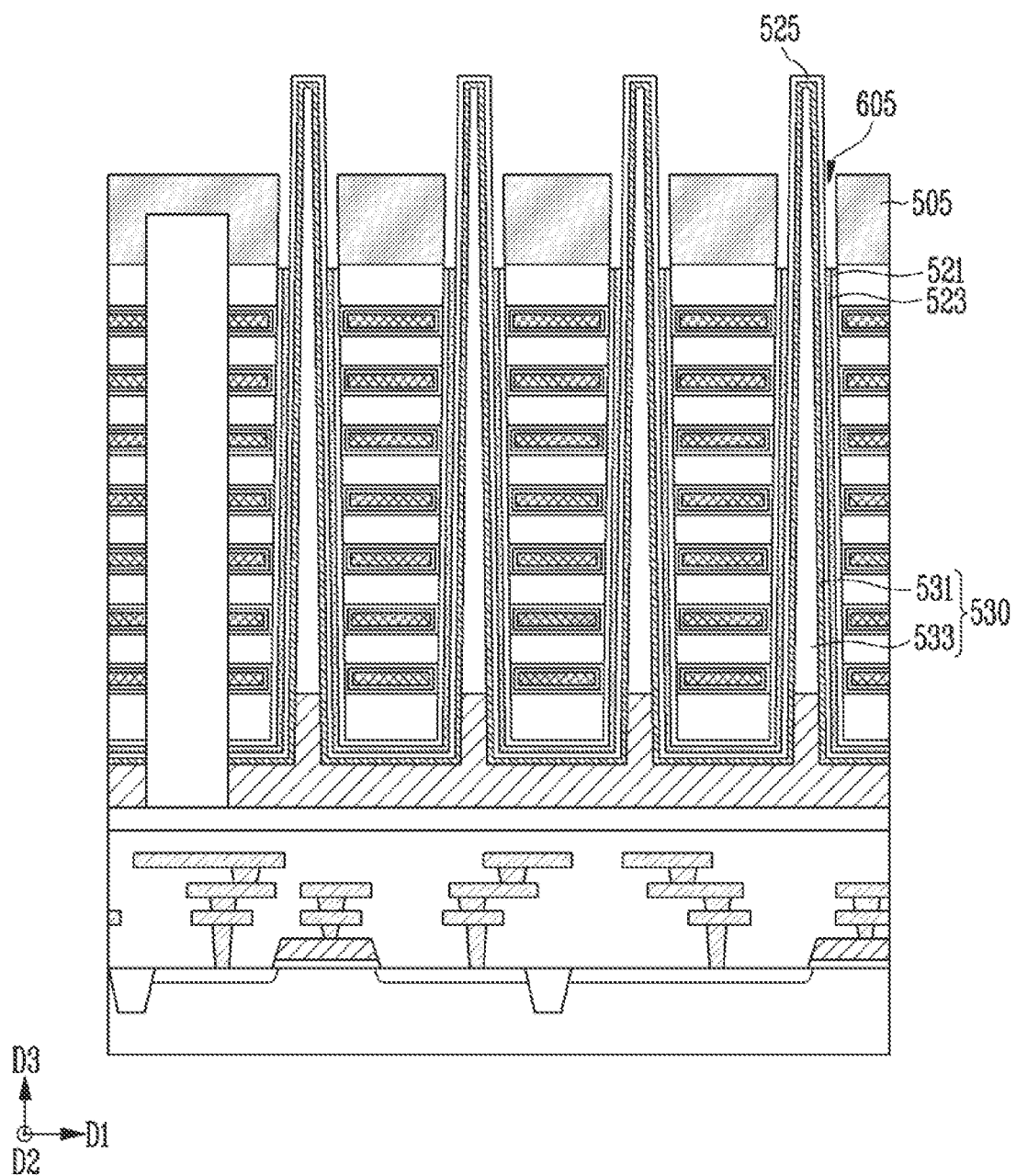

Referring to FIG. 18H, a portion of the first blocking insulating layer 521 and a portion of the data storage layer 523 may be removed by using the processes described with reference to FIGS. 14A and 14B. Accordingly, a recess region 605 may be defined between the first conductive layer 505 and the tunnel insulating layer 525.

Figure 18I:
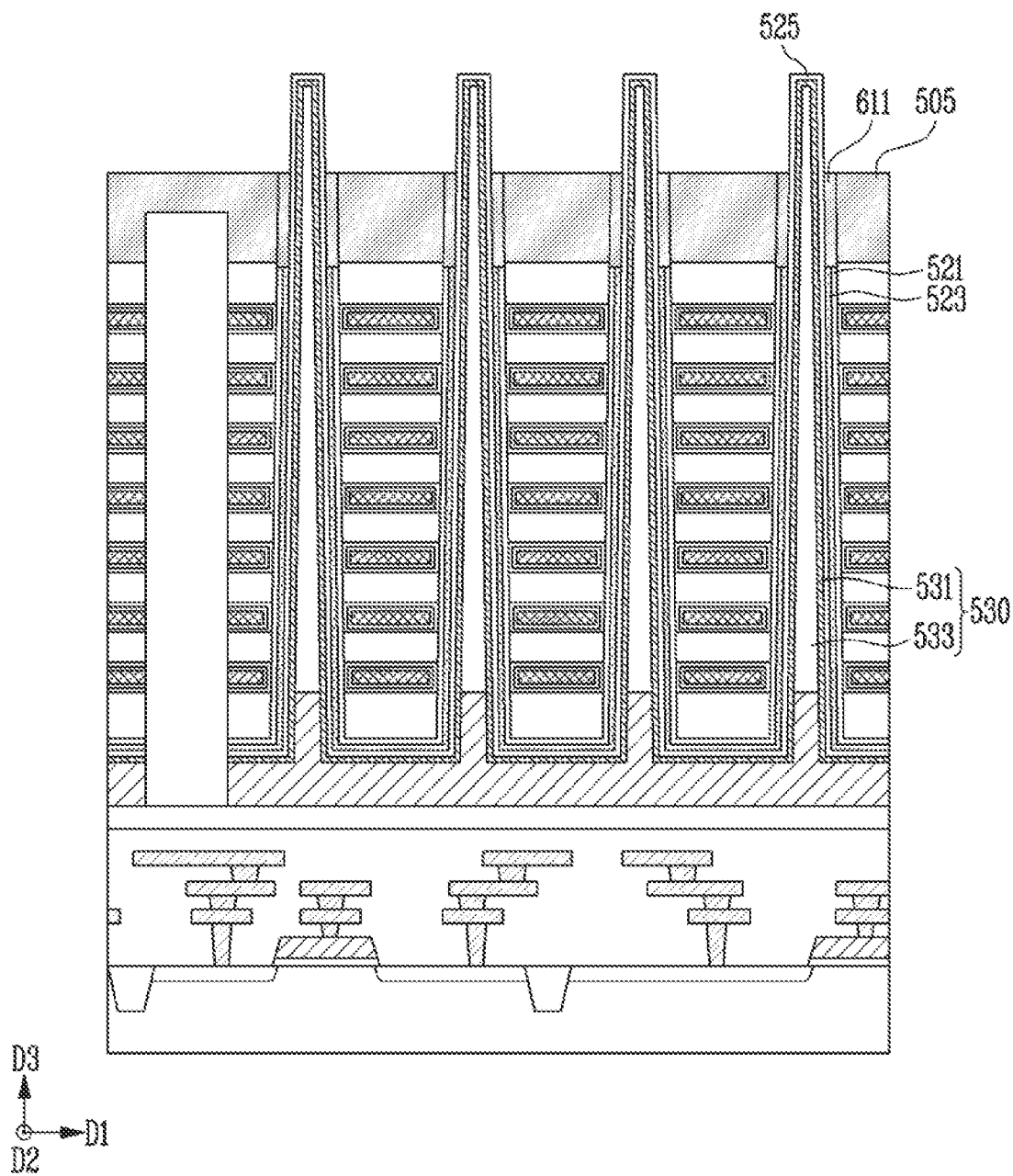

Referring to FIG. 18I, a second conductive layer 611 filling the recess region 605 shown in FIG. 18H may be formed by using the processes described with reference to FIGS. 15A and 15B to surround a sidewall of the tunnel insulating layer 625 between the first conductive layer 505 and the tunnel insulating layer 525.

Figure 18J:
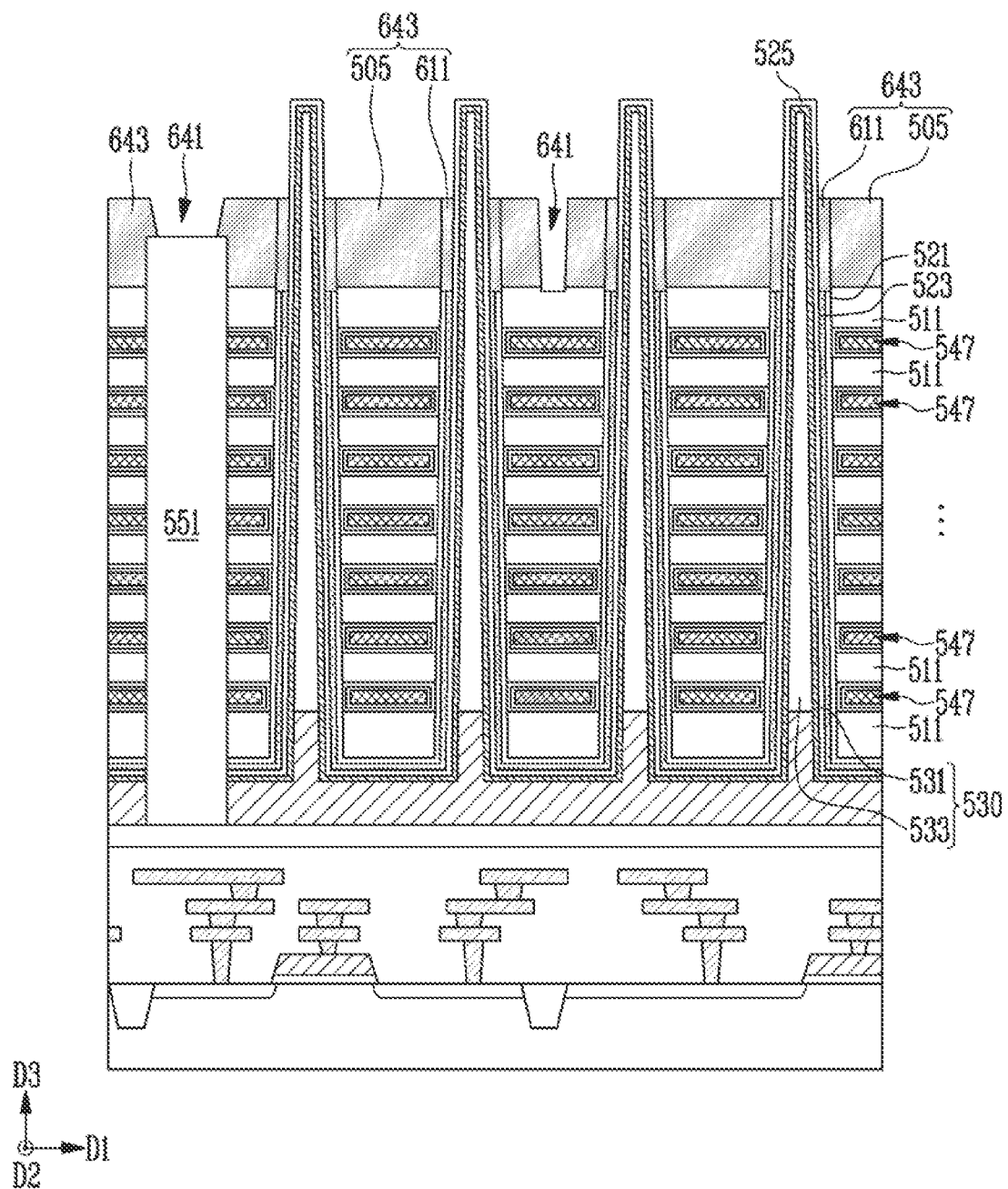

Referring to FIG. 18J, second trenches 641 penetrating the first conductive layer 505 may be formed by using the process of isolating the upper select lines, which is described with reference to FIGS. 16A and 16B. The upper select lines may be defined by the second trenches 641. In an embodiment, the upper select lines may be drain select lines 643. Each of the drain select lines 643 may include the first conductive layer 505 partitioned by the second trenches 641 and a second conductive layer 611 between the first conductive layer 505 and the tunnel insulating layer 525.

In accordance with the embodiment of the present disclosure, the second conductive layer 611 remains to surround the channel structure 530 between the tunnel insulating layer 525 and the first conductive layer 505, so that a select transistor having a gate all around (GAA) structure may be stably formed.

Figure 18K:
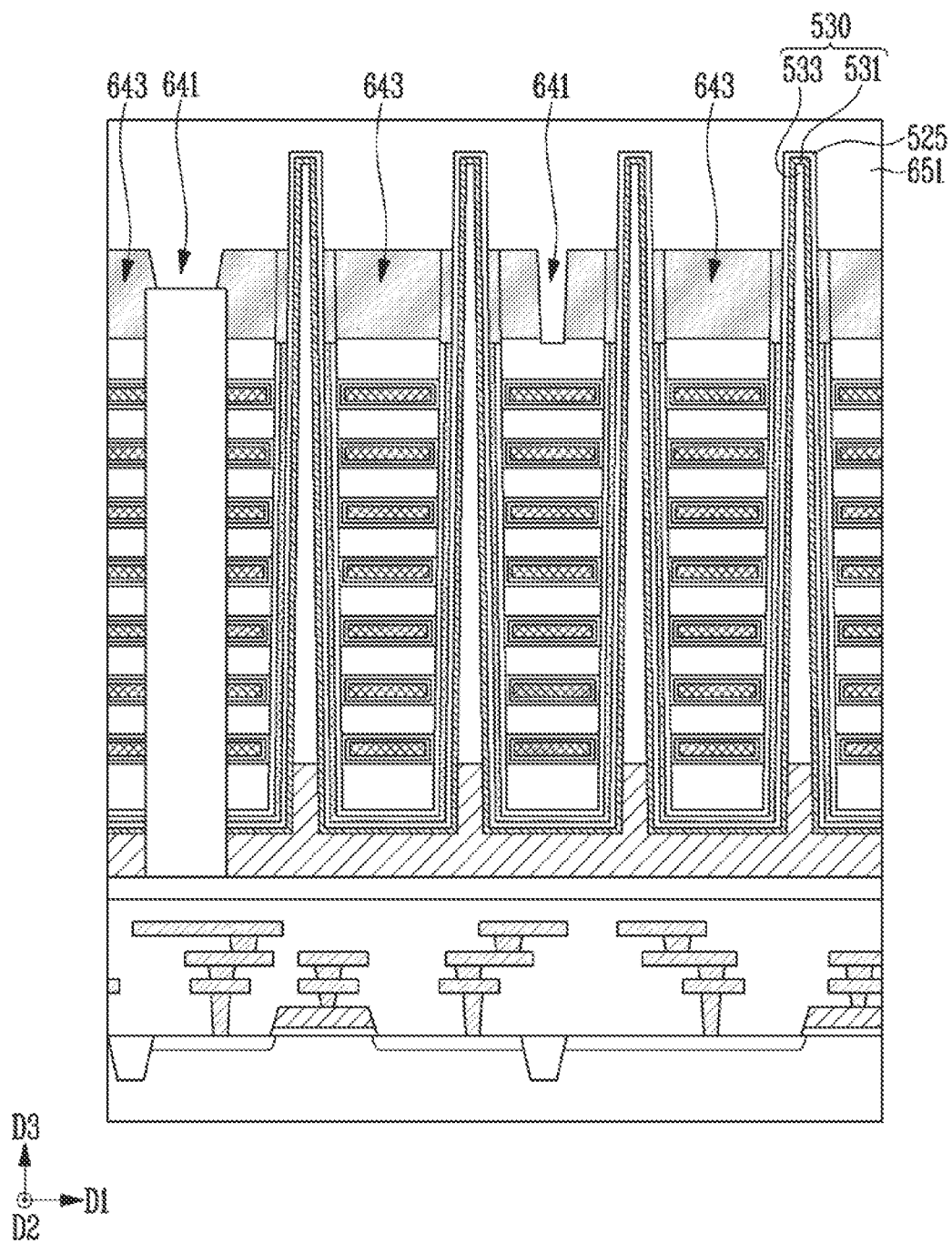

Referring to FIG. 18K, a first upper insulating layer 651 may be formed to fill the second trenches 641, and may be formed to cover the drain select lines 643, the channel structure 530, and the tunnel insulating layer 525. The first upper insulating layer 651 may include oxide. A surface of the first upper insulating layer 651 may be planarized through a process such as Chemical Mechanical Polishing (CMP).

Figure 18L:
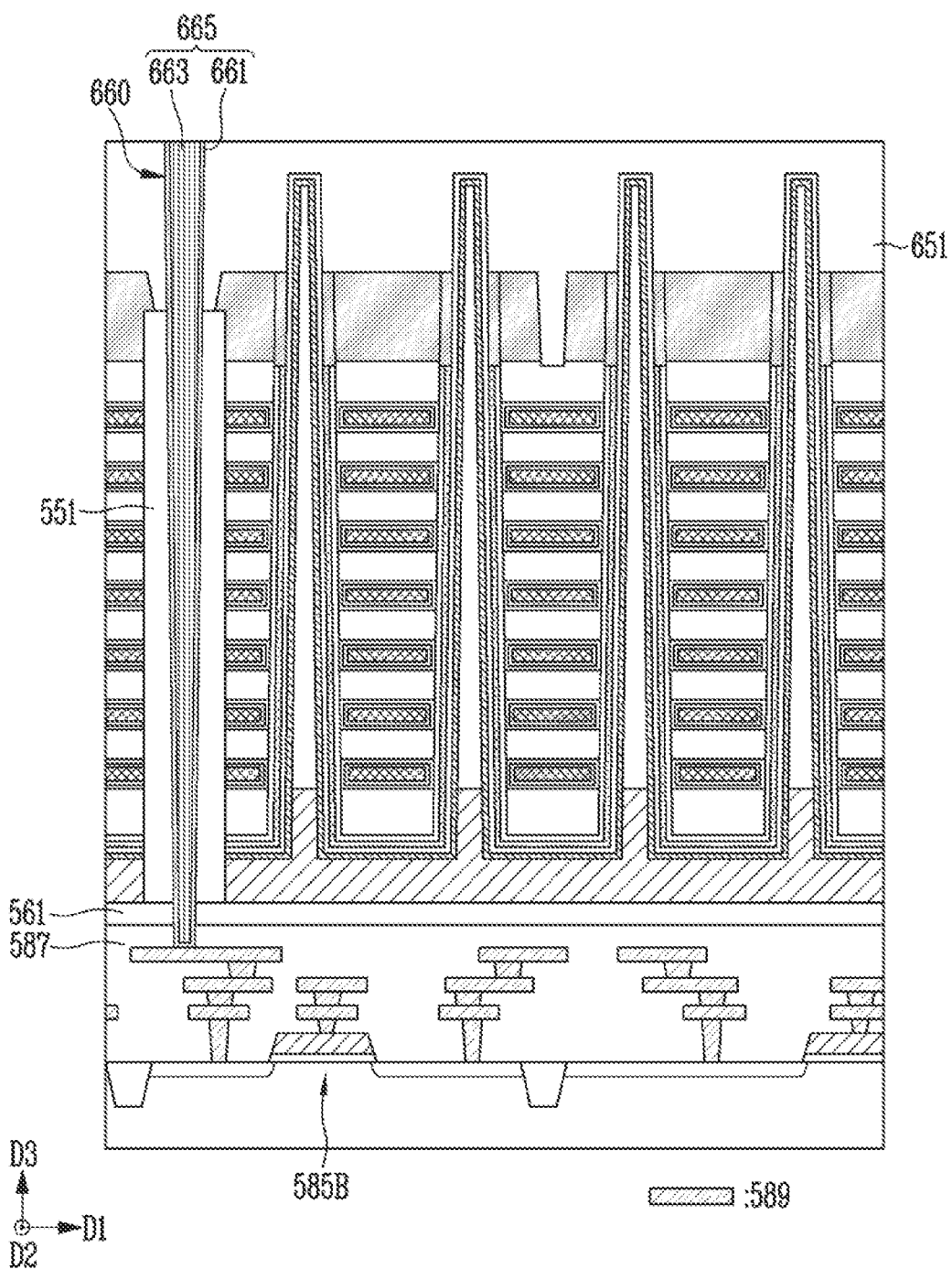

Referring to FIG. 18L, a first contact hole 660 may be formed to penetrate a portion of the first upper insulating layer 651 overlapping with the gate isolation layer 551, the gate isolation layer 551, the first insulating structure 561, and the second insulating structure 587. The first contact hole 660 may be formed to expose the conductive pattern of the interconnection structure 589 and may expose the conductive pattern of the interconnection structure 589, connected to the transistor (e.g., 585B) of the page buffer circuit.

Subsequently, a first via contact structure 665 may be formed, may fill the first contact hole 660, and may include a conductive metal barrier layer 661 extending along a surface of the first contact hole 660 and a metal layer 663 filling a central region of the first contact hole 660, which is opened by the conductive metal barrier layer 661.

Figure 18M:
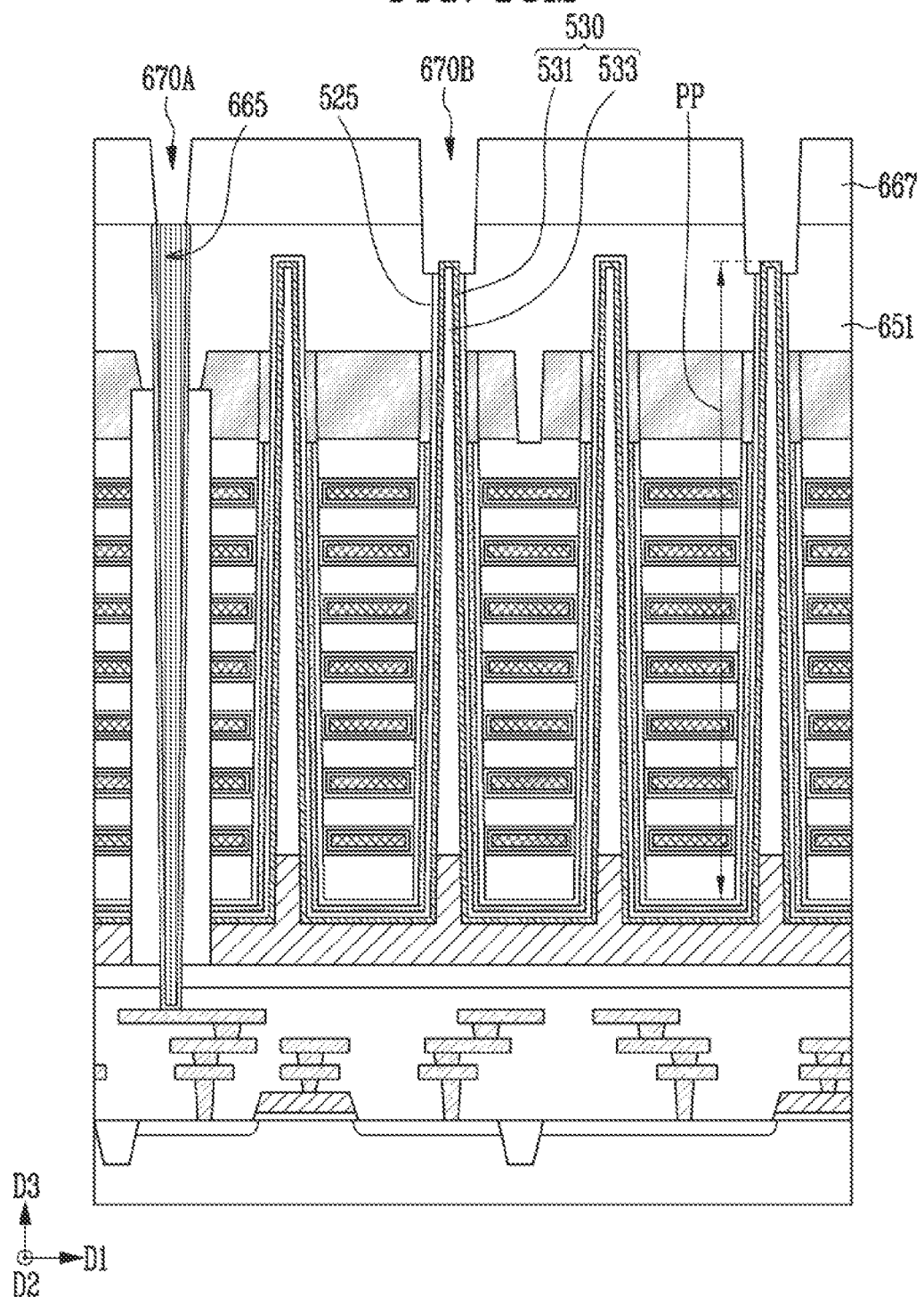

Referring to FIG. 18M, a second upper insulating layer 667 may be formed on the first upper insulating layer 651, and may extend to cover the first via contact structure 665.

Subsequently, contact holes 670A and 670B may be formed, may penetrate at least one of the first upper insulating layer 651 and the second upper insulating layer 667, and may include a second contact hole 670A and a third contact hole 670B.

The second contact hole 670A may penetrate the second upper insulating layer 667, to expose the first via contact structure 665. The third contact hole 670B may penetrate the tunnel insulating layer 525 in addition to the first upper insulating layer 651 and the second upper insulating layer 667, to expose the channel layer 531.

Figure 18N:
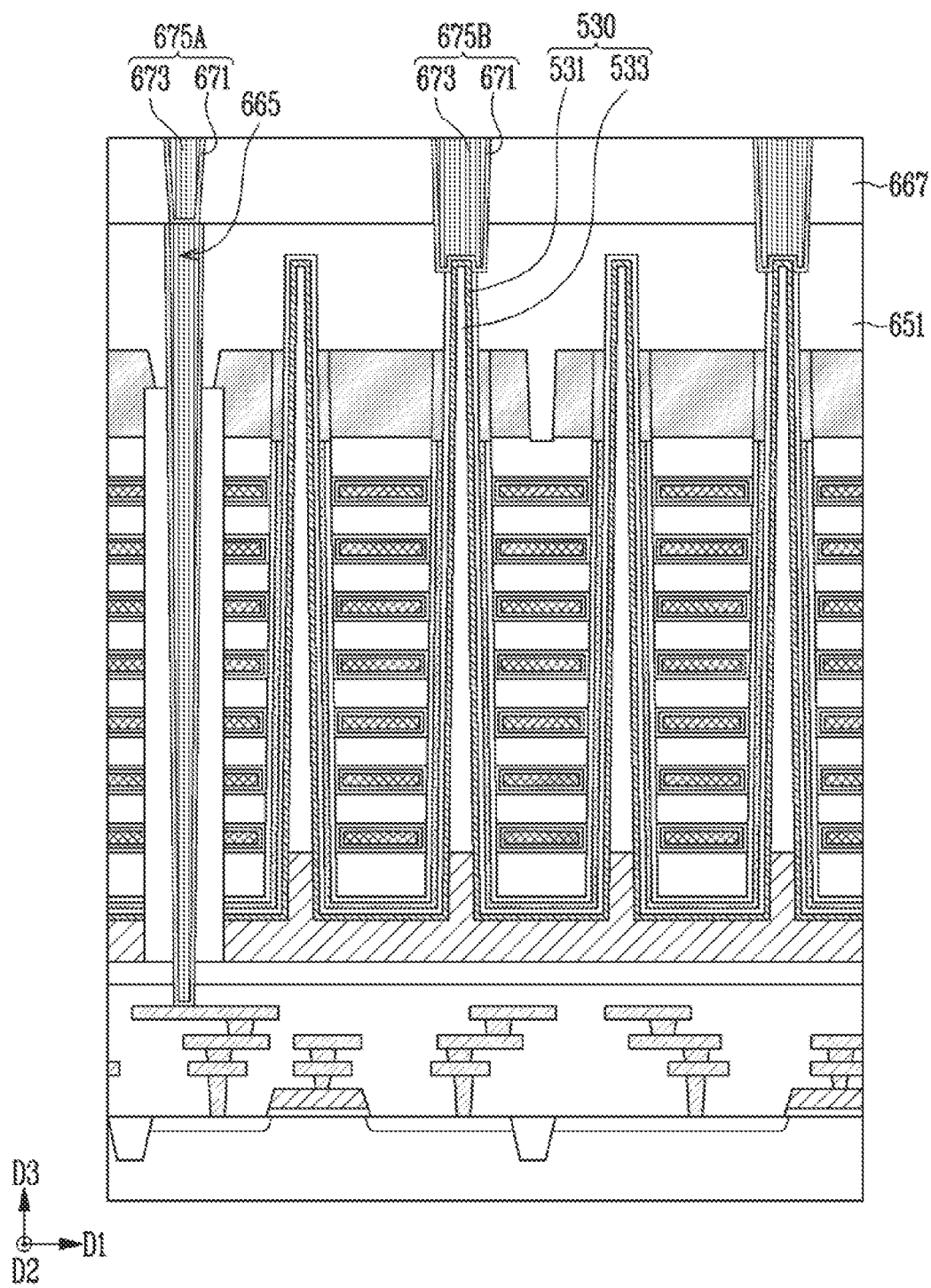

Referring to FIG. 18N, a second via contact structure 675A and a bit line contact structure 675B may be formed by filling each of the second contact hole 670A and the third contact hole 670B, which are shown in FIG. 18M, with a conductive material. In an embodiment, the process of forming the second via contact structure 675A and the bit line contact structure 675B may include a process of forming a conductive metal barrier layer 671 along a surface of each of the second contact hole 670A and the third contact hole 670B and a process of filling, with a metal layer 673, a central region of each of the second contact hole 670A and the third contact hole 670B, which is opened by the conductive metal barrier layer 617.

The second via contact structure 675A may fill the second contact hole 670A shown in FIG. 18M, and be in contact with the first via contact structure 665. The bit line contact structure 675B may fill the third contact hole 670B shown in FIG. 18M, and may be in contact with the channel layer 531 of the channel structure 530.

Subsequently, a subsequent process for forming a bit line as described with reference FIG. 8B may be performed.

Figure 19:
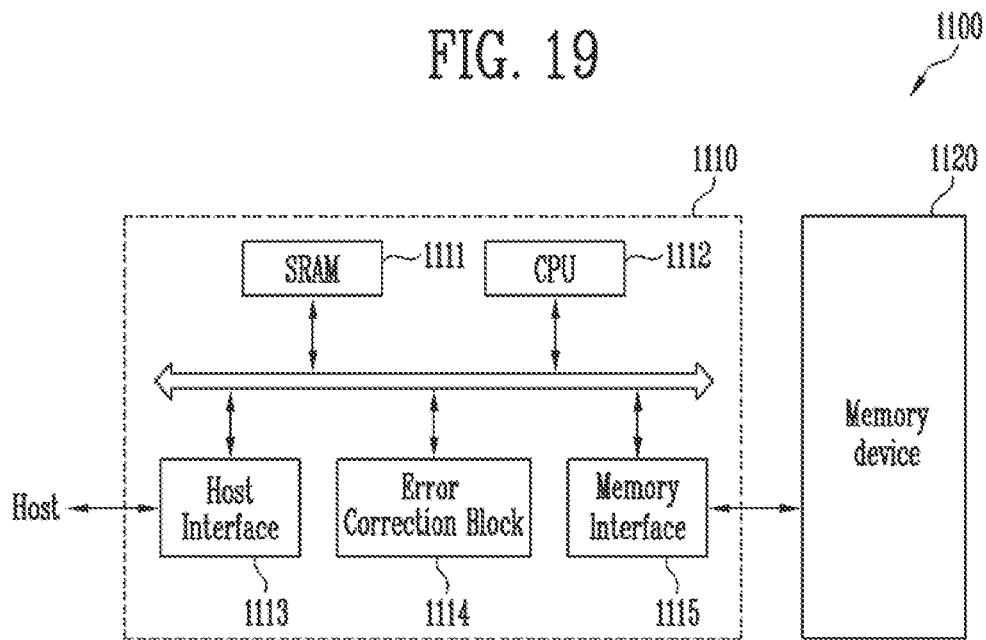
FIG. 19 is a block diagram illustrating a configuration of a memory system in accordance with an embodiment of the present disclosure.

FIG. 19 is a block diagram illustrating a configuration of a memory system 1100 in accordance with an embodiment of the present disclosure.

Referring to FIG. 19, the memory system 1100 may include a memory device 1120 and a memory controller 1110.

The memory device 1120 may include a channel structure, a blocking insulating layer, and a tunnel insulating layer. The channel structure may include a first pillar part and a second pillar part extending from the first pillar part. The blocking insulating layer may surround a sidewall of the first pillar part, a data storage layer between the blocking insulating layer and the first pillar part, a select line overlapping with an end portion of the data storage layer and an end portion of the blocking insulating layer, which face in an extending direction of the second pillar part, the select line surrounding a sidewall of the second pillar part. The tunnel insulating layer may be disposed between the first pillar part and the data storage layer, the tunnel insulating layer extending between the select line and the second pillar part.

The memory device 1120 may be a multi-chip package configured with a plurality of flash memory chips.

The memory controller 1110 may control the memory device 1120, and may include a Static Random Access Memory (SRAM) 1111, a Central Processing Unit (CPU) 1112, a host interface 1113, an error correction block 1114, and a memory interface 1115. The SRAM 1111 may be used as an operation memory of the CPU 1112, the CPU 1112 may perform overall control operations for data exchange of the memory controller 1110, and the host interface 1113 may include a data exchange protocol for a host connected with the memory system 1100. The error correction block 1114 may detect and correct an error included in a data read from the memory device 1120. The memory interface 1115 may interface with the memory device 1120. The memory controller 1110 may further include a Read Only Memory (ROM) for storing code data for interfacing with the host, and the like.

Figure 20:
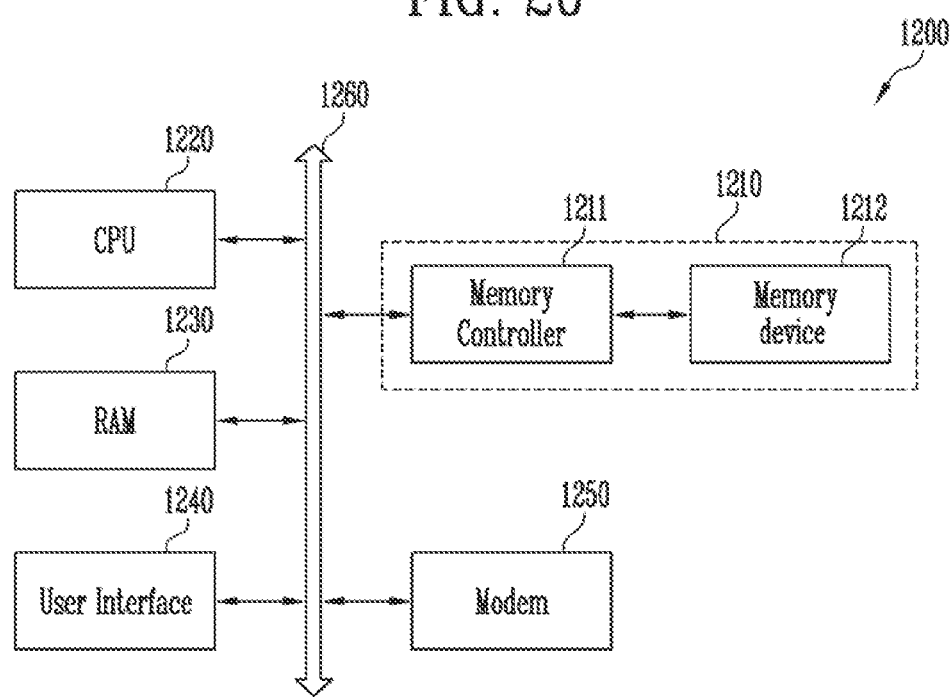
FIG. 20 is a block diagram illustrating a configuration of a computing system in accordance with an embodiment of the present disclosure.

FIG. 20 is a block diagram illustrating a configuration of a computing system 1200 in accordance with an embodiment of the present disclosure.

Referring to FIG. 20, the computing system 1200 may include a CPU 1220, a random access memory (RAM) 1230, a user interface 1240, a modem 1250, and a memory system 1210, which are electrically connected to a system bus 1260. The computing system 1200 may be a mobile device.

The memory system 1210 may be configured with a memory device 1212 and a memory controller 1211. The memory device 1212 may include a channel structure, a blocking insulating layer, and a tunnel insulating layer. The channel structure may include a first pillar part and a second pillar part extending from the first pillar part. The blocking insulating layer may surround a sidewall of the first pillar part, a data storage layer between the blocking insulating layer and the first pillar part, a select line overlapping with an end portion of the data storage layer and an end portion of the blocking insulating layer, which face in an extending direction of the second pillar part, the select line surrounding a sidewall of the second pillar part. The tunnel insulating layer may be disposed between the first pillar part and the data storage layer, the tunnel insulating layer extending between the select line and the second pillar part.

In an embodiment, the present disclosure may provide a semiconductor device having a wafer bonding structure that includes a select line, a blocking insulating layer, a data storage layer and a tunnel insulating layer, wherein the select line includes a first conductive pattern and a second conductive pattern, wherein the first conductive pattern surrounds the tunnel insulating layer, and wherein the second conductive pattern overlaps an end of the blocking insulating layer and an end of the data storage layer, the second conductive pattern interposed between the first conductive pattern and the tunnel insulating layer.

In accordance with the present disclosure, a select line having a gate all around (GAA) structure may be formed.

Accordingly, operational characteristics of the semiconductor memory device may be improved.

What is claimed is:

1. A semiconductor memory device comprising:
   a channel structure including a first pillar part and a second pillar part extending from the first pillar part;
   a blocking insulating layer surrounding a sidewall of the first pillar part of the channel structure;
   a data storage layer disposed between the first pillar part of the channel structure and the blocking insulating layer;
   an upper select line overlapping with an end portion of the blocking insulating layer and an end of the data storage layer, the end portion of the blocking insulating layer and the end of the data storage layer facing in an extending direction of the second pillar part, the upper select line surrounding a sidewall of the second pillar part of the channel structure; and
   a tunnel insulating layer disposed between the first pillar part of the channel structure and the data storage layer, the tunnel insulating layer extending between the second pillar part of the channel structure and the upper select line.

2. The semiconductor memory device of claim 1, wherein the upper select line includes:
   a first conductive pattern intersecting the second pillar part of the channel structure; and
   a second conductive pattern disposed between the first conductive pattern and the tunnel insulating layer, the second conductive pattern surrounding a sidewall of the tunnel insulating layer.

3. The semiconductor memory device of claim 2, wherein the first conductive pattern includes silicon.

4. The semiconductor memory device of claim 2, wherein the second conductive pattern includes at least one of silicon, metal silicide, and conductive metal barrier.

5. The semiconductor memory device of claim 1, wherein the second pillar part of the channel structure includes:
   a first part surrounded by the upper select line;
   a second part extending in the extending direction of the second pillar part from the first part, to further protrude in the extending direction of the second pillar part than the upper select line; and
   a third part extending in the extending direction of the second pillar part from the second part.

6. The semiconductor memory device of claim 5, further comprising:
   an upper insulating layer disposed on the upper select line, the upper insulating layer surrounding a sidewall of the second part of the second pillar part; and
   a common source layer disposed on the upper insulating layer, the common source layer being in contact with the third part of the second pillar part.

7. The semiconductor memory device of claim 5, further comprising:
   an upper insulating layer disposed on the upper select line, the upper insulating layer covering the second part and the third part of the second pillar part;
   a bit line contact structure penetrating the upper insulating layer, the bit line contact structure being in contact with the third part of the second pillar part; and
   a bit line disposed on the upper insulating layer, the bit line being in contact with the bit line contact structure.

8. The semiconductor memory device of claim 1, further comprising:
   at least one lower select line surrounding the first pillar part of the channel structure; and
   interlayer insulating layers and word lines, surrounding the first pillar part of the channel structure between the upper select line and the at least one lower select line, wherein the interlayer insulating layers and the word lines are alternately stacked in the extending direction of the second pillar part,
   wherein the blocking insulating layer, the data storage layer, and the tunnel insulating layer extend between the first pillar part and each of the interlayer insulating layers, the word lines, and the at least one lower select line.

9. The semiconductor memory device of claim 8, further comprising a peripheral circuit structure overlapping with the upper select line with the at least one lower select line interposed between the peripheral circuit structure and the upper select line.

10. The semiconductor memory device of claim 9, wherein the channel structure has a width which becomes wider as the channel structure approaches closer to the peripheral circuit structure.

11. A semiconductor memory device comprising:
    a first channel structure and a second channel structure, extending in parallel to each other;
    a tunnel insulating layer surrounding a sidewall of each of the first channel structure and the second channel structure;
    a data storage layer surrounding the sidewall of each of the first channel structure and the second channel structure with the tunnel insulating layer interposed between the data storage layer and the sidewall of each of the first channel structure and the second channel structure;
    a blocking insulating layer surrounding the sidewall of each of the first channel structure and the second channel structure with the data storage layer and the tunnel insulating layer, which are interposed between the blocking insulating layer and the sidewall of each of the first channel structure and the second channel structure;
    a first lower select line surrounding the first channel structure with the blocking insulating layer, the data storage layer, and the tunnel insulating layer, which are interposed between the first lower select line and the first channel structure;
    a second lower select line surrounding the second channel structure with the blocking insulating layer, the data storage layer, and the tunnel insulating layer, which are interposed between the second lower select line and the second channel structure;
    an isolation layer disposed between the first lower select line and the second lower select line;
    a first upper select line surrounding the first channel structure with the tunnel insulating layer interposed between the first upper select line and the first channel structure, the first upper select line being disposed on the first lower select line;
    a second upper select line surrounding the second channel structure with the tunnel insulating layer interposed between the second upper select line and the second channel structure, the second upper select line being disposed on the second lower select line; and
    interlayer insulating layers and word lines, alternately stacked between the first lower select line and the first upper select line, wherein the interlayer insulating layers and the word lines extend between the second lower select line and the second upper select line, wherein the tunnel insulating layer surrounding the first channel structure is in contact with the first upper select line, and wherein the tunnel insulating layer surrounding the second channel structure is in contact with the second upper select line.

12. The semiconductor memory device of claim 11, wherein each of the first upper select line and the second upper select line, includes:

a first conductive pattern extending in parallel to the word lines; and a second conductive pattern disposed between the first conductive pattern and the tunnel insulating layer, the second conductive pattern surrounding a sidewall of the tunnel insulating layer.

13. The semiconductor memory device of claim 12, wherein the second conductive pattern overlaps with an end portion of the blocking insulating layer and an end portion of the data storage layer.

14. The semiconductor memory device of claim 12, wherein the first conductive pattern includes silicon.

15. The semiconductor memory device of claim 12, wherein the second conductive pattern includes at least one of silicon, metal silicide, and conductive metal barrier.

16. The semiconductor memory device of claim 11, further comprising an insulating layer disposed between the first upper select line and the second upper select line, the insulating layer overlapping with the isolation layer.

17. The semiconductor memory device of claim 11, further comprising a peripheral circuit structure overlapping with the first upper select line and the second upper select line, wherein the first lower select line is interposed between the peripheral circuit structure and the first upper select line, and wherein the second lower select line is interposed between the peripheral circuit structure and the second upper select line.

18. The semiconductor memory device of claim 17, wherein each of the first channel structure and the second channel structure has a width which becomes wider as the first and second channel structures become closer to the peripheral circuit structure.

19. A semiconductor device having a wafer bonding structure comprising:

a select line including a first conductive pattern and a second conductive pattern;

a blocking insulating layer and a data storage layer, wherein the second conductive pattern of the select line overlaps an end of the blocking insulating layer and an end of the data storage layer; and a tunnel insulating layer surrounded by the first conductive pattern of the select line, wherein the second conductive pattern of the select line is interposed between the first conductive pattern and the tunnel insulating layer.

* * * * *